United States Patent [19]
Bosshart

[11] Patent Number: 5,831,451
[45] Date of Patent: *Nov. 3, 1998

[54] DYNAMIC LOGIC CIRCUITS USING TRANSISTORS HAVING DIFFERING THRESHOLD VOLTAGES

[75] Inventor: Patrick W. Bosshart, Plano, Tex.

[73] Assignee: Texas Instruments Incorporated, Dallas, Tex.

[ * ] Notice: The term of this patent shall not extend beyond the expiration date of Pat. No. 5,815,005.

[21] Appl. No.: 687,800

[22] Filed: Jul. 19, 1996

[51] Int. Cl.⁶ .................................................. H03K 19/096
[52] U.S. Cl. .................................. 326/93; 326/95; 326/98
[58] Field of Search .......................................... 326/93, 95

[56] References Cited

U.S. PATENT DOCUMENTS

| | | | |
|---|---|---|---|
| 5,440,243 | 8/1995 | Lyon | 326/98 X |
| 5,459,693 | 10/1995 | Komarek et al. | 365/210 X |
| 5,483,181 | 1/1996 | D'Souza | 326/121 X |
| 5,541,885 | 7/1996 | Takashima | 365/208 X |
| 5,602,497 | 2/1997 | Thomas | 326/93 |

*Primary Examiner*—Do Hyun Yoo
*Attorney, Agent, or Firm*—Robert D. Marshall, Jr.; James C. Kesterson; Richard L. Donaldson

[57] ABSTRACT

In a preferred logic circuit embodiment (10), there is a precharge node (14) coupled to be precharged to a precharge voltage ($V_{DD}$) during a precharge phase and operable to be discharged during an evaluate phase. The circuit also includes a conditional series discharge path (22, 24, and 16) connected to the precharge node and operable to couple the precharge node to a voltage different than the precharge voltage. The conditional series discharge path includes a low threshold voltage transistor (22 or 24) having a first threshold voltage, and a high threshold voltage transistor (16) having a second threshold voltage higher in magnitude than the first threshold voltage, wherein a voltage connected to a gate of the high threshold voltage transistor is disabling during the precharge phase.

34 Claims, 15 Drawing Sheets

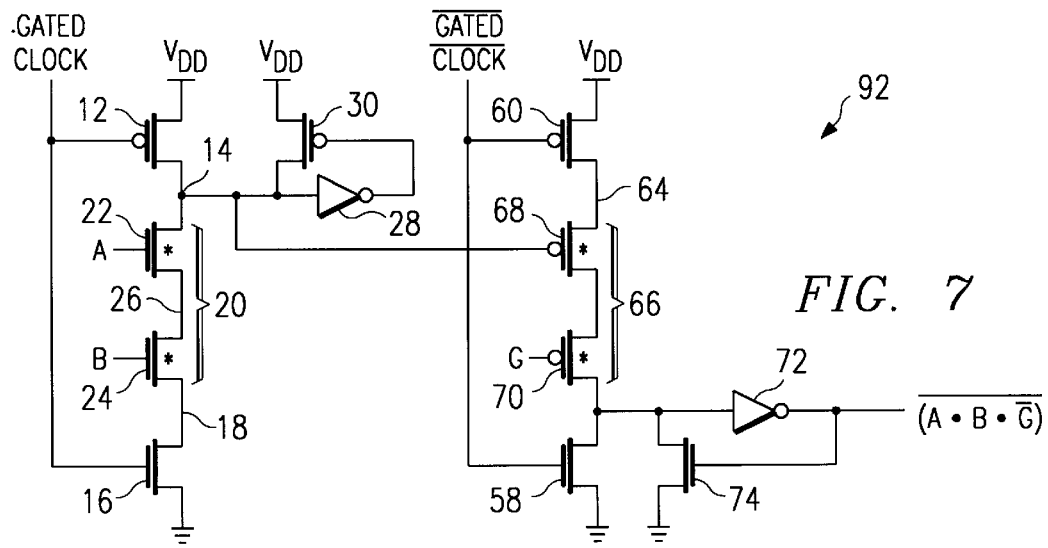
FIG. 7
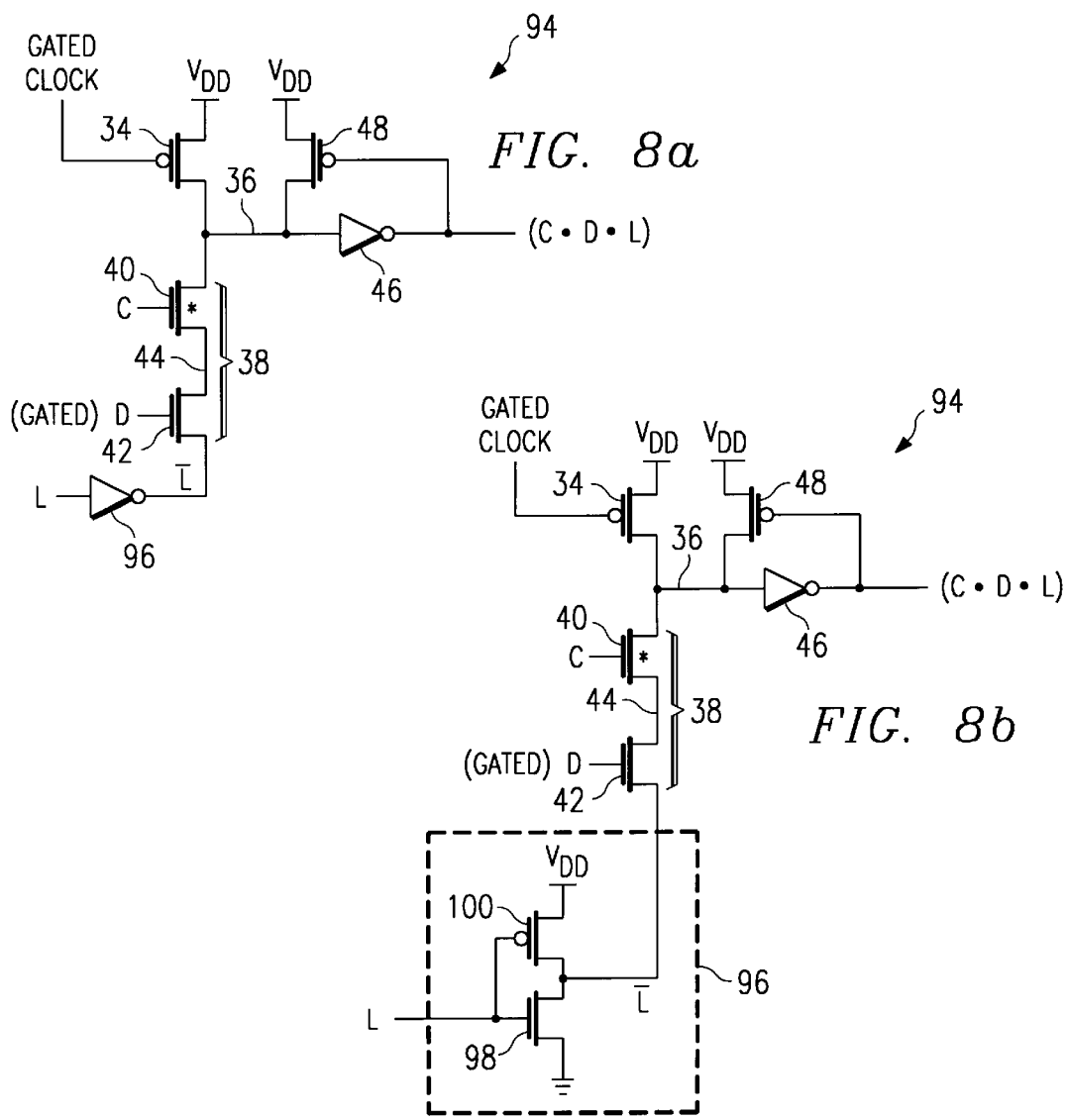
FIG. 8a
FIG. 8b

DYNAMIC LOGIC CIRCUITS USING TRANSISTORS HAVING DIFFERING THRESHOLD VOLTAGES

TECHNICAL FIELD OF THE INVENTION

The present embodiments relate to transistor circuit configurations and are more particularly directed to dynamic logic circuits using transistors having differing threshold voltages.

CROSS-REFERENCES TO RELATED APPLICATIONS

This application is related to the following patent applications, each of which is hereby incorporated herein by reference:

(1) U.S. patent application Ser. No. 08/683,996, entitled "Dynamic Logic Circuits Using Cascode Transistors Having Low Threshold Voltages", with inventor Patrick W. Bosshart, and filed on the same day as the present application; and (2) U.S. patent application Ser. No. 08/684,369, entitled "Power Reduction Circuits And Systems For Dynamic Logic Gates", with inventor Patrick W. Bosshart, and filed on the same day as the present application.

BACKGROUND OF THE INVENTION

In many modern circuit applications, it is desirable to increase the speed of operation of the circuit application. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time.

To increase the speed of microprocessors, as well as other circuits where speed is important, dynamic logic transistor circuits are currently used because they often provide increased speed as compared to static logic transistor circuits. A dynamic logic circuit is characterized by operating in two phases. First, a precharge node is set to a first potential during a precharge phase. Second, during an evaluation phase, if the logic condition represented by the circuit is satisfied, the precharged node is discharged, thereby changing the logic output of the circuit. In other words, at the conclusion of the precharge phase, the precharged node causes a first logic state to be output by the dynamic logic circuit and if the precharged node is discharged during the evaluate phase, the output of the dynamic logic gate represents a second logic state differing from the first logic state. For example, the act of discharging to change states, when accomplished using one or more n-channel transistors to gate the transition from precharge to discharge, represents a speed increase over the prior operation of static circuits which in one instance accomplished a transition with a network of n-channel transistors while in another instance accomplished the opposite transition with a network of p-channel transistors.

Another performance technique currently in use in manufacturing is to target the threshold voltage of transistors given certain circuit expectations. Particularly, typically a manufacturer will build transistors, or make available transistor fabrication processes, which include transistors of a given threshold voltage. When providing this process, the manufacturer typically considers the tradeoff in speed improvement versus power consumption. To increase operational speed, it is known that the threshold voltage of all of the transistors within a circuit may be reduced. By reducing the threshold voltage, the drive current of these transistors is increased. However, the leakage current of those same transistors is also increased. Indeed, note that this approach becomes even more limiting as power supply voltages are reduced and the threshold voltage of the transistor becomes a greater percentage of the power supply voltage. Consequently, one approach is to lower the threshold voltage of the transistor but this increases current leakage and therefore also increases overall standby power consumption. Thus, often a manufacturer anticipates a certain level of leakage to be the acceptable limit, and in view of that limit, adjusts known parameters so that each of the transistors of the circuit share a designated threshold voltage which will provide that limit.

While the above approaches are representative of the art for advancing circuit operational speed, they provide various limitations or drawbacks. For example, the dynamic logic speed is still limited by the threshold voltage of the transistors used in the logic. As another example, and as mentioned above, an advance in speed by reducing threshold voltage necessarily increases standby power consumption caused by leakage current. The inventor of the present embodiments has recognized the above considerations and below are set forth embodiments which provide increased circuit speed while reducing leakage current as compared to the current state of the art.

SUMMARY OF THE INVENTION

The various embodiments relate to logic circuits, systems, and methods. In a preferred dynamic logic circuit embodiment, there is a precharge node coupled to be precharged to a precharge voltage during a precharge phase and operable to be discharged during an evaluate phase. The circuit also includes a conditional series discharge path connected to the precharge node and selectively operable to couple the precharge node to a voltage different than the precharge voltage. The conditional series discharge path includes a low threshold voltage transistor having a first threshold voltage, and a high threshold voltage transistor having a second threshold voltage higher in magnitude than the first threshold voltage, wherein a voltage connected to a gate of the high threshold voltage transistor is disabling during the precharge phase. Other circuits, systems, and methods are also disclosed and claimed.

BRIEF DESCRIPTION OF THE DRAWINGS

FIG. 7 illustrates a schematic of a dynamic zipper logic circuit, where the circuit includes transistors having differing threshold voltages;

FIG. 8a illustrates a schematic of a dynamic logic circuit having an inverter circuit in its discharge path;

FIG. 8b illustrates the schematic of FIG. 8a, and shows greater detail with respect to the transistor within the inverter circuit;

FIG. 20b illustrates a timing diagram of the operation of the prior art circuits of FIG. 20a;

FIG. 21b illustrates a timing diagram of the operation of the circuits of FIG. 21a;

FIG. 22b illustrates a timing diagram of the operation of the circuits of FIG. 22a;

FIG. 22c illustrates a timing diagram of an alternative operation of the circuits of FIG. 22a;

FIG. 22d illustrates a timing diagram of an alternative operation of a modification to the circuits of FIG. 22a;

Detailed Description of The Preferred Embodiments

Given the Background set forth above, the following Detailed Description sets forth various embodiments. For purposes of assisting the reader, but without any limitation to the inventive scope of those embodiments and the many features of such embodiments, the following Table Of Contents sets forth four subheadings to identify particular topics within the Detailed Description.

Table Of Contents

| Subheading Title | Section |
| --- | --- |
| Dynamic Logic Circuits, Systems, And Methods Using Transistors Having Differing Threshold Voltages | 1 |
| Dynamic Logic Circuits, Systems, And Methods Using Cascode Transistors Having Low Threshold Voltages | 2 |
| Power Reduction Circuits, Systems, And Methods For Dynamic Logic Gates | 3 |
| Conclusion | 4 |

1. Dynamic Logic Circuits, Systems, And Methods Using Transistors Having Differing Threshold Voltages Before proceeding with the various embodiments presented in the Figures described below, recall from the above Background that the current state of the art requires a tradeoff such that an improvement in circuit speed by lowering the threshold voltage undesirably increases current leakage and, conversely, an improvement in current leakage by raising the threshold voltage undesirably reduces circuit speed. In contrast, however, the following embodiments increase circuit speed without correspondingly increasing current leakage as compared to those prior art configurations described above.

Figure 1:
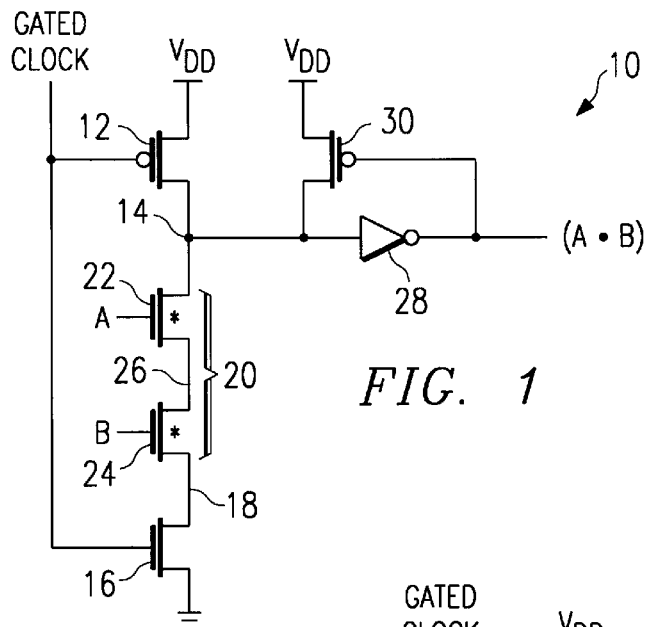
FIG. 1 illustrates a schematic of a dynamic logic circuit having transistors connected to operate in a complementary fashion in response to a GATED CLOCK signal, and further having a logic circuit connected between those complementary operating transistors, where the circuit includes transistors having differing threshold voltages.

FIG. 1 illustrates a schematic of a first dynamic logic circuit embodiment designated generally at 10, and configured in what is often referred to as a domino gate configuration. Circuit 10 includes a GATED CLOCK signal connected to the gate of a p-channel precharge transistor 12 which has a source connected to a source of the system voltage level (e.g., $V_{DD}$) and a drain connected to a precharge node 14. The GATED CLOCK signal is also connected to the gate of an n-channel discharge transistor 16 which has its source connected to a low reference voltage (e.g., ground) and its drain connected to a node 18.

Between precharge node 14 and node 18 is connected a logic circuit designated generally at 20. In circuit 10, the particular logic of logic circuit 20 implements the logic equation of A AND B; more particularly, this logic function occurs due to the following additional components. Logic circuit 20 includes two n-channel transistors 22 and 24. The gate of n-channel transistor 22 is connected to receive the input signal A and the gate of n-channel transistor 24 is connected to receive the input signal B. The drain of n-channel transistor 22 is connected to precharge node 14 and the source of n-channel transistor 22 is connected to a node 26. The drain of n-channel transistor 24 is connected to node 26 and the source of n-channel transistor 24 is connected to node 18.

Returning to precharge node 14, it is further connected to the input of an inverter 28. The output of inverter 28 provides the output signal for circuit 10 (i.e., A AND B), and is also connected to the gate of a p-channel transistor 30. The source of p-channel transistor 30 is connected to $V_{DD}$) and the drain of p-channel transistor 30 is connected to precharge node 14. Note also that p-channel transistor 30 is preferably smaller than the other transistors shown in FIG. 1.

For reasons detailed below, the logic equation realized by circuit 10 is the same as in a prior art configuration including circuitry connected in the manner of FIG. 1; however, the speed of the circuit as well as its leakage current characteristics are quite different. To simplify the discussion, however, the general logic operation is first described and then followed with a focused discussion of the circuit changes and performance improvements over the prior art. Turning then to the operation of circuit 10, note that such operation occurs over two phases, with the first phase being referred to as a precharge phase and the second phase being referred to as an evaluate phase. The selection and duration of these phases is controlled in circuit 10 by the GATED CLOCK signal as appreciated from the following.

Circuit 10 is in its precharge phase when the GATED CLOCK signal is enabling to precharge transistor 12. Note that the term "enabling" is known in the art, and indicates that the gate potential is sufficient to cause conduction along the conductive path (i.e., the source/drain) of the transistor to which the gate potential is connected. Thus, circuit 10 is in its precharge phase when the GATED CLOCK signal is set to a level to cause precharge transistor 12 to conduct. Thus, in the present example, this occurs when the GATED CLOCK signal is low. In this instance, p-channel precharge transistor 12 conducts while n-channel discharge transistor 16 does not. As a result, precharge node 14 is connected, via p-channel precharge transistor 12, and precharged to a precharge voltage (e.g., $V_{DD}$) which represents one logic state for circuit 10. In the example of circuit 10, a precharge voltage at or near $V_{DD}$ is inverted by inverter 22 and output to represent a logic 0. Note further that this logic 0 also causes p-channel transistor 30 to conduct, thereby further maintaining precharge node 14 at $V_{DD}$).

Circuit 10 is in its evaluate phase when the GATED CLOCK signal is enabling to discharge transistor 16; thus, in the present example, this occurs when the GATED CLOCK signal is high. At the beginning of the evaluate phase, therefore, logic circuit 20 continues to output the logic signal caused by the precharge stage (i.e., a logic 0 for the current example). However, due to the action in response to the GATED CLOCK signal and logic circuit 20, that logic output signal may remain at the same level as it was after the precharge phase or, instead, transition to an opposite logic state as described below. Particularly, in response to the transition of the GATED CLOCK from low to high, n-channel discharge transistor 16 conducts while p-channel precharge transistor 12 does not. As a result, precharge node 14 may be connected, via logic circuit 20, and further through n-channel discharge transistor 16, to ground. During this phase, therefore, the connection to ground occurs if the logic accomplished by logic circuit 20 is such that each transistor in that series path conducts. In the current example, the logic operation is A AND B; thus, if both the A and B input signals are high, each transistor in a path through logic circuit 20 conducts and precharge node 14 is connected to ground. As a result, the precharge voltage (i.e., $V_{DD}$ in the example of FIG. 1) at precharge node 14 is allowed to discharge toward ground. Note that by discharging precharge node 14 in this manner that the voltage at precharge node 14 then reaches near or to ground and further is inverted by inverter 28. Note further that after the output rises in this manner, transistor 30 turns off. Moreover, a discharge in this manner represents a transition of the logic value of circuit 10, and the discharge output in the example of circuit 10 represents a logic value of 1.

From the above, one skilled in the art will appreciate that circuit 10 is precharged to a first logic state during the precharge phase, and then may remain at that state during the evaluate phase or discharge to accomplish a logic transition to an opposite logic state during the evaluate phase if the logic operation performed by logic circuit 20 is satisfied. As demonstrated by additional examples below, note that the transistor connections as well as types of logic circuit 20 may be changed to change the particular logic operation (e.g., by changing to other or additional functions and/or by adding or removing more input signals). In all events, however, for purposes of the present embodiments note that a conditional series discharge path is created from precharge node 14 to a different potential, such that in the condition that the conductive paths (i.e., source/drain paths) of all transistors along that series path are conducting, the potential at precharge node 14 is changed from a first level to a second level, thereby representing a logic transition for the output of circuit 10. For the remainder of this document, therefore, this type of conditional series connection along such a path is referred to as a "discharge path", with it understood therefore that it allows discharge to occur when the condition is met that all transistors (i.e., the conductive paths of those transistors) along the path are conducting. Note also that precharge and discharge are terms well known in the art, and refer to the transition from one logic state to another, but are not limited to a precharge of a voltage which is higher than the discharge voltage. In other words, alternative configurations, such as the one shown in FIG. 4, below, use precharge to a first voltage and discharge to a second voltage which is higher than the first voltage. Thus, the terms indicate not the relative voltage levels, but a voltage change which represents a change in the logic level output of the circuit. Moreover, it is intended for purposes of this document that these terms are used in this known manner.

Returning now to FIG. 1, and focusing on a key difference between it and the prior art, note that asterisks are shown by n-channel transistors 22 and 24, but not by n-channel transistor 16. In the preferred embodiment, the threshold voltage ("$V_T$") of n-channel transistor 22 and 24 is lower than that of n-channel transistor 16. Note that the use of an asterisk in this manner, that is, to designate a low threshold voltage transistor, is followed in the remainder of the Figures as well. Before detailing the significance of the use of a low threshold voltage transistor versus a high threshold voltage transistor, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this document, a transistor of the first type will be referred to as an HVT transistor (i.e., a transistor with a relatively high $V_T$) while a transistor of the second type will be referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. Note also that although an LVT transistor provides the benefit of a higher drive current as opposed to an HVT transistor, in contrast it gives rise to the detriment that it provides a greater leakage current than an HVT transistor. Indeed, the typical leaking by an LVT transistor may be greater than that of an HVT transistor by two or three orders of magnitude or more.

Returning now to FIG. 1, recall from the asterisks that n-channel transistors 22 and 24 are LVT transistors while n-channel transistor 16 is an HVT transistor. This distinction is in stark contrast to the prior art, where each of the transistors of a configuration such as in FIG. 1 were constructed to have, and by definition must have had, the same high $V_T$ (i.e., to avoid the unacceptably large leakage current which would exist if a lower $V_T$ were used).

Before proceeding with the benefits of the above-stated distinction where the present embodiments use both HVT and LVT transistors, note then that the embodiments described in this document may be constructed in various manners in order to accomplish different transistors having differing threshold voltages. As a first example, one manner of accomplishing this goal could be using a manufacturing process which specifically permits the creation of dynamic logic circuits using transistors having differing threshold voltages. For example, in current technology, typically a single semiconductor area (e.g. a wafer) is masked and the exposed areas are exposed to an implant which establishes the threshold voltage for the exposed transistor channels of a first conductivity type. For example, the $V_T$ of all n-channel transistors may be set by using this process, and then repeating it with a different mask set for all p-channel transistors. Thus, using two implant steps, the $V_T$ is set for both n-channel and p-channel transistors. Additionally, for both conductivity types, the depth and/or concentration of the implant used in this manner affects the level of the threshold voltage resulting from the exposure. Under current standards, a common transistor may have a $V_T$ on the order of 500 millivolts. The methodology, however, may be expanded to provide at least two different sets of transistors, where both sets have the same conductivity type but one set includes HVT transistors while the other includes LVT transistors. Using this expanded methodology, and for one conductivity type, a first set of masks could be used to create a set of HVT transistors in the appropriate locations while a second set of masks could be used to create a set of LVT transistors in differing locations. Thus, for a given transistor conductivity types, one implant would take place using the first set of masks to create the HVT transistors. Thereafter, another implant would take place using the second set of masks to create the LVT transistors. Additionally, for a second transistor conductivity type, two more sets of masks and implants would be employed in a like manner. Moreover, to contrast with the 500 millivolt $V_T$ of the HVT transistors, current transistor technology may expect a $V_T$ on the order of 200 millivolts for an LVT transistor. Moreover, these values may vary according to various considerations known in the art. In addition to the above, note further that the formation and/or construction of an HVT transistor versus an LVT transistor may be accomplished by other techniques as well. As another example, some transistors are formed using what is known as silicon-on-insulator ("SOI") technology. In this technology, each SOI transistor includes a separate body connection. Typically, the body is either connected to a certain node, or is allowed to float. The inventor of the present embodiments has further appreciated that this separately-available connection may be further used to accomplish the relative $V_T$ standards set forth in this document, and that additional considerations in this regard may arise in the future once the levels of $V_{DD}$ fall below a diode forward-bias voltage level for such a transistor. Given current $V_{DD}$) levels, which are still considerably higher than a typical forward-bias voltage of about 0.8 volts, and where it is desired to create an LVT configuration, it is acceptable to disconnect the transistor body, thereby allowing it to float. Conversely, given the same $V_{DD}$, and where it is desired to create an HVT configuration, it is acceptable to connect the transistor body to ground for an n-channel transistor (or to $V_{DD}$ for a p-channel transistor). In addition to the above, note that at some point in the future $V_{DD}$ levels should fall to 0.5 volts or less and, therefore, fall considerably below a typical expected forward-bias voltage of 0.8 volts. In this instance, and where it is desired to create an LVT configuration, it will as before be acceptable to disconnect the transistor body, thereby allowing it to float. As a result, the threshold voltage of that transistor during the precharge phase is relatively low. In contrast, where it is desired to create an HVT configuration, the transistor body may be connected to the transistor's gate which is known to be off during the phase in which a high threshold voltage (e.g., during the precharge phase) is desired. For example, for an n-channel SOI transistor connected in this manner, the low gate voltage during precharge is also connected to the body of that transistor. As a result, the threshold voltage of that transistor during the precharge phase is relatively high. Indeed, a relatively higher $V_T$ also may be accomplished by connecting the transistor body to a potential which is non-enabling for the transistor (e.g., connect the body to ground for an n-channel transistor), or to the source of that transistor or to a different signal which is at ground during precharge. Still other techniques should be ascertainable by a person skilled in that art and the particular technique chosen need not be detailed herein. For example, there are currently manufacturing techniques used in static circuits where certain transistors may be LVT transistors while other transistors may be HVT transistors. In this prior art technique, however, the process is used for static rather than dynamic logic circuits. In addition, the technique is used so that an entire area, such as a set of circuits on an entire circuit die, are constructed using LVT transistors to increase the speed of that set of circuits, but with the recognition that the area constructed in this fashion will have an increased amount of current leakage as compared to the remaining areas on the circuit die which are constructed using HVT transistors. Thus, by modifying this technique or using other techniques available to a person skilled in the art, for purposes of the present embodiments it need be possible that a given circuit may be constructed by intentionally specifying differing threshold voltages for different transistors with the choice of either LVT or HVT transistors within a circuit configuration guided by the embodiments set forth in this document.

Having introduced the concept of mixed HVT and LVT transistor circuitry, it now will be appreciated that the inventor of the present embodiments has recognized the principles set forth above, and created various unique embodiments which benefit from certain attributes of dynamic logic circuits and benefits of both HVT and LVT transistors. The first example of these benefits may be realized by reviewing the detailed operation of the differing threshold voltage transistors in circuit 10, with the following discussion first addressing the precharge phase of operation and second addressing the evaluate phase of operation.

During the precharge phase of operation, the GATED CLOCK signal is low and, therefore, n-channel discharge transistor 16 is off while p-channel precharge transistor 12 causes precharge node 14 to charge toward the precharge voltage, $V_{DD}$. Depending on the data values of A and B, n-channel transistors 22 and 24 may be on or off. Regardless of those last two transistors, however, note that the discharge cannot occur from precharge node 14 to ground because n-channel discharge transistor 16 is off. Note further that n-channel discharge transistor 16 is an HVT transistor; as a result, because an HVT transistor has a lower leakage current when off (as opposed to an LVT transistor), then the HVT n-channel discharge transistor 16 will provide a limit to how much current can leak from precharge node 14, through n-channel transistors 22 and 24, to ground. Consequently, even though the discharge path contains some LVT transistors (i.e., n-channel transistors 22 and 24), the amount of possible leakage current is limited by the HVT n-channel discharge transistor 16 during the precharge phase of operation.

During the evaluate phase of operation, the GATED CLOCK signal is high and the logic function accomplished by logic circuit 20 may be realized. In other words, recall that the output of circuit 10 at the end of the precharge phase represents a precharged logic state which, in the example of FIG. 1, is a logic 0. However, if the logic equation from logic circuit 20 is such that each transistor in that circuit conducts (i.e., if A AND B are high), then the charge at precharge node 14 is allowed to discharge to ground through the discharge path which includes logic circuit 20 as well as n-channel discharge transistor 16. During this instance, the three transistors making up the discharge path (i.e., transistors 22, 24, and 16) may be thought of as resistors. Note, therefore, since transistors 22 and 24 are LVT transistors, the resistance of those transistors is significantly less than the resistance of the HVT transistor 16. Since these three resistances are in series, the overall resistance of the discharge path is reduced as compared to a path which included all HVT transistors. Indeed, note this benefit could be accomplished by having only one of the two transistors 22 or 24 be an LVT transistor, but by making both of them LVT transistors, the overall series resistance is still lower than if only one were an LVT transistor while the other were an HVT transistor. In any event, because the overall series resistance is reduced, the time needed to discharge the circuit (and, therefore, change logic state) is reduced as well.

Given the above configuration, one skilled in the art will readily appreciate that the mixing of transistors with differing threshold voltages provides various benefits. During the precharge phase of operation, the benefit of an HVT transistor in the discharge path is realized in that leakage current is reduced over a circuit having only LVT transistors. Indeed, this leakage should approximate, or be the same as, the leakage of circuits which included only HVT transistors. In opposite fashion, during the evaluate phase of operation, the benefit of one or more LVT transistors in the discharge path is realized in that the speed at which the logic state of the circuit may transition is increased. Having noted these benefits, the following discussion of FIGS. 2 through 10 further demonstrates alternative configurations and considerations in view of a circuit having transistors with mixed threshold voltages.

Figure 2:
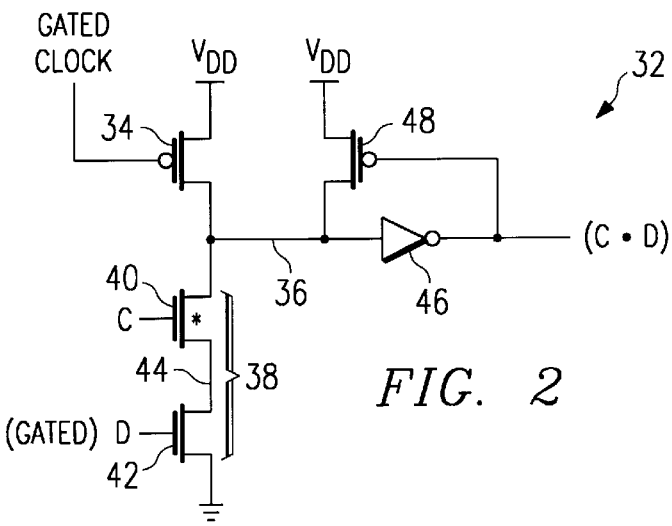
FIG. 2 illustrates a schematic of a dynamic logic circuit without the complementary operating transistors connected to a gated clock as in FIG. 1, and further having a logic circuit with at least one transistor in the logic circuit having a gated input signal, where the circuit includes transistors having differing threshold voltages.

FIG. 2 illustrates a schematic of a second dynamic logic circuit embodiment designated generally at 32, and again is what is often referred to as a domino gate configuration without a clocked discharge transistor. Circuit 32 includes a GATED CLOCK signal connected to the gate of a p-channel precharge transistor 34 which has a source connected to $V_{DD}$ and a drain connected to a precharge node 36. Note that in contrast to circuit 10 of FIG. 1, the GATED CLOCK signal in FIG. 2 is not also connected to the gate of an n-channel transistor to cause the complementary operation as described in the above embodiment with respect to discharge transistor 16.

A logic circuit designated generally at 38 is connected between precharge node 36 and ground. Like FIG. 1, the logic circuit includes two series connected n-channel transistors here numbered 40 and 42. The particular logic of logic circuit 38 implements the logic equation of C AND D; more particularly, the gate of n-channel transistor 40 is connected to receive the input signal C and the gate of n-channel transistor 42 is connected to receive the input signal D. Importantly, note that input signal D is a gated signal, meaning that it may only be enabling to the transistor gate to which it is connected when the circuit is in its evaluate phase (i.e., when the GATED CLOCK signal is high). In opposite fashion, therefore, the gated input signal D must be non-enabling to that same transistor when the circuit is in its precharge phase (i.e., when the GATED CLOCK signal is low). Note that the term "non-enabling" or "disabling" is also known in the art, and indicates that the gate potential is insufficient to cause conduction along the conductive path (i.e., the source/drain) of the transistor to which the gate potential is connected. For example, since the gated input signal D must be non-enabling to transistor 42 when the circuit is in its precharge phase and transistor 42 is an n-channel transistor, it is known that the gated input signal D will be low (i.e., non-enabling to an n-channel transistor, that is, a level which does not cause the transistor to conduct) when the GATED CLOCK signal is low. For example, a gated input signal could be that which is provided by the output and/or precharge node of another dynamic logic domino gate configuration such as that of FIG. 1. As another example, a gated input signal could be that which is provided by the output of a static logic circuit, but which is otherwise controlled (e.g., by a logical AND with another signal) to be disabling during the precharge phase of operation. In any event, the importance of the aspect of a gated input signal to the present embodiments is detailed below. Continuing then with the connections of FIG. 2, the drain of n-channel transistor 40 is connected to precharge node 36 and the source of n-channel transistor 40 is connected to a node 44. The drain of n-channel transistor 42 is connected to the node 44 and the source of the source of n-channel transistor 42 is connected to ground (or some potential differing from the supply voltage $V_{DD}$ so as to allow discharge as described below).

Returning to precharge node 36, it is further connected to the input of an inverter 46. The output of inverter 46 provides the output signal for circuit 32 (i.e., C AND D), and is also connected to the gate of a p-channel transistor 48. The source of p-channel transistor 48 is connected to $V_{DD}$ and the drain of p-channel transistor 48 is connected to precharge node 36.

Like circuit 10 of FIG. 1, the logic equation realized by circuit 32 of FIG. 2 is the same as in a prior art configuration including circuitry connected in the manner of FIG. 2, but again the speed of the circuit as well as its leakage current characteristics are quite different from the prior art due to the inclusion of differing transistors with differing threshold voltages. To simplify the discussion, the following discussion first addresses the general logic operation and then follows with a detailed discussion of the circuit changes and performance improvements due to the transistors with differing threshold voltages. Turning then to the operation of circuit 32, again the circuit is a dynamic logic circuit and, therefore, operates first in a precharge phase and second in an evaluate phase, with the selection and duration of these phases controlled by the GATED CLOCK signal. Each of these phases is discussed below.

Circuit 32 is in its precharge phase when the GATED CLOCK signal is low. In this instance, p-channel precharge transistor 34 conducts and, as a result, precharge node 36 is precharged to $V_{DD}$ which represents one logic state for circuit 32. In the example of circuit 32, a precharge voltage at or near $V_{DD}$ is inverted by inverter 46 and output to represent a logic 0 (which is further maintained at that level via p-channel transistor 48). Before proceeding, recall that input signal D is a gated signal, that is, it is not enabling during the precharge phase (i.e., when the GATED CLOCK signal is low). Therefore, it is known during the precharge phase that the gated input signal D is low. As a result, n-channel transistor 42 is not conducting during the precharge phase. Accordingly, even if n-channel transistor 40 is conducting during the precharge phase, the precharged voltage at precharge node 36 cannot be discharged because of the non-conducting state of n-channel transistor 42.

Circuit 32 is in its evaluate phase when the GATED CLOCK signal is high. At the beginning of the evaluate phase, therefore, logic circuit 32 continues to output the logic signal caused by the precharge stage (i.e., a logic 0 for the current example). During the evaluate phase, and due to the action in response to the GATED CLOCK signal and logic circuit 38, the logic output signal may remain in the same state as it was after the precharge phase or, instead, transition to an opposite logic state. Particularly, either during or after the transition of the GATED CLOCK signal from low to high, the connection of precharge node 36 to ground occurs if the logic accomplished by logic circuit 38 is such that each transistor in that circuit conducts. In the current example, the logic operation is C AND D; thus, if both the C input is high, and the gated input signal D rises from low to high either during or after the transition of the GATED CLOCK signal from low to high, the transistors of logic circuit 38 conduct and precharge node 36 is connected to ground. In other words, given this instance, transistors 40 and 42 conduct, thereby coupling precharge node 36 to ground and by discharging the precharge voltage in this manner the output signal as provided by inverter 46 transitions from its precharge state (i.e., at a logic 0) to a discharge state providing an output representing a logic 1.

The above discussion demonstrates that circuit 32 is precharged to a first logic state during the precharge phase, and then may remain at that state during the evaluate phase or discharge to accomplish a logic transition to an opposite logic state during the evaluate phase if the logic operation performed by logic circuit 38 is satisfied. Like circuit 10 of FIG. 1, circuit 32 of FIG. 2 may be further modified through transistor connections and types used in logic circuit 38 so as to accomplish a different logic operation or to add or remove other input signals. In all events, note that a discharge path is created from precharge node 36 to a different potential such that if all transistors along that path are conducting, the potential at precharge node 36 is changed from a first level to a second level, thereby representing a logic transition for the output of circuit 32.

Having described the general operation of circuit 32, attention is now paid to the effect of including transistors in that circuit with differing threshold voltages. Particularly, note that an asterisk is shown by n-channel transistor 40 but not by n-channel transistor 42. Thus, from the convention introduced above, n-channel transistor 40 is an LVT transistor while n-channel transistor 42 is an HVT transistor. Again, this distinction is in stark contrast to the prior art, where each of the transistors of a configuration such as in FIG. 2 were constructed to have the same $V_T$. To appreciate the benefits of this distinction, the following addresses the detailed operation of the differing threshold voltage transistors in circuit 32 in the two different phases of operation of the circuit, without restating all of the preliminary operation details set forth above.

During the precharge phase of operation, the GATED CLOCK signal is low and, therefore, n-channel transistor 42 is off (because its input is gated) while p-channel precharge transistor 34 causes precharge node 36 to charge toward $V_{DD}$. Depending on the data value of input signal C, n-channel transistor 40 may be on or off. Regardless of that last transistor, however, note that the discharge cannot occur from precharge node 36 to ground because n-channel transistor 42 is off. Note further that n-channel transistor 42 is an HVT transistor. Moreover, because an HVT transistor has a lower leakage current when off (as opposed to an LVT transistor), then the HVT n-channel transistor 42 limits the amount of current leakage from precharge node 36, through n-channel transistor 40, to ground. Consequently, even though the discharge path contains an LVT transistor (i.e., n-channel transistor 40), the amount of possible leakage current is limited by the HVT n-channel transistor 42 during the precharge phase of operation.

During the evaluate phase of operation, the GATED CLOCK signal is high and the gated input signal D to n-channel transistor 42 may transition from low to high. If this transition occurs, and if the input signal C to n-channel transistor 40 is also high during the evaluate phase, then the charge at precharge node 36 discharges to ground through the discharge path (i.e., trough transistors 40 and 42). Here, since transistor 40 is an LVT transistor, its resistance is significantly less than the resistance of the HVT transistor 42. Since these two resistances are in series, the overall resistance of the discharge path is reduced as compared to a path which included all HVT transistors. Further, because the overall series resistance is reduced, the speed at which the circuit may discharge is increased. Lastly, note that the same reduced current leakage and series resistance could occur if input C were a gated input signal, and transistor 40 were an HVT transistor while transistor 42 were an LVT transistor.

FIG. 2, therefore, demonstrates an alternative to FIG. 1, but both distinctly demonstrate the mixing of transistors with differing threshold voltages and various resulting benefits. One or more non-enabled HVT transistors in the discharge path during the precharge phase limits leakage current, while one or more LVT transistors in the discharge path during the evaluate phase increases operational speed. While the FIG. 1 and 2 embodiments differ as described above, note here what they have in common. First, those configurations share both HVT and LVT transistors in the discharge path. Second, at least one transistor in the discharge path is known not to be enabled during the precharge phase of operation, and that non-enabled transistor is an HVT transistor. In FIG. 1, this is known because the gate of HVT n-channel discharge transistor 16 is connected to the GATED CLOCK signal which is known to be low during the precharge phase. In FIG. 2, this is known because the gate of HVT n-channel transistor 42 is connected to a gated input signal. The remaining one or more transistors in the discharge path may therefore comprise LVT transistors, and the greater the number of LVT transistors the greater the likelihood of increased speed performance. Having now explained the above configurations, FIGS. 3 through 10 demonstrate additional configurations which also benefit over the prior art in accordance with various principles set forth above.

Figure 3:
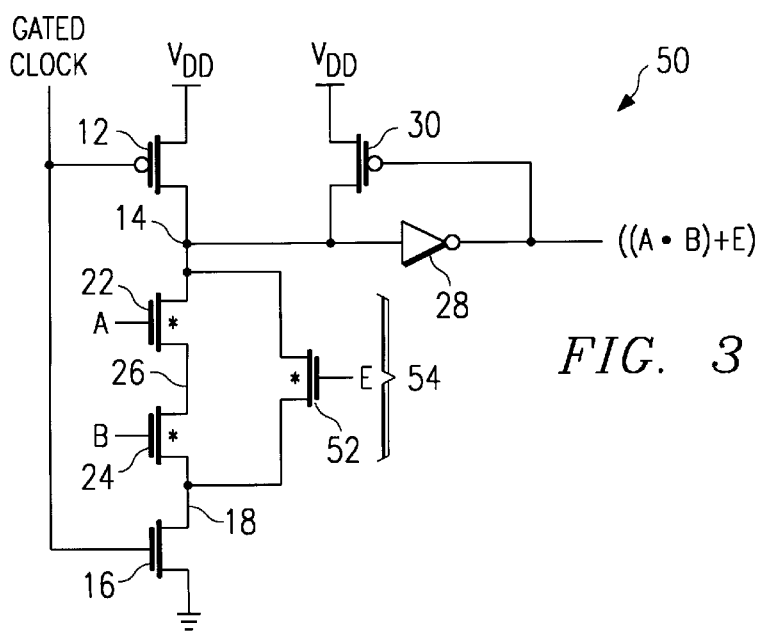
FIG. 3 illustrates a schematic of a dynamic logic circuit having the components of FIG. 1, and further including a second discharge path within the logic circuit, where the circuit includes transistors having differing threshold voltages.

FIG. 3 illustrates a schematic of a dynamic logic circuit embodiment designated generally at 50 and which in many respects is the same as circuit 10 of FIG. 1. Where features are common to FIGS. 1 and 3, like reference numerals are used. A difference between circuits 10 and 50 is that circuit 50 includes an additional n-channel transistor 52 connected between precharge node 14 and node 18. As demonstrated below, this additional n-channel transistor causes the logic equation realized by circuit 50 to differ from that of circuit 10 and, therefore, the overall logic circuit of circuit 50 is also renumbered to indicate a logic circuit 54. As demonstrated below, logic circuit 54 causes circuit 50 to accomplish a logic equation such that the output equals ((A AND B) OR E). Note also that n-channel transistor 52 includes an asterisk designation and, thus, by the convention of this document is an LVT transistor. Lastly, note that circuit 50 includes two discharge paths, a first discharge path which is the same as circuit 10 of FIG. 1 and includes n-channel transistors 22, 24, and 16, and a second discharge path from precharge node 14 through n-channel transistors 52 and 16.

The operation of circuit 50 is as follows. First, the operation is the same as that of circuit 10 with respect to the first discharge path through n-channel transistors 22, 24, and 16. Thus, the reader is referred above to that discussion. Second, however, the operation as now affected by the second discharge path through n-channel transistors 52 and 16 is as follows.

During the precharge phase of operation, precharge node 14 precharges toward the precharge voltage $V_{DD}$ while HVT n-channel discharge transistor 16 is off. As stated above, since HVT n-channel discharge transistor 16 is off, the precharged voltage at precharge node 14 cannot discharge through the first discharge path, and leakage is limited because that transistor is an HVT transistor. Note further now that the second discharge path also necessarily includes HVT n-channel discharge transistor 16. Thus, like the first discharge path, the precharged voltage at precharge node 14 cannot discharge through the second discharge path, and leakage is again limited by the presence of HVT n-channel discharge transistor 16 in the discharge path.

During the evaluate phase of operation, it was shown above in connection with FIG. 1 that the first discharge path gives rise to the logic evaluation of A AND B. Note, now, however, that the voltage at precharge node 14 may alternatively be discharged if n-channel transistor 52 conducts. Thus, the logic signal output by circuit 50 will transition if either (A AND B) are high, or if E is high, thereby resulting in the overall logic equation as ((A AND B) OR E). Recall also from above that the presence of LVT transistors in the first discharge path (i.e., n-channel transistors 22 and 24) increase the speed at which this transition may occur. By similar reasoning therefore, one skilled in the art will appreciate that LVT transistor 52 in the second discharge path of circuit 50 will likewise increase the speed at which the logic transition may occur.

Figure 4:
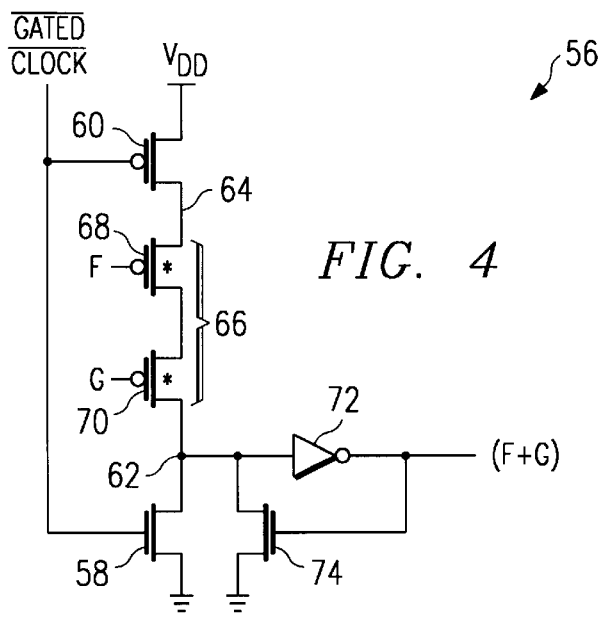
FIG. 4 illustrates a schematic of a dynamic logic circuit having transistors connected to operate in a complementary fashion in response to a GATED CLOCK signal, and further having a logic circuit connected between those complementary operating transistors, where the precharge voltage is lower than the discharge voltage, where the circuit includes transistors having differing threshold voltages.

The above embodiments demonstrate various principles, including examples of where precharge is to a potential higher than the potential which results from a discharge. As previously mentioned, however, alternative configurations may be constructed where the precharge voltage is less than the discharge voltage. FIG. 4 illustrates a schematic of a circuit designated generally at 56 which depicts an example of this alternative precharge and discharge operation and is generally referred to as a p-channel domino gate. Again, however, the FIG. 4 embodiment includes a discharge path from a precharge node to a node of a different potential, such that if all transistors along that path are conducting the potential at the precharge node is changed from a first level to a second level, thereby representing a logic transition for the output of the circuit.

Turning then to the details of circuit 56, it receives the complement of the GATED CLOCK SIGNAL (indicated as $\overline{\text{GATED CLOCK}}$ in FIG. 4) at the gate of an n-channel precharge transistor 58 which has a source connected to a precharge voltage (i.e., ground) and a drain connected to a precharge node 62. The $\overline{\text{GATED CLOCK}}$ signal is also connected to the gate of a p-channel discharge transistor 60 which has its source connected to $V_{DD}$ and its drain connected to a node 64. Note that p-channel transistor 60 is an HVT transistor since it is not designated with an asterisk. Between precharge node 62 and node 64 is connected a logic circuit designated generally at 66 which implements the logic equation of (F OR G) or, equivalently, NOT($\overline{\text{F}}$ AND $\overline{\text{G}}$). Logic circuit 66 includes two series connected p-channel transistors 68 and 70, where the gate of p-channel transistor 68 is connected to receive the input signal F and the gate of p-channel transistor 70 is connected to receive the input signal G. Note that both transistors 68 and 70 are LVT transistors. Note also that each of transistors 60, 68, and 70 are p-channel transistors; thus, as known in the art, a negative gate-to-source voltage causes such transistor types to conduct as opposed to a positive gate-to-source voltage as in the case of an n-channel transistor. Thus, when speaking of relative threshold voltage levels, it is the magnitude of the threshold voltage which is actually at issue. In other words, a p-channel HVT transistor may have a $V_T$ on the order of –0.5 volts while a p-channel LVT transistor may have a $V_T$ on the order of –0.2 volts; thus, the magnitude of the $V_T$ of the p-channel HVT transistor is greater than the magnitude of the $V_T$ of the p-channel LVT transistor.

Returning to precharge node 62, it is further connected to the input of an inverter 72. The output of inverter 72 provides the output signal for circuit 56 (i.e., F OR G), and is also connected to the gate of an n-channel transistor 74. The source of n-channel transistor 74 is connected to ground and the drain of n-channel transistor 74 is connected to precharge node 62.

The operation of circuit 56 again occurs over a precharge phase and an evaluate phase. During the precharge phase, the GATED CLOCK signal is low and, thus, its complement is high. In this instance, n-channel precharge transistor 58 conducts while p-channel discharge transistor 60 does not. As a result, precharge node 62 is precharged, via n-channel transistor 58, to the precharge voltage of ground, and that precharge voltage is inverted by inverter 62 and represents one logic state for circuit 56 (i.e., a logic 1 which is further maintained by the feedback connection to n-channel transistor 74). During the evaluate phase, the GATED CLOCK signal is high and, thus, its complement is low. At the beginning of the evaluate phase, therefore, logic circuit 66 continues to output the logic signal caused by the precharge stage (i.e., a logic 1 for the current example). However, due to the action in response to the complement of the GATED CLOCK signal and logic circuit 66, that logic output signal may remain in the same state as it was after the precharge phase or, instead, transition to an opposite logic state. Particularly, in response to the transition of the complement of the GATED CLOCK signal from high to low, p-channel discharge transistor 60 conducts while n-channel precharge transistor 58 does not. As a result, precharge node 62 may be connected, via logic circuit 66 and further through p-channel discharge transistor 60, to $V_{DD}$. During this phase, therefore, the connection to $V_{DD}$ occurs if each transistor in logic circuit 66 conducts; that is, if both the F and G inputs input signals are low, transistors 68 and 70, respectively, conduct allowing the above-mentioned connection to $V_{DD}$. As a result, the precharge voltage (i.e., ground in the example of FIG. 4) at precharge node 62 is allowed to discharge toward $V_{DD}$. Note by discharging precharge node 62 in this manner that the voltage at precharge node 62 then reaches near or to $V_{DD}$ and further is inverted by inverter 72. Consequently, in the example of circuit 56, a discharge in this manner represents a transition of the logic value of circuit 56 from a logic 1 to a logic 0.

In addition to the operation described immediately above, note that circuit 56 also benefits from the inclusion of both LVT and HVT transistors in the discharge path between precharge node 62 and $V_{DD}$. The details of this operation are greatly appreciated from the discussion of the above Figures to which the reader is referred, and are further briefly augmented by the following. During the precharge phase of operation, p-channel discharge transistor 60 is off, and as an HVT transistor it limits the amount of current which can leak through the discharge path. During the evaluate phase, however, p-channel transistors 68 and 70 may conduct (if their respective inputs are low) and, as LVT transistors they provide increased speed in the discharge path as compared to a path including all HVT transistors. Again, therefore, the FIG. 4 embodiment provides significant improvements over the prior art.

Figure 5:
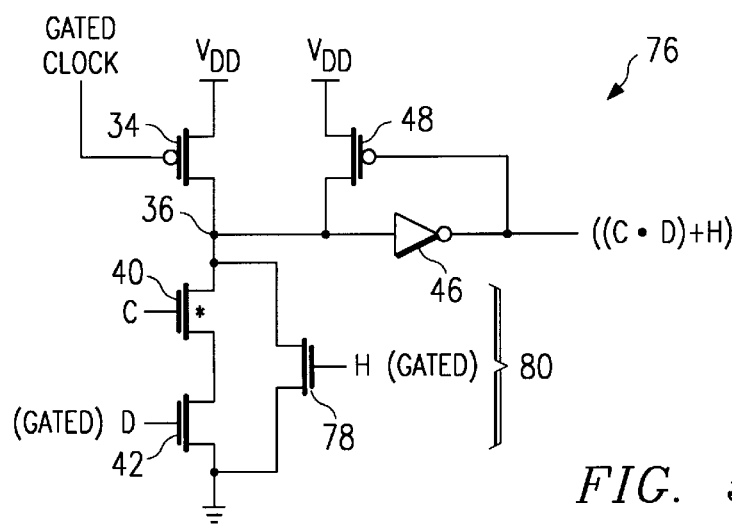
FIG. 5 illustrates a schematic of a dynamic logic circuit having the components of FIG. 2, and further including a second discharge path within the logic circuit, where the circuit includes transistors having differing threshold voltages.

FIG. 5 illustrates a schematic of a dynamic logic circuit embodiment designated generally at 76 and which includes more than one discharge path. Particularly, circuit 76 is in many respects the same as circuit 32 of FIG. 2. Thus, where features are common to FIGS. 2 and 5, like reference numerals are used. In addition to the features of circuit 32, circuit 76 includes an additional n-channel transistor 78, having a gate connected to receive a gated input signal H, and having its drain and source connected to precharge node 36 and ground, respectively. Consequently, a different logic circuit 80 is formed by transistor 78 in parallel with the series-connected transistors 40 and 42, and one skilled in the art will appreciate that this logic causes circuit 76 to realize the logic output equation of ((C AND D) OR H).

Given the above-described connections of circuit 76, note that it also provides two separate discharge paths from precharge node 36 to a different potential (i.e., ground in the current example). The first discharge path is the same as in circuit 32 of FIG. 2, that is, from precharge node 36 through series-connected transistors 40 and 42. The newly added second discharge path is from precharge node 36 through transistor 78 to ground. Note further that no asterisk accompanies n-channel transistor 78 and, therefore, it is an HVT transistor. Indeed, given the explanations set forth above, note that the second discharge path includes only one transistor and, therefore, that transistor is preferably an HVT transistor which is not enabled during the precharge phase and therefore limits current leakage during that phase of operation. Note also that there is no LVT transistor in the second discharge path of circuit 76, while there is an LVT transistor in the first discharge path (i.e., transistor 40). As a result, the discharge speed of the first path is improved over a path having only HVT transistors. Note further that the second discharge path is in parallel with the first discharge path; consequently, the reduced resistance of the first discharge path when it is conducting may improve the speed of the second discharge path when it too is conducting. In all events, therefore, the circuit of FIG. 5 also presents improvement over the prior art.

Figure 6:
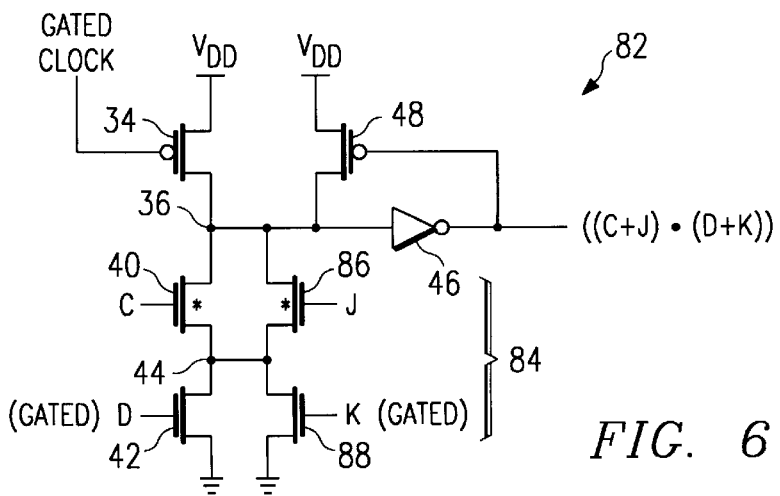
FIG. 6 illustrates a schematic of a dynamic logic circuit having the components of FIG. 1, and further including additional connections providing a total of four different paths by which discharge may occur, where the circuit includes transistors having differing threshold voltages.

FIG. 6 illustrates a schematic of a dynamic logic circuit embodiment designated generally at 82 which includes a logic circuit 84. Circuit 82 shares some commonality with circuit 32 of FIG. 2 and, therefore, common reference numerals are again used in those instances. Circuit 84 includes the connection of series-connected transistors 40 and 42 from precharge node 36 to ground. In addition, however, logic circuit 84 includes a second set of n-channel transistors 86 and 88 also connected in series from precharge node 36 to ground, with transistor 86 receiving an input signal J at its gate and with transistor 88 receiving a gated input signal K at its gate. Lastly, note that node 44 connecting transistors 40 and 42 is further connected between transistors 86 and 88.

Circuit 82 demonstrates yet another alternative of discharge paths, where discharge may actually occur in one of four manners from precharge node 36 to ground, those being: (1) through transistors 40 and 42; (2) through transistors 86 and 88; (3) through transistors 40 and 88; and (4) through transistors 86 and 42. Thus, one skilled in the art will appreciate that circuit 82 realizes the logic output equation of ((C OR J) AND (D OR K)). In accordance with the above-principles regarding combining HVT and LVT transistors in each discharge path, recall that n-channel transistor 40 is an LVT transistor; thus, for each discharge path containing that LVT transistor, there is preferably an HVT transistor which is off during the precharge phase. As a result, n-channel transistor 42 is an HVT transistor and so is n-channel transistor 88. Thus, regardless of whether leakage occurs through either n-channel transistor 42 or n-channel transistor 88, that leakage is limited by the presence of an HVT transistor. By reasoning similar to that with respect to LVT n-channel transistor 40, note that each discharge paths including n-channel transistor 86 also includes either n-channel transistor 42 or n-channel transistor 88; thus, n-channel transistor 86 also may be an LVT transistor. Note further that if each of transistors 40 and 86 were all connected to receive gated input signals, then transistors 42 and 88 could be LVT transistors while transistors 40 and 86 were HVT transistors, again with improved performance over the prior art. Lastly, therefore, if all four transistors 40, 42, 86, and 88 were connected to receive gated input signals, then either transistors 40 and 86 or transistors 42 and 88 could be HVT transistors, with the opposing transistor pair being LVT transistors.

FIG. 7 illustrates a schematic of a so-called zipper logic circuit designated generally at 92. Zipper logic, such as circuit 92, is characterized by having successive dynamic logic circuit stages connected such that one drives the other (sometimes referred to as a domino connection), where a first dynamic logic circuit has discharge path transistors of a first conductivity type and drives a second dynamic logic circuit with discharge path transistors of a second conductivity type. In the example of circuit 92, the first dynamic logic circuit includes n-channel transistors in its discharge path while the second dynamic logic circuit includes p-channel transistors in its discharge path. Indeed, to simplify the present example given the many examples and detailed discussion above, note that circuit 92 generally combines circuits 10 and 56 of FIGS. 1 and 4, respectively, and therefore the reference numerals from those Figures are carried forward into FIG. 7. Note, however, that the FIG. 7 overall circuit is connected such that precharge node 14 of circuit 10 provides a gated input to transistor 68 of circuit 56; in other words, in the case of zipper circuits, there is no inversion of the precharge node signal before it is connected as an input to the next stage within the circuit so as to ensure proper transitions of inputs to the latter stage(s).

Given the above circuit, one skilled in the art will appreciate that circuit 92 realizes the logic output equation of (($\overline{A \text{ AND } B}$) OR G) or, by equivalency, the equation of NOT (A AND B AND $\overline{G}$). Moreover, each stage of circuit 92 benefits in the manners set forth above. Particularly, when GATED CLOCK is low, both stages are in the precharge phase of operation, and HVT n-channel discharge transistor 16 limits leakage current in the first stage while HVT p-channel discharge transistor 60 limits leakage current in the second stage. Further, when GATED CLOCK is high, both stages are in the evaluate phase of operation, and LVT n-channel transistors 22 and 24 may improve operational speed of the first stage while p-channel transistors 68 and 70 may improve operational speed of the second stage as well.

As shown and mentioned above, one stage of the FIG. 7 embodiment has discharge transistors of one conductivity type while another stage has discharge transistors of a different conductivity type. In this regard, note that a given transistor is either considered LVT or HVT with respect to other transistors of the same conductivity type. For example, n-channel transistors 22 and 24 are LVT with respect to HVT transistor 16, with transistor 16 also being of the same conductivity type (i.e., n-channel). Similarly, p-channel transistors 66 and 68 are LVT with respect to HVT transistor 60, with transistor 60 also being of the same conductivity type (i.e., p-channel). Note that transistors are characterized in this manner (i.e., by common conductivity type) because the magnitude of $V_T$ for an LVT p-channel transistor may differ from the magnitude of $V_T$ for an LVT n-channel transistor and, similarly, the magnitude of $V_T$ for an HVT p-channel transistor may differ from the magnitude of $V_T$ for an HVT n-channel transistor.

Before proceeding, note also that circuit 92 may be modified to form an alternative embodiment. Specifically, because the input to transistor 68 is from dynamic logic circuit 92 in the manner shown, it is known that the input value represents a gated signal, that is, it will be non-enabling during the precharge phase. In other words, for the example shown, during the precharge phase the input to transistor 68 is high, and a high signal is non-enabling to a p-channel transistor. Thus, it is known that p-channel transistor will be off during the precharge phase. As a result, an alternative embodiment would be to eliminate discharge transistor 60 (and connect node 64 directly to $V_{DD}$) since its purpose is only to prevent discharge during the precharge phase and because it is known that p-channel transistor 68 will be off during precharge and, therefore, will serve that same purpose. Moreover, to comply with the principles set forth above, if this modification is made then p-channel transistor 68 should be an HVT transistor as opposed to an LVT transistor as shown. By changing the $V_T$ of the transistor in this manner, it is again ensured that the discharge path includes an HVT transistor that is known to be off during the precharge phase of operation.

FIG. 8a illustrates a schematic of an alternative embodiment designated generally at 94 and which also shares certain components (having like reference numerals) with circuit 32 of FIG. 2. Specifically, in circuit 94 the output of an inverter 96 is connected to the source of n-channel transistor 42, but otherwise the remaining connections of FIG. 2 are carried forward into circuit 94. For demonstrative purposes, inverter 96 receives an input signal L at its input and, therefore, the complement of L is connected to the source of n-channel transistor 42. As demonstrated in FIG. 8b, below, inverter 96 if constructed according to known schematics may provide a discharge path which gives rise to application of the principles demonstrated above in the various preceding Figures. Thus, although inverter 96 may be constructed at a physical location which is not immediately proximate to the remainder of circuit 94 of FIG. 8a, that circuit may still benefit from the combination of differing transistors with differing threshold voltages as described below.

FIG. 8b repeats the schematic of FIG. 8a, but further details the components of inverter 96 according to a known schematic for an inverter. Particularly, the input of inverter 96 is connected to the gate of an n-channel transistor 98. The source of n-channel transistor 98 is connected to ground and its drain is connected to the output of inverter 96. In addition, inverter 96 includes a p-channel transistor 100, with its source connected to $V_{DD}$, its drain connected to the output of inverter 96, and its gate connected to the input of inverter 96.

While it is stated above that the schematic of inverter 96 is known, the particular choice of transistor threshold voltages in combination with the remaining circuitry of FIGS. 8a and 8b provides yet another inventive embodiment. Specifically, note that n-channel transistor 98 completes a discharge path from precharge node 36, through n-channel transistors 40 and 42, and finally through n-channel transistor 98. Given the discharge path created by inverter 96, various of the principles set forth above may be applied to circuit 94. For example, if the input signal L to inverter 96 is a gated signal, then it is known that n-channel transistor 98 will be off during the precharge phase of operation of circuit 94. In that instance, one embodiment would include n-channel transistor 98 as an HVT transistor while each of n-channel transistors 40 and 42 were LVT transistors. As another example, if the input signal L to inverter 96 is not a gated signal, then n-channel transistor 98 may be on during the precharge phase of operation and, therefore, a different transistor having a gated input signal (i.e., n-channel transistor 42 in the current example) in the discharge path is an HVT transistor while the remaining transistors, other than n-channel transistor 98, may be LVT transistors. In this latter instance, despite the current limitation provided by the gated input HVT transistor (e.g., n-channel transistor 42), n-channel transistor 98 of inverter 96 is still preferably also an HVT transistor so as to limit current leakage within inverter 96 when the value of L is low. In all events, therefore, FIGS. 8a–b illustrate yet another example where the present embodiments provide a current leakage limitation by the HVT transistor during the precharge phase of operation, and a speed enhancement due to the one or more LVT transistors during the evaluate phase of operation.

Figure 9:
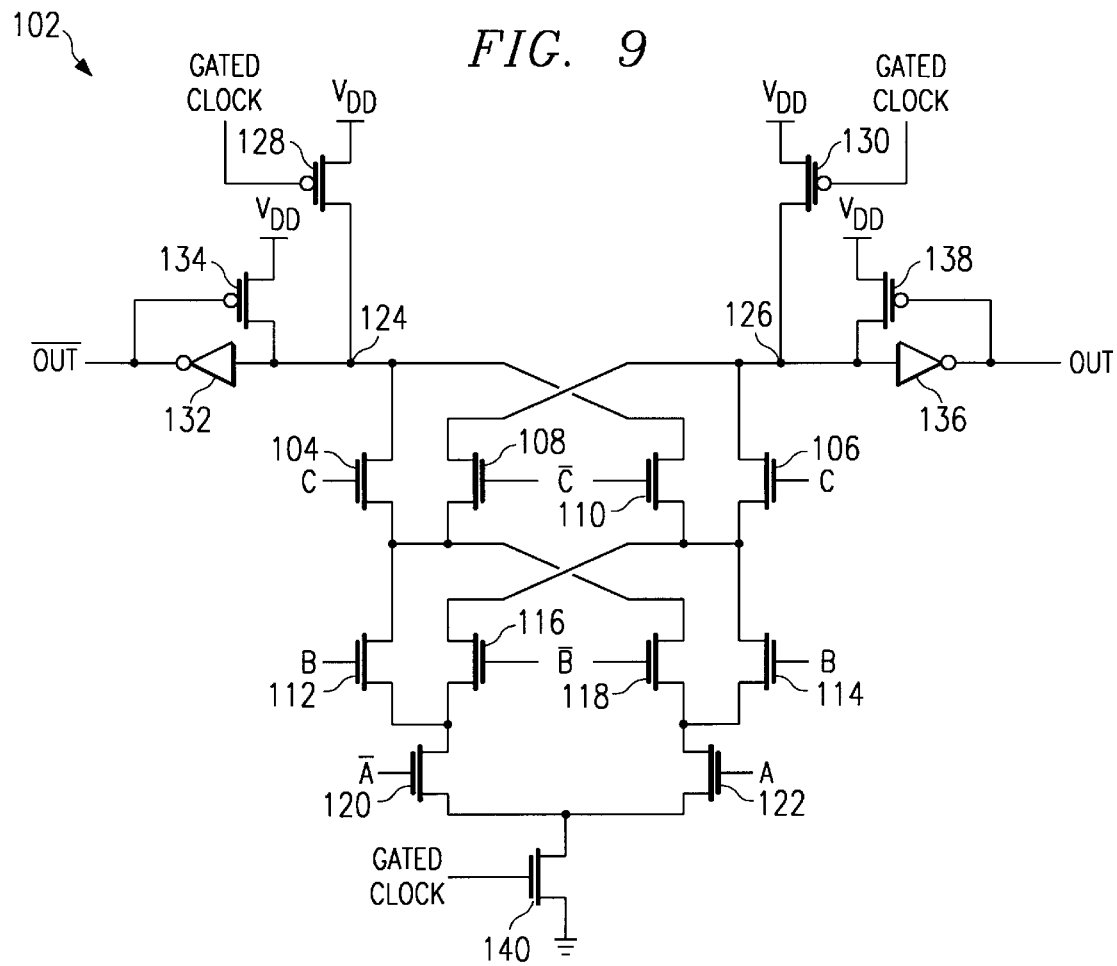
FIG. 9 illustrates a schematic of a dynamic logic circuit having two precharge nodes, wherein only one of the two precharge nodes is discharged during a given evaluate phase such that complementary outputs are provided.

FIG. 9 illustrates a schematic of an alternative embodiment designated generally at 102, and configured in what is often referred to as a dual-rail domino gate configuration. Circuit 102 operates so that one of its two outputs transitions during the evaluate phase as described below. Turning first to the components and connections of circuit 102, note that it receives complementary signal inputs, designated A and $\overline{A}$, B and $\overline{B}$, and C and $\overline{C}$. Signal C is connected to the gates of n-channel transistors 104 and 106, while signal $\overline{C}$ is connected to the gates of n-channel transistors 108 and 110. Signal B is connected to the gates of n-channel transistors 112 and 114, while signal $\overline{B}$ is connected to the gates of n-channel transistors 116 and 118. Lastly, signal $\overline{A}$ is connected to the gate of an n-channel transistor 120 while signal A is connected to the gate of an n-channel transistor 122.

In addition to the input signal connected transistors, circuit 102 includes various other transistors and connections including the following. Circuit 102 includes a first precharge node 124 and a second precharge node 126. First precharge node 124 is connected to the drain of a p-channel precharge transistor 128 which has its source connected to $V_{DD}$ and its gate connected to the GATED CLOCK signal. Similarly, second precharge node 126 is connected to the drain of a p-channel precharge transistor 130 which has its source connected to $V_{DD}$ and its gate connected to the GATED CLOCK signal. First precharge node 124 is also connected to the input of an inverter 132 as well as to the drain of a p-channel transistor 134. The source of p-channel transistor 134 is connected to $V_{DD}$ while its gate is connected to the output of inverter 132. The output of inverter 132 provides the complementary output of circuit (shown as $\overline{OUT}$ in FIG. 9). Second precharge node 126 is also connected to the input of an inverter 136 as well as to the drain of a p-channel transistor 138. The source of p-channel transistor 138 is connected to $V_{DD}$ while its gate is connected to the output of inverter 136. The output of inverter 136 provides the positive logic output of circuit (shown as OUT in FIG. 9).

The remaining connections of circuit 102 provide various discharge paths. Before specifying those paths, note that circuit 102 also includes an n-channel discharge transistor 140, which is common to each discharge path from a precharge node to ground. Specifically, each precharge node of circuit 102 is coupled by four discharge paths to ground. The four discharge paths from first precharge node 124 to ground are from first precharge node 124 through either: (1) n-channel transistor 104 through n-channel transistor 112 through n-channel transistor 120 through n-channel transistor 140; (2) n-channel transistor 110 through n-channel transistor 116 through n-channel transistor 120 through n-channel transistor 140; (3) n-channel transistor 104 through n-channel transistor 118 through n-channel transistor 122 through n-channel transistor 140; or (4) n-channel transistor 110 through n-channel transistor 114 through n-channel transistor 122 through n-channel transistor 140. In any event, if first precharge node 124 discharges, then the inverted output for circuit 102 (i.e., $\overline{OUT}$) will transition while the non-inverted output for circuit 102 (i.e., OUT) remains at a precharged level. In opposite fashion, the four discharge paths from second precharge node 126 to ground are from second precharge node 126 through either: (1) n-channel transistor 106 through n-channel transistor 114 through n-channel transistor 122 through n-channel transistor 140; (2) n-channel transistor 108 through n-channel transistor 118 through n-channel transistor 122 through n-channel transistor 140; (3) n-channel transistor 106 through n-channel transistor 116 through n-channel transistor 120 through n-channel transistor 140; or (4) n-channel transistor 108 through n-channel transistor 112 through n-channel transistor 120 through n-channel transistor 140. Lastly, if second precharge node 126 discharges, then the non-inverted output for circuit 102 (i.e., OUT) will transition while the inverted output for circuit 102 (i.e., $\overline{OUT}$) remains at a precharged level.

Without setting forth a detailed analysis here, it is recognized that one skilled in the art will determine that circuit 102 provides an exclusive OR gate for input signals A, B, and C. Given its various discharge paths, the principles set forth above may be applied to circuit 102 to provide various alternatives with respect to the threshold voltage of the transistors of that circuit which are coupled to receive an input signal (either the non-inverted or complementary signal). Thus, no asterisks are shown in FIG. 9 because of the many different variations. For example, if transistor 140 were an HVT transistor, then the remaining transistors of circuit 102 which are coupled to receive an input signal are preferably LVT transistors. However, transistor 140 may be eliminated from circuit 102 if it is known that a signal and its complement are gated (i.e., non-enabling during the precharge phase). In this instance, circuit 102 may be modified in different manners depending on which of the input signals (both non-inverted and inverted) were gated. For example, if input signals C and $\overline{C}$ are gated input signals, then transistors 104, 106, 108, and 110 are preferably HVT transistors, while the remaining transistors of circuit 102 which are coupled to receive an input signal are LVT transistors. As another example, if input signals B and $\overline{B}$ are gated input signals, then transistors 112, 114, 116, and 118 are preferably HVT transistors, while the remaining transistors of circuit 102 which are coupled to receive an input signal are LVT transistors. As yet another example, if input signals A and $\overline{A}$ are gated input signals, then transistors 120 and 122 are preferably HVT transistors, while the remaining transistors of circuit 102 which are coupled to receive an input signal are LVT transistors.

Figure 10:
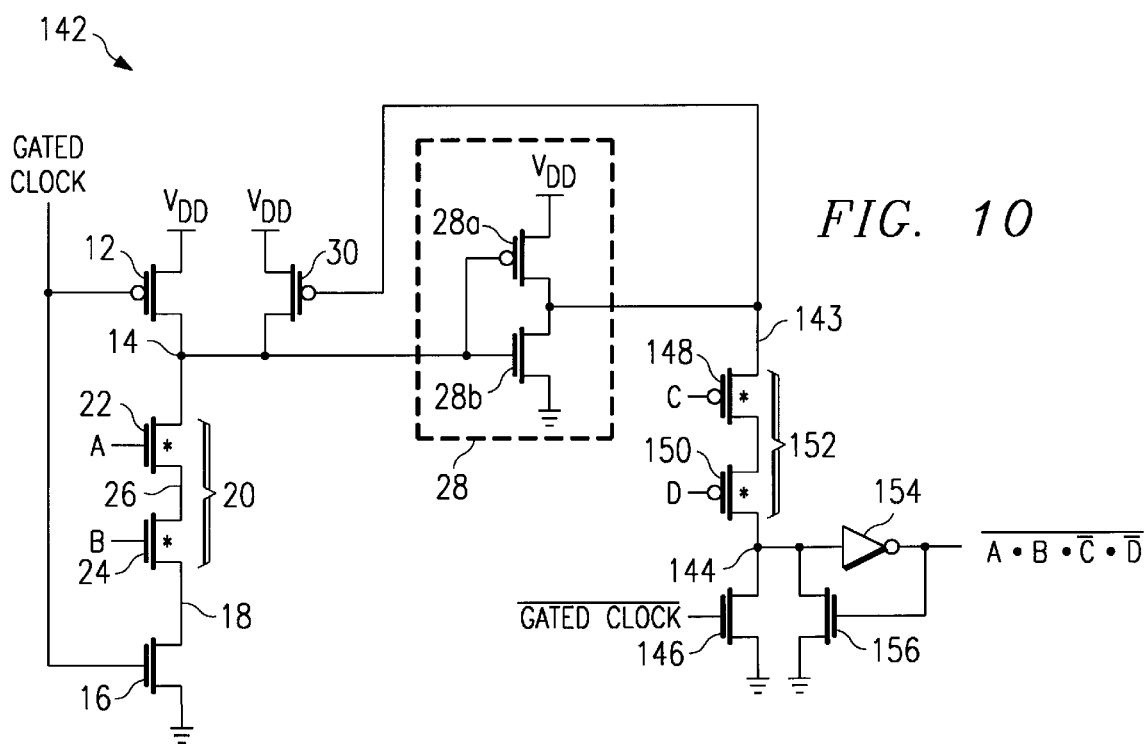
FIG. 10 illustrates a schematic of a dynamic logic circuit having the output of an n-channel domino stage providing a potential discharge path to a following p-channel domino stage.

FIG. 10 illustrates a schematic of a dynamic logic circuit designated generally at 142 and which is unknown to exist in any form in the art. Note that FIG. 10 has the output of an n-channel domino stage providing a potential discharge path to a following p-channel domino stage. Specifically, the n-channel domino stage of FIG. 10 is the same as circuit 10 of FIG. 1 and, thus, like reference numerals are carried forward from FIG. 1 to FIG. 10. Note, however, that inverter 28 of FIG. 1 is shown in greater detail to include a p-channel transistor 28a and an n-channel transistor 28b. Regarding p-channel transistor 28a, its source is connected to $V_{DD}$, its drain is connected to the output 143 of the first stage, and its gate is connected to precharge node 14. Regarding n-channel transistor 28b, its source is connected to ground, its drain is connected to output 143 of the first stage, and its gate is also connected to precharge node 14. The reason for detailing inverter 28 is better appreciated below in connection with the operation of circuit 142.

The second stage of circuit 142 includes a precharge node 144 which is connected through an n-channel precharge transistor 146 to ground. Between output 143 of the first stage and precharge node 144 are connected two p-channel transistors 148 and 150, having input signals C and D, respectively. Transistors 148 and 150, therefore, form a logic circuit for the second stage and designated at 152. Precharge node 144 is further connected to the input of an inverter 154 which provides the overall output for circuit 142. Lastly, the output of circuit 142 is also connected to the gate of an n-channel transistor 156 which has its source connected to ground and its drain connected to precharge node 144.

The operation of circuit 142 is as follows. Recall from the discussion of FIG. 1, above, that it realized the logic equation of (A AND B). However, note now that when that circuit is discharged, inverter 28 pulls output 143 to $V_{DD}$ through p-channel transistor 28a. If this is occurring, and further if both transistors 148 and 150 of the second stage of circuit 142 are conducting, then precharge node 144 is discharged from ground toward $V_{DD}$. Accordingly, inverter 28 may provide a portion of a discharge path from precharge node 144 to $V_{DD}$. In addition, during the precharge phase of operation, precharge node 14 is high and, therefore, p-channel transistor 28a is not enabled. Given these observations as well as the various principles set forth above, note that p-channel transistor 28a is therefore an HVT transistor located in the discharge path of a dynamic logic circuit and is non-enabled during the precharge phase of operation. Consequently, the remaining transistors in that discharge path (i.e., transistors 148 and 150) may be LVT transistors, thereby improving performance as in the manners described above. Lastly, one skilled in the art will appreciate that circuit 142 realizes the logic equation of (NOT(A AND B AND $\overline{C}$ AND $\overline{D}$)).

From the above, one skilled in the art will appreciate that the embodiments of this Section demonstrate various circuits which benefit by including at least one HVT transistor and one LVT transistor in the discharge path of a dynamic logic circuit, where it is known that the at least one HVT transistor is not enabled during the precharge phase of operation. Moreover, note with respect to the HVT transistor that it is included to address the concern of current leakage limitation during the precharge phase, that is, to limit current through a device during which is not enabled during the precharge phase. As an additional consideration, therefore, note also that other transistors may be known to be conducting during the precharge phase. As to these other transistors, by definition leakage is not a concern because these other transistors are conducting during such a time. As a result, such other transistors (e.g., precharge transistor 12 of FIG. 1, and the n-channel transistor of inverter 28 which is shown in various Figures) also may be constructed as LVT transistors to improve the operational speed of those transistors and without concern as to leakage. Still further, while the above demonstrates various embodiments, still other examples will be ascertainable by a person skilled in the art.

2. Dynamic Logic Circuits, Systems, And Methods Using Cascode Transistors Having Low Threshold Voltages FIGS. 11a and 11b and their corresponding descriptions demonstrate various transistor principles which facilitate an appreciation of the additional embodiments shown and described in connection with FIGS. 12 through 18. Like the embodiments above, these additional embodiments also improve performance by reducing leakage current and circuit transition time.

Figure 11A:
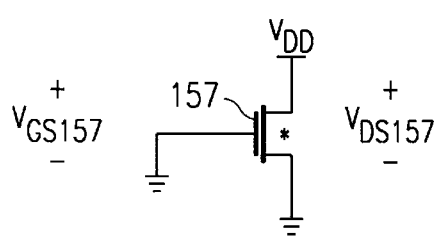
FIG. 11a illustrates a schematic of a low threshold voltage transistor having a drain-to-source voltage equal to the full power supply voltage and its gate connected to ground.

Turning then to FIG. 11a, it illustrates a single LVT n-channel transistor 157 with its drain connected to a system voltage level (e.g., $V_{DD}$), and its gate and source connected to the low reference voltage (e.g., ground). To simplify the following discussion, FIG. 11a shows the drain-to-source voltage ($V_{DS157}$) and the gate-to-source ($V_{GS157}$) of transistor 157. Given the biasing of transistor 157, clearly it is turned off; however, as known in the art, a transistor in its off state will still have some amount of current leakage through the transistor. Moreover, because transistor 157 is an LVT transistor, the amount of leakage current through it will be several orders of magnitude higher than if it were an HVT transistor. Lastly for comparison purposes demonstrated below, note further with respect to transistor 157 that $V_{DS157}=V_{DD}$, that is, the entire supply voltage, $V_{DD}$, is across transistor 157.

Figure 11B:
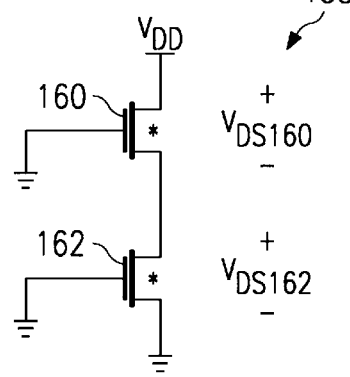
FIG. 11b illustrates a schematic of a pair of cascode connected low threshold voltage transistors with the gate of each transistor connected to ground.

FIG. 11b illustrates a circuit designated at 158, and which includes two transistors 160 and 162 connected in a so-called cascode manner. In other words, transistors 160 and 162 are connected in series and directly to one another. Particularly, the source of transistor 160 is connected to the drain of transistor 162, the drain of transistor 160 is connected to $V_{DD}$, and the source of transistor 162 is connected to ground. To further introduce the various inventive embodiments below, note further some additional aspects of circuit 158. First, both transistors 160 and 162 are LVT transistors. Second, each of transistors 160 and 162 is off (i.e., not enabled) since they are n-channel transistors and their corresponding gates are connected to a non-enabling voltage equal to ground (i.e., the gate-to-source voltage of each transistor is below its threshold voltage).

Third, note that each of transistors 160 and 162 is of like conductivity type, which in the current example is an n-channel transistor. Lastly, to simplify the following discussion, FIG. 11b also shown the drain-to-source voltage for each of transistors 160 and 162 ($V_{DS160}$ and $V_{DS162}$, respectively).

Like transistor 157 of FIG. 11a, some leakage current will pass through off transistors 160 and 162 of FIG. 11b; however, for reasons detailed below, the amount of leakage current passing through off transistors 160 and 162 is considerably less than that through transistor 157. Particularly, note that $V_{DS162}$ is much smaller than $V_{DD}$, whereas $V_{DS157}$ was equal to $V_{DD}$ in FIG. 11a. For example, for a $V_{DD}$ on the order of 1.8 volts, $V_{DS162}$ may be a few hundred millivolts. Further, the $V_T$ of a transistor is often dependent upon on its $V_{DS}$. Specifically, at a relatively high $V_{DS}$ the $V_T$ of a transistor decreases. Conversely, at a relatively low $V_{DS}$ the $V_T$ of a transistor increases and, hence, the leakage current through that same transistor decreases. For example, the leakage current might be reduced by a factor of fifty. Given this relationship between a transistor's $V_{DS}$ and leakage current, since $V_{DS162}$ in FIG. 11b is much smaller than $V_{DS157}$ in FIG. 11a, then the current leakage through transistor 162 is less than it is through transistor 157. Additionally, note that the gate-to-source voltage of transistor 160 is a negative voltage (i.e., $-V_{DS162}$) and that the same reduced amount of leakage current also passes through it. Finally, note that while two cascoded transistors in FIG. 11b limit the amount of leakage current, one or more additional off transistors connected in the series path may further reduce the amount of leakage current, but the reduction is not as significant for any such additional transistor(s).

Having appreciated the reduced current leakage benefits of the cascode connections in FIGS. 11b, the inventor of the present embodiments has further applied those aspects to dynamic logic circuits in certain instances as shown below. For purposes of convenience, the following Figures share various features with certain ones of the earlier Figures. Thus, to simplify the discussion, like reference numerals are used in various instances with the reader invited to refer to the earlier discussion for a more detailed discussion of those like aspects. With respect to the following embodiments, however, note at the outset that it is not necessary as in Section 1 above to include an HVT transistor in the discharge path of the circuit configuration; instead, connections such as demonstrated in FIG. 11b or other alternatives are used as better appreciated below.

Figure 12:
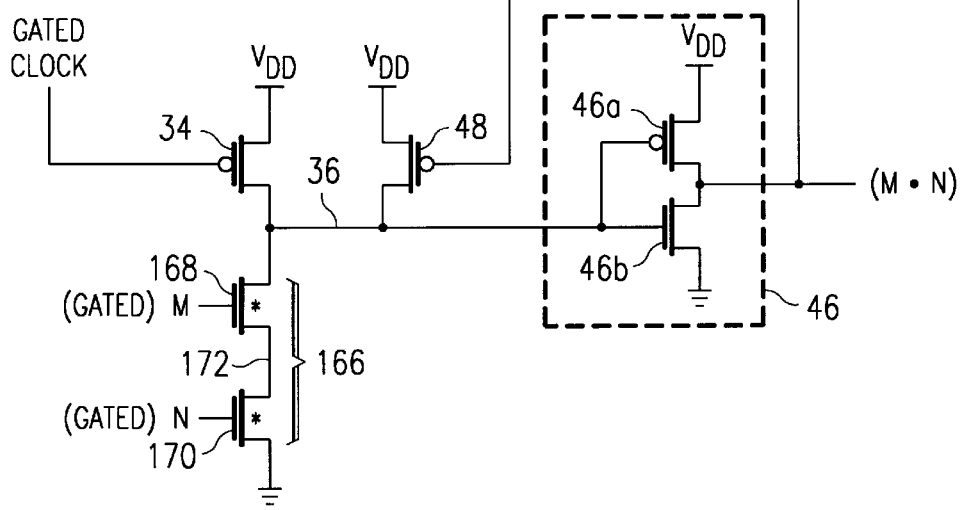
FIG. 12 illustrates a schematic of a dynamic logic circuit having a pair of cascode connected low threshold voltage transistors in its discharge path where each of those transistors is disabled during the precharge phase of operation.

FIG. 12 illustrates a schematic of a dynamic logic circuit embodiment designated generally at 164, and which shares some connections with circuit 32 of FIG. 2. Briefly, those common features include a GATED CLOCK signal driving the gate of a p-channel transistor 34 which precharges precharge node 36 when the GATED CLOCK signal is low. Other common characteristics between FIGS. 12 and 2 include an inverter 46 and a p-channel transistor 48 which maintains precharge node 36 high after the GATED CLOCK signal transitions low so long as precharge node 36 is not otherwise discharged as discussed below. For reasons more clear below, the details of inverter 46 are shown in FIG. 12 whereas they were not in FIG. 2. Turning then to those details, inverter 46 includes a p-channel transistor 46a having its source connected to $V_{DD}$, its drain connected to the output of inverter 46, and its gate connected to the input of inverter 46. Additionally, inverter 46 includes an n-channel transistor 46b having its source connected to ground, its drain connected to the output of inverter 46, and its gate connected to the input of inverter 46.

A logic circuit designated generally at 166 is connected between precharge node 36 and ground. Logic circuit 166 includes two series connected n-channel transistors 168 and 170. The particular logic of logic circuit 166 implements the logic equation of M AND N; more particularly, the gate of n-channel transistor 168 is connected to receive a gated input signal M and the gate of n-channel transistor 170 is connected to receive a gated input signal N. Again, because input signals M and N are gated signals, their values are only asserted when the GATED CLOCK signal is high and it is known that these gated input signals will be low when the GATED CLOCK signal is low. Detailing the connections of logic circuit 166, the drain of n-channel transistor 168 is connected to precharge node 36 and the source of n-channel transistor 168 is connected to a node 172. The drain of n-channel transistor 170 is connected to node 172 and the source of n-channel transistor 170 is connected to ground (or some potential differing from the supply voltage so as to allow discharge when all transistors in the discharge path conduct). Lastly, and importantly, note that each of transistors 168 and 170 is an LVT transistor.

The logic equation realized by circuit 164 of FIG. 12 is the same as in a prior art configuration including circuitry connected in the manner of that Figure, but the speed of the circuit as well as its leakage current characteristics are quite different due to the inclusion of series connected LVT transistors which are not conducting during the precharge phase of operation. This advancement over the prior art is better appreciated from the following discussion of the operation of circuit 164 which, as a dynamic logic circuit, occurs over a precharge phase followed by an evaluate phase.

Circuit 164 is in its precharge phase when the GATED CLOCK signal is low, and precharge node 36 is precharged in the same manner as described above in connection with FIG. 2. Note further, however, because both input signals M and N are gated, those signals are not asserted when the GATED CLOCK signal is low. As a result, n-channel transistors 168 and 170 are not conducting during the precharge phase. More importantly, note during this instance that n-channel transistors 168 and 170 are therefore connected in the same manner as transistors 160 and 162 of FIG. 11b, that is, they are series connected and the gates of each is connected to ground. Given the above discussion of limited current leakage in FIG. 11b, note therefore that during the precharge phase of operation that logic circuit 166 will leak a less amount of current as compared to a like circuit having two series connected LVT transistors but where the input of one of those transistors is not grounded.

Circuit 164 is in its evaluate phase when the GATED CLOCK signal is high. At the beginning of the evaluate phase, therefore, circuit 164 continues to output the 0 logic signal caused by the precharge stage (and this output is further maintained by p-channel transistor 48). During the evaluate phase, and due to the action in response to the GATED CLOCK signal and logic circuit 166, the logic output signal may remain in the same state as it was after the precharge phase or, instead, transition to an opposite logic state. Particularly, either during or after the transition of the GATED CLOCK signal from low to high, the connection of precharge node 36 to ground occurs if the logic accomplished by logic circuit 166 is such that each transistor in that circuit conducts. In the current example, the logic operation is M AND N; thus, if both the gated inputs M and N rise from low to high either during or after the transition of the GATED CLOCK signal from low to high, the transistors of logic circuit 166 conduct and precharge node 36 is connected to ground. Consequently, the precharge voltage is discharged, and the output signal as provided by inverter 46 transitions from its precharge state (i.e., at a logic 0) to a discharge state providing an output representing a logic 1. Note further, however, that when such a discharge takes place, it occurs using LVT transistors (i.e., transistors 168 and 170). Because the current through these transistors is increased over a circuit using HVT transistors in place of the LVT transistors, the discharge speed of the circuit is improved and overall performance is enhanced.

Given an appreciation of the improved operation of circuit 164, note that it benefits from having at least two LVT transistors in its discharge path where those transistors are known to be off during the precharge phase. However, note further that the discharge path in circuit 164 includes only two transistors. Therefore, to satisfy the above requirement, then each of those transistors in the discharge path has the same $V_T$ (which is a low $V_T$). Since the $V_T$ of each discharge path transistor is the same, there must be some reference point to compare the $V_T$ of those transistors. In other words, in FIGS. 1 through 10b, it is easy to contrast the threshold voltages of varying transistors in the same discharge path, where some of the transistors within a given discharge path have a lower $V_T$ than other transistors in the same discharge path. In contrast, however, in FIG. 12 (as well as other Figures below), all of the discharge path transistors have the same $V_T$. Thus, it should be noted with respect to FIG. 12 as well as in connection with various of the following embodiments, that an LVT transistor indicates that the $V_T$ of that transistor is lower than the $V_T$ of another transistor somewhere in the signal path of the circuit. For example, in FIG. 12, the signal path includes the M and N inputs and continues through to the output of the circuit. Given that signal path, it clearly includes inverter 46. Moreover, the $V_T$ of transistors 168 and 170 is lower than the $V_T$ of the n-channel transistor 46b which is included to construct inverter 46. Thus, in the example of FIG. 12, the basis for comparing the $V_T$ of the discharge path transistors to another transistor may be found in an immediate and proximate connection with respect to precharge node 36 (i.e., in inverter 46). However, in alternative embodiments an HVT transistor or transistors may be found coupled somewhere else in the circuit signal path, such as in a preceding or following stage like a preceding stage which provides an input to a given stage or a following stage which is coupled either to the discharge node and/or the output of a given stage. Still further, the signal path may pass through an even earlier stage or later occurring stage, where a signal change in that stage also affects, or is affected by, a signal change in the stage having the LVT transistors. In all events, and like the embodiments described in Section 1, the following embodiments are constructed using a manufacturing process which specifically permits the designer to choose between differing threshold voltages for certain transistors between either LVT or HVT transistors, such as by using different masks as earlier described in Section 1.

Figure 13:
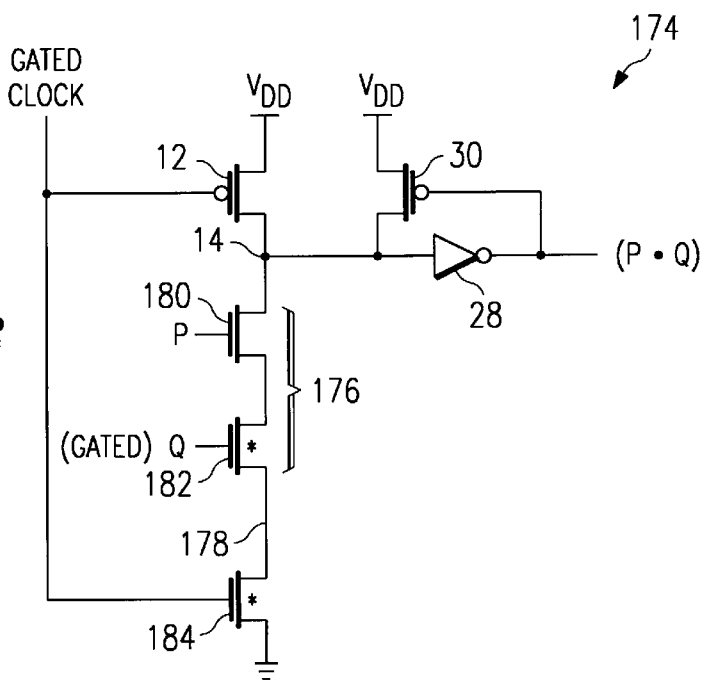
FIG. 13 illustrates a schematic of a dynamic logic circuit having a pair of cascode connected low threshold voltage transistors connected in series with a high voltage threshold transistor in its discharge path, where each of the low threshold voltage transistors is disabled during the precharge phase of operation.

FIG. 13 illustrates a schematic of a dynamic logic circuit embodiment designated generally at 174, and which shares some connections with circuit 10 of FIG. 1. Briefly, those common features include: (1) a GATED CLOCK signal driving the gate of a p-channel transistor 12 which precharges precharge node 14 when the GATED CLOCK signal is low; and (2) an inverter 28; and (3) a p-channel transistor 30 which maintains precharge node 14 high after the GATED CLOCK signal transitions low so long as precharge node 14 is not otherwise discharged as discussed below.

A logic circuit designated generally at 176 is connected between precharge node 14 and a node 178. Logic circuit 176 includes two series connected n-channel transistors 180 and 182. The particular logic of logic circuit 176 implements the logic equation of P AND Q as the gates of n-channel transistors 180 and 182 are connected to those inputs signals, respectively. Note further that input signal Q is a gated signal while input signal P is not. Detailing the connections of logic circuit 176, the drain of n-channel transistor 180 is connected to precharge node 14, the source of n-channel transistor 182 is connected to node 178, and the source of n-channel transistor 180 is connected to the drain of n-channel transistor 182. Lastly, note that n-channel transistor 182 is an LVT transistor.

In addition to logic circuit 176, circuit 174 also includes an LVT n-channel transistor 184 having its gate connected to receive the GATED CLOCK signal, its drain connected to node 178, and its source connected to ground. As detailed below, n-channel transistor 184 actually may be eliminated from circuit 174, but such an action would require a change in the $V_T$ of transistor 182 to comport with at least one embodiment aspect described herein. This possibility is addressed after the following operational description of FIG. 13.

Circuit 174 is in its precharge phase when the GATED CLOCK signal is low, and precharge node 14 is precharged in the same manner as described above in connection with FIG. 1. Note further, however, because a low GATED CLOCK signal also turns off n-channel transistor 184, it will prevent precharge node 14 from discharging regardless of the operation of logic circuit 176. Moreover, input signal Q is also gated, so n-channel transistor 182 is also not conducting during the precharge phase. Given the above, during the precharge phase n-channel transistors 182 and 184 are therefore connected in the same manner as transistors 160 and 162 of FIG. 11b, that is, they are series connected and the gate of each transistor is connected to ground. Again, therefore, during the precharge phase logic circuit 176 will leak a less amount of current as compared to a like circuit having two series connected LVT transistors but where the input of one of those transistors is not grounded.

As mentioned above, n-channel transistor 184 may be eliminated from circuit 174, but given the present embodiments one skilled in the art may then reconsider the $V_T$ of both n-channel transistors 180 and 182. With respect to eliminating n-channel transistor 184, recall that it ensures that precharge node 14 cannot discharge during the precharge phase because it is guaranteed that n-channel transistor 184 is off (i.e., not enabled) during that phase. However, because n-channel transistor 182 has a gated input, it also ensures that that precharge node 14 cannot discharge during the precharge phase. If discharge prevention were the sole consideration, therefore, then n-channel transistor 184 could be removed from circuit 174 with the resultant circuit still preventing discharge during the precharge phase. If this sole modification were made, however, note that the discharge path would include HVT transistor 180 in series with the gated LVT transistor 182. As a result, if in a given instance input P were high during precharge, the discharge path would resemble the connections shown is FIG. 11a, thereby yielding higher current leakage. In order to avoid this occurrence (and assuming the above modification were desired such that n-channel transistor 184 were removed from circuit 174), then n-channel transistor 180 is preferably constructed as an LVT transistor and n-channel transistor 182 an HVT transistor, thereby accomplishing the configuration shown in FIG. 2, above. Lastly, note further that even if n-channel transistor 184 were not removed from circuit 174, then n-channel transistor 180 could also be LVT as well, thereby connecting three LVT transistors in the discharge path of the circuit.

Figure 14:
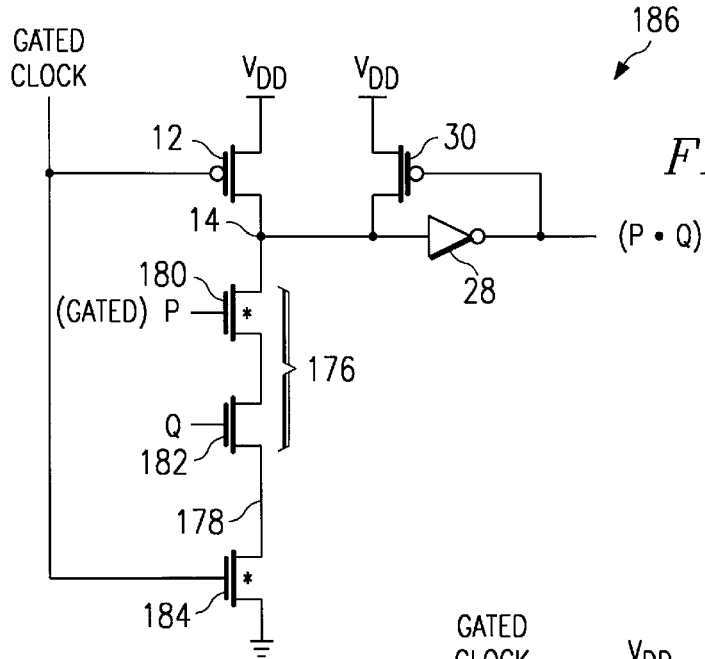
FIG. 14 illustrates a schematic of a dynamic logic circuit having two low threshold voltage transistors connected in series with a high voltage threshold transistor in its discharge path, where each of the low threshold voltage transistors is disabled during the precharge phase of operation and where the high voltage threshold transistor is connected between the two low threshold voltage transistors.

FIG. 14 illustrates a schematic of a dynamic logic circuit embodiment designated generally at 186, and with the following two exceptions is the same as circuit 174 as depicted in FIG. 13. As a first difference between FIGS. 13 and 14, n-channel transistor 180 is an LVT transistor in FIG. 14 whereas it is an HVT transistor in FIG. 13. As a second difference between FIGS. 13 and 14, n-channel transistor 182 is an HVT transistor in FIG. 14 whereas it is an LVT transistor in FIG. 13. Without restating the details from above, one skilled in the art will appreciate that circuit 186 accomplishes the same logical output as circuit 174 (i.e., P AND Q). A noteworthy distinction in FIG. 14, however, is that the two discharge path LVT series connected transistors (i.e., transistors 180 and 184) are, although connected in series, not directly connected to one another. Instead, HVT transistor 182 is connected in series between the two LVT transistors 180 and 184. As demonstrated below, however, circuit 186 still benefits as opposed to a circuit without series connected LVT transistors which are off during the precharge phase.

Turning then to the precharge phase, it is known that both LVT transistors 180 and 184 will be off (because the former has a gated input and the latter is gate-connected to the GATED CLOCK signal). The unknown is whether or not transistor 182 will be on or off. In either instance, however, the following demonstrates that circuit 186 still improves performance regardless of whether transistor 182 is on or off. Consider first the instance where transistor 182 is on during the precharge phase. Given this assumption, transistors 180 and 184 are, by approximation, directly connected to one another and, therefore, the resulting circuit approximates circuit 110 of FIG. 12 during the precharge phase. Consider second the instance where transistor 182 is off during the precharge phase. Given this assumption there is then an HVT transistor in the discharge path and which is off; thus, the HVT transistor provides an additional limit on the amount of possible leakage current as described in Section 1, above.

Given the above description of FIG. 14, one skilled in the art will appreciate that a discharge path in accordance with the embodiments of the current Section includes two series connected LVT transistors, but those transistors may not be connected directly to one another yet still be connected in series in the same discharge path. For example, the embodiment of FIG. 14 shows one possible structure, which in that example is HVT transistor 182, which separates the series connected LVT transistors. Note, however, that this may be but one example. Note further, however, that the FIG. 14 embodiment could be further modified. For example, n-channel transistor 182 could also be made to be an LVT transistor, with the resulting circuit having three series connected LVT transistors in its discharge path. Given this modification, again improvements are realized over the prior art. Specifically, if the input signal Q were enabling during precharge, then LVT transistors 180 and 184 would be approximately connected in the same manner as LVT transistors 160 and 162 of FIG. 11*b*, with the resulting benefits. Conversely, if the input signal Q were disabling during precharge, the three non-conducting series connected LVT transistors (i.e., 180, 182, and 184) would further limit the amount of current leakage during that period.

Figure 15A:
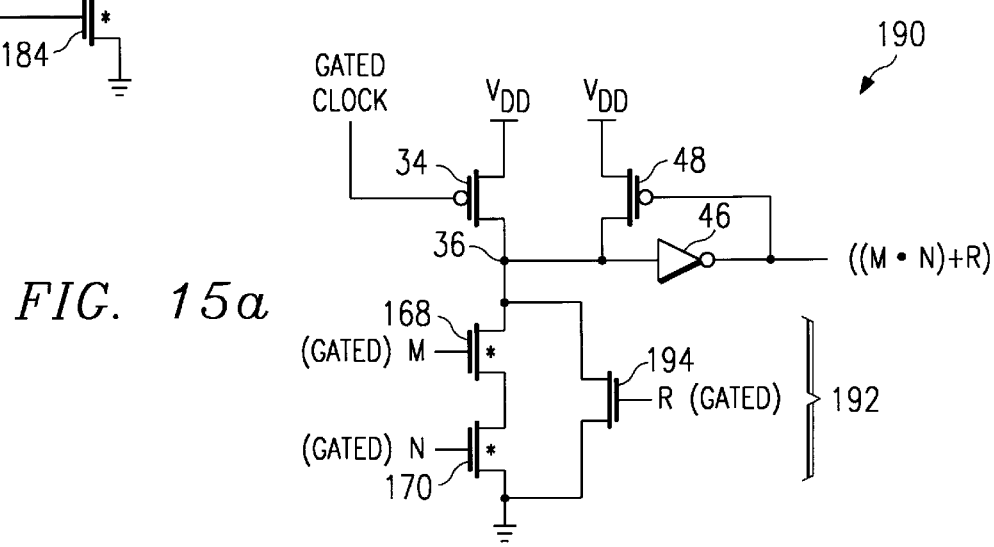
FIG. 15a illustrates a schematic of a dynamic logic circuit having two discharge paths, with a first discharge path including a pair of cascode connected low threshold voltage transistors in its discharge path where each of those transistors is disabled during the precharge phase of operation, and with a second discharge path including a high threshold voltage transistor which is disabled during the precharge phase of operation.

FIG. 15*a* illustrates a schematic of a dynamic logic circuit embodiment designated generally at 190, and which shares some connections with circuit 76 of FIG. 5. Circuit 190, like circuit 76, includes more than one discharge path. In general, the combined discharge paths demonstrate an example of combining the concept introduced with respect to FIGS. 11*b* through 14 with the concept introduced in Section 1. For example, the two discharge paths form a logic circuit 192 connected between precharge node 36 and ground. The first discharge path is the same as in FIG. 12, and therefore includes two series LVT connected transistors 168 and 170, each having a respective gated input signal M and N. The second discharge path includes a single n-channel transistor 194, and note that transistor 194 is an HVT transistor with a gated input signal (i.e., R).

Given the configuration of FIG. 15*a*, one skilled in the art will appreciate that it realizes the logic equation of ((M AND N) OR R). Insofar as the first part of that equation is concerned (i.e., (M AND N)), the reader is referred to the above discussion of FIG. 12 which demonstrates how the series connected gated-input LVT transistors 168 and 170 provide increased speed performance and reduced current leakage. With respect to the second part of the logic equation (i.e., OR R), note that discharge node 36 is discharged if R is asserted thereby causing transistor 194 to conduct. Note further, however, that R is a gated signal. In accordance with the principles of the current Section, therefore, transistor 194 cannot be formed as an LVT transistor because the discharge path from precharge node 36 through transistor 194 would then only include a single LVT transistor which is not enabled during precharge, and that would resemble the leaky configuration of transistor 157 in FIG. 11*a*. Instead, and in accordance with the principles of Section 1, transistor 140 is an HVT transistor in a discharge path and is guaranteed to be off (i.e., non-enabled) during the precharge phase. Note further that the second discharge path is in parallel with the first discharge path; consequently, the reduced resistance of the first discharge path when it is conducting may improve the speed of the second discharge path when it too is conducting.

Figure 15B:
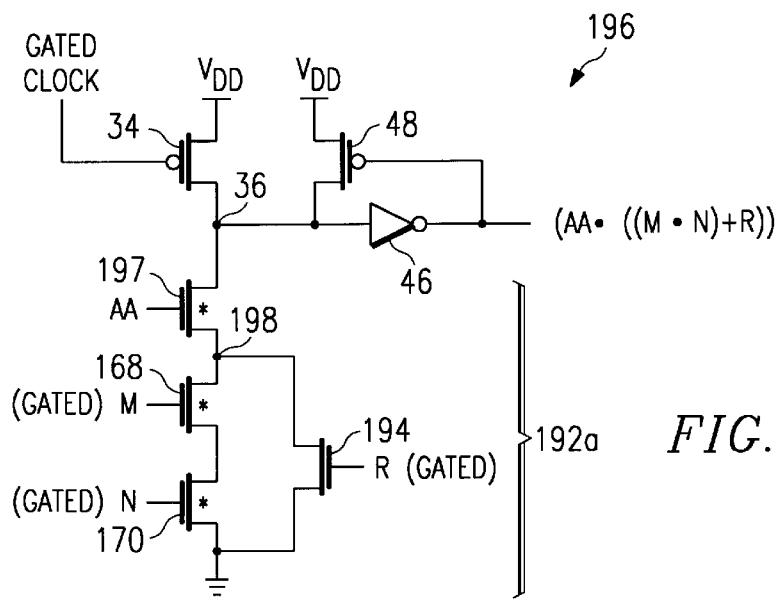
FIG. 15b illustrates a modification to the schematic of the dynamic logic circuit of FIG. 15a and again having two discharge paths, but where an additional transistor is included which is shared by both of the two discharge paths.

FIG. 15*b* illustrates a schematic of a dynamic logic circuit designated generally at 196, and which depicts a modification to circuit 190 of FIG. 15*a*. Recall that circuit 190 of FIG. 15*a* included two discharge paths, a first from precharge node 36 through transistors 168 and 170 and a second from precharge node 36 through transistor 194. Circuit 196 of FIG. 15*b* also includes these paths; however, these paths both further include an additional n-channel LVT transistor 197 connected between precharge node 36 and a node 198. Thus, note that both discharge paths share n-channel LVT transistor 197 as part of each respective discharge path. Note further that n-channel LVT transistor 197 receives an input signal, designated AA, and that signal AA in not a gated input signal.

Given the logic equation realized by circuit 190 of FIG. 15*a*, one skilled in the art will appreciate that circuit 196 of FIG. 15*b* realizes the logic equation of (AA AND ((M AND N) OR R)). In other words, the precharged voltage at precharge node 36 discharges if either path from node 198 to ground is enabled and transistor 197 also concurrently conducts. Note that the discharge path from precharge node 36 through transistors 197, 168, and 170 includes all LVT transistors and, therefore, is faster to discharge than a prior art discharge path including all HVT transistors. Note also that the discharge path from precharge node 36 through transistors 197 and 194 includes one LVT transistor and one HVT transistor and, therefore, is faster to discharge than a prior art discharge path including two HVT transistors.

Figure 16:
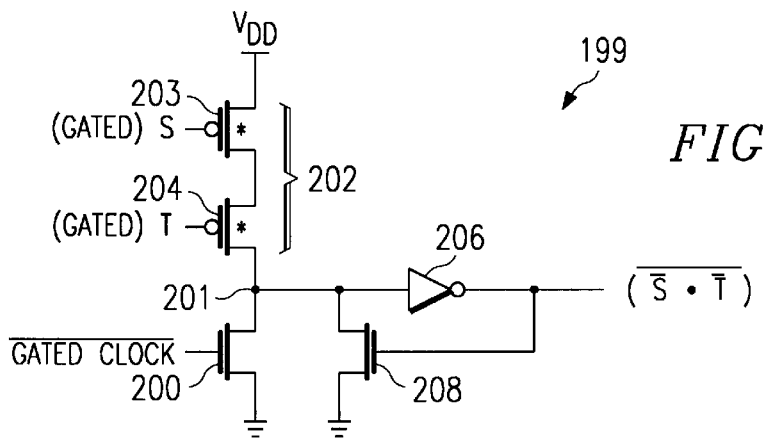
FIG. 16 illustrates a schematic of a dynamic logic circuit having a pair of cascode connected low threshold voltage p-channel transistors in its discharge path where each of those transistors is disabled during the precharge phase of operation.

FIG. 16 illustrates a schematic of a circuit designated generally at 199 which, like FIG. 4 above, depicts an example of an alternative precharge and discharge operation where precharge is a low voltage (e.g., ground) and a discharge is toward a relatively higher voltage (e.g., $V_{DD}$). FIG. 16, however, demonstrates the use of series connected LVT transistors to accomplish reduced current leakage and increased circuit speed. Turning then to the details of circuit 199, it receives the complement of the GATED CLOCK SIGNAL (i.e., $\overline{\text{GATED CLOCK}}$ in FIG. 16) at the gate of a an n-channel transistor 200 which has a source connected to ground and a drain connected to a precharge node 201. Between precharge node 201 and $V_{DD}$ is connected a logic circuit designated generally at 202 which implements the logic equation of S OR T (i.e., or equivalently, NOT ($\overline{S}$ AND $\overline{T}$)). Logic circuit 202 includes two series connected p-channel transistors 203 and 204 which are connected to receive respective gated inputs signals S and T. As gated input signals, it is known that S and T are non-enabling during the precharge phase. Therefore, because S and T are connected to the gates of p-channel transistors, they will be high during the precharge phase (i.e., a high signal is non-enabling to a p-channel transistor). Note further that each of p-channel transistors 203 and 204 is an LVT transistor.

Returning to precharge node 201, it is further connected to the input of an inverter 206. Although not shown in the present Figure, inverter 206 includes both a p-channel transistor and an n-channel transistor as in the manner shown in FIG. 10*b*, and the p-channel transistor is preferably an HVT transistor relative to the $V_T$ of p-channel transistors 203 and 204. The output of inverter 206 provides the output signal for circuit 199 (i.e., (S OR T) or, equivalently, NOT ($\overline{S}$ AND $\overline{T}$)), and is also connected to the gate of an n-channel transistor 208. The source of n-channel transistor 208 is connected to ground and the drain of n-channel transistor 208 is connected to precharge node 201.

The operation of circuit 199 is similar to that of circuit 164 of FIG. 12, but with opposite effects in that p-channel transistors are used for discharging rather than n-channel transistors. During the precharge phase, the GATED CLOCK signal is low and, thus, its complement is high. In this instance, n-channel transistor 200 conducts, thereby precharging precharge node 201 to ground and causing circuit 199 to output a high signal (due to the inversion by inverter 206). Further, because S and T are gated inputs (i.e., non-enabling during precharge), the p-channel transistors driven by those signals are off during precharge thereby preventing precharge node 201 from discharging. Moreover, during precharge these transistors also represent non-conducting series connected LVT transistors in the manner of FIG. 11*b* and, therefore, current leakage is reduced. During the evaluate phase, the GATED CLOCK signal is high and, thus, its complement is low. At the beginning of the evaluate phase, therefore, circuit 199 continues to output the logic 1 caused by the precharge stage. However, due to the action in response to the complement of the GATED CLOCK signal and logic circuit 202, that logic output signal may remain in the same state as it was after the precharge phase (and maintained by n-channel transistor 208) or, instead, transition to an opposite logic state. Particularly, during the evaluate phase, precharge node 201 is connected to $V_{DD}$ if both the S and T inputs input signals are low. As a result, the precharge voltage (i.e., ground in the example of FIG. 16) at precharge node 201 is allowed to discharge toward $V_{DD}$. Note that by discharging precharge node 201 in this manner that the voltage at precharge node 201 then reaches near or to $V_{DD}$ and further is inverted by inverter 206. Consequently, in the example of circuit 199, a discharge in this manner represents a transition of the logic value of circuit 199 from a logic 1 to a logic 0. Note also that because transistors 203 and 204 are LVT transistors, the speed of this discharge is increased over an HVT alternative. Lastly, the $V_T$ of transistors 203 and 204 is considered low when compared to that of at least one other p-channel transistor connected somewhere along the signal path within or connected to the circuit, such as, by example, when compared to the p-channel transistor included within inverter 206 (which is not specifically shown, but understood to be included in the same manner as shown in inverter 46 of FIG. 12).

Figure 17:
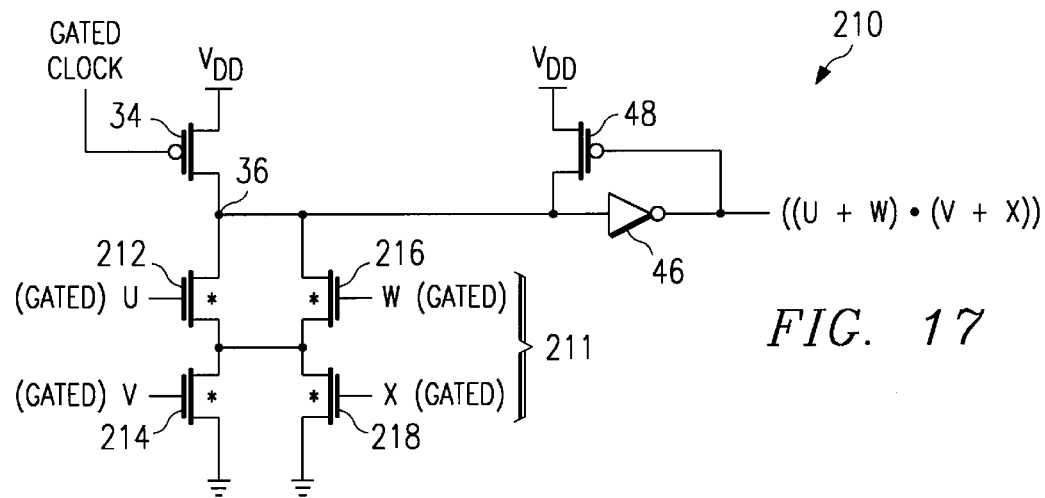
FIG. 17 illustrates a schematic of a dynamic logic circuit having the components of FIG. 12, and further including additional connections providing a total of four different paths by which discharge may occur, where each discharge path includes a pair of cascode connected low threshold voltage transistors and where each of those transistors is disabled during the precharge phase of operation.

FIG. 17 illustrates a schematic of a dynamic logic circuit embodiment designated generally at 210, and which shares many of the same connections with circuit 82 of FIG. 6. However, in FIG. 17 the input signals are changed as are the threshold voltages of certain transistors within the discharge paths of the circuit; thus, different reference numerals are used with respect to those paths so as to avoid confusion with the earlier Figure. Turning then to the different aspects of circuit 210, it includes a logic circuit 211 which includes the following four discharge paths from precharge node 36 to ground: (1) through transistors 212 and 214; (2) through transistors 216 and 218; (3) through transistors 212 and 218; and (4) through transistors 216 and 214. Thus, one skilled in the art will appreciate that circuit 211 realizes the logic output equation of ((U OR W) AND (V OR X)). In accordance with the above-principles regarding series connected LVT transistors in each discharge path, note however that each of the four potential discharge paths include only two transistors. Thus, like in the instance of FIG. 12, the two transistors which are not enabled during precharge in each discharge path may be LVT transistors, thereby rendering each transistor of logic circuit 211 as an LVT transistor. Still further, note that each of these transistors has an input which is non-enabling during the precharge phase of operation. Lastly, the $V_T$ of transistors 212 through 218 are considered low when compared to that of at least one other n-channel transistor connected somewhere along the signal path within or connected to the circuit, such as, by example, when compared to the n-channel transistor 46*b* (not shown in FIG. 17; see FIG. 12) included within inverter 46.

Given the above, note during the precharge phase that each possible discharge path includes two series connected LVT transistors, and that each of those is off during the precharge phase due to its non-enabling (e.g., gated input) input signal. Consequently, reduced leakage benefits such as those in FIG. 11*b* are achieved during the precharge phase. Additionally, during the evaluate phase each discharge path necessarily includes two LVT transistors, thereby increasing transition speed over a circuit using all HVT transistors in a discharge path.

Figure 18:
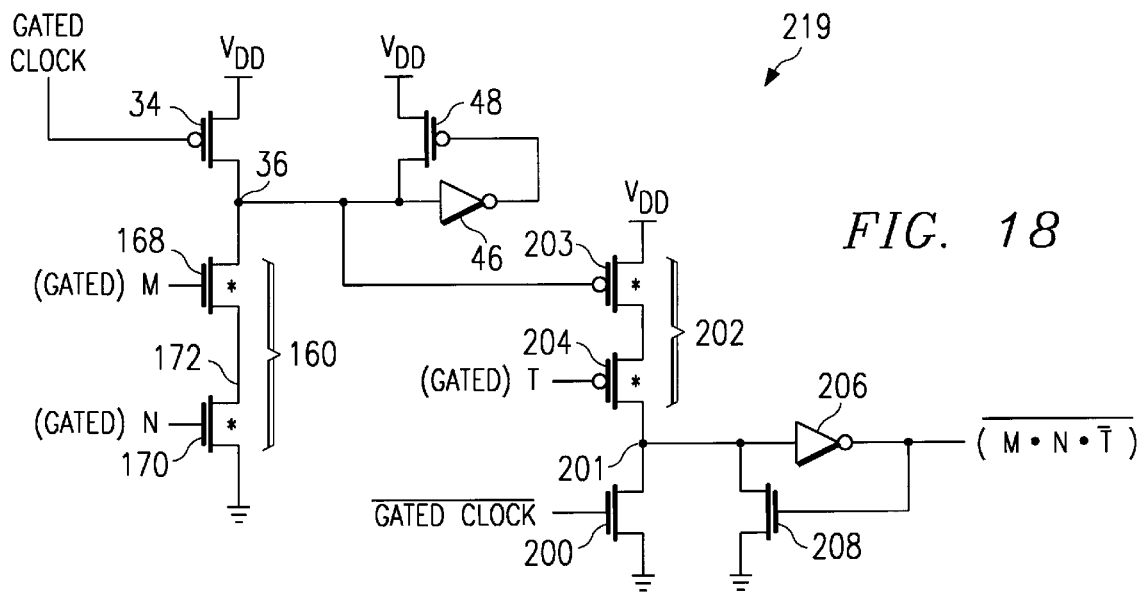
FIG. 18 illustrates a schematic of a dynamic zipper logic circuit, where each stage of the circuit includes a discharge path having a pair of cascode connected low threshold voltage transistors in its discharge path where each of those transistors is disabled during the precharge phase of operation.

FIG. 18 illustrates a schematic of a dynamic zipper logic circuit embodiment designated generally at 219, and which combines circuit 164 of FIG. 12 and circuit 199 of FIG. 16. As zipper logic and given this combination, note that circuit 219 includes a first dynamic logic circuit stage with discharge path transistors of a first conductivity type driving a second dynamic logic circuit stage with discharge path transistors of a second conductivity type. Although FIG. 18 combines FIGS. 12 and 16, note that the FIG. 12 overall circuit is connected such that precharge node 36 of circuit 164 provides a gated input to transistor 203 of circuit 199; in other words, in the case of zipper circuits, there is no inversion of the precharge node signal before it is connected as an input to the next stage within the circuit so as to ensure proper transitions of inputs to the latter stage(s). Moreover, note that transistors 168 and 170 are LVT with respect to certain other transistors of the same conductivity type in the signal path which are HVT. For example, inverter 46 is connected to precharge node 36 and, therefore, is considered within the signal path of the circuit (e.g., because it may be affected by the value at precharge node 36). Thus, n-channel transistors 168 and 170 may be considered LVT with respect to n-channel transistor 46b (not shown in FIG. 18; see FIG. 12) within inverter 46. Alternatively, note that inverter 206 is also in the signal path of the circuit in that it is in a successive stage which receives an input from the stage having transistors 168 and 170. Thus, n-channel transistors 168 and 170 may be considered LVT with respect to the n-channel transistor within inverter 206 as well (although not shown, inverter 206 is preferably constructed in the same manner as inverter 46, thereby including both an n-channel and p-channel transistor). Similarly, note that p-channel transistors 203 and 204 may be considered LVT with respect to certain other transistors of the same conductivity type in the signal path which are HVT. For example, both inverter 46 and inverter 206 are connected to the signal path in FIG. 18, and include HVT transistors of the same conductivity type (i.e., p-channel). Thus, p-channel transistors 203 and 204 may be considered LVT with respect to the p-channel transistor in either inverter 46 or inverter 206. Lastly, and as mentioned in the previous Section, note that it is stated above that the comparison of HVT versus LVT is made with respect to transistors of the same conductivity type because the magnitude of $V_T$ for an LVT p-channel transistor may differ from the magnitude of $V_T$ for an LVT n-channel transistor. Similarly, the magnitude of $V_T$ for an HVT p-channel transistor may differ from the magnitude of $V_T$ for an HVT n-channel transistor.

Given the above, one skilled in the art will appreciate that circuit 219 realizes the logic output equation of ((NOT M) OR (NOT N) OR T), or equivalently, NOT (M AND N AND T). Moreover, each stage of circuit 219 benefits in the manners set forth above. Particularly, when GATED CLOCK is low, both stages are in the precharge phase of operation and the non-enabled series connected LVT transistors limit leakage current in the discharge paths of each respective stage. Further, when GATED CLOCK is high, both stages are in the evaluate phase of operation and the LVT transistors improve operational speed of the successive stages as well.

From the above, one skilled in the art will appreciate that the embodiments of this Section demonstrate various circuits which benefit by including series-connected cascode transistors in the discharge path of a dynamic logic circuit, where it is known that at least two of those transistors are not enabled during the precharge phase of operation. While the above demonstrates various embodiments, still other embodiments may be produced. For example, as stated above, additional transistors known to be conducting during the precharge phase may be constructed as LVT transistors. As another example, the threshold voltages of the transistors of the dual rail circuit shown in FIG. 9 also may be considered and adjusted to benefit from the principles set forth herein. Still other examples will be ascertainable by a person skilled in the art.

3. Power Reduction Circuits, Systems, And Methods For Dynamic Logic Gates

From the preceding Sections, it is clear that including LVT transistors can significantly increase circuit speed, while maintaining low current leakage during the precharge phase of operation. However, note now that these LVT transistors, which are known to present higher leakage than comparable HVT transistors, may provide current leakage during the evaluate phase of operation. For example, recall from FIG. 1 that n-channel transistor 16 is off during the precharge phase of operation and, as a result, limits leakage current during that time. In contrast, however, n-channel transistor 16 is on during the evaluate phase of operation. Thus, if the logic realized by logic circuit 20 in FIG. 1 is false, then LVT transistors 22 and 24 will leak during that time. This example is likewise applicable to many of the remaining embodiments shown above such that nonconducting LVT transistors may leak during the evaluate phase of operation.

Given the above, the present inventor has invented additional embodiments which reduce the possibility of leakage current which may occur during the evaluate phase of operation. In one technique, it is recognized that by placing the entirety of a logic circuit in an idle state (i.e., configuring the circuit where each of its discharge paths are disabled over one or more clock periods), then there are no, or very few, parts of the circuit which can leak. In other words, in this instance no part of the circuit is in its evaluate phase and, therefore, the evaluate phase leakage noted immediately above does not occur. Note further that it is clearly a reasonable consideration to have periods where more than one phase of a multi-phase circuit are held in the precharge phase. For example, a floating point data pipeline in a microprocessor can be envisioned to be empty of data during clock cycles where there are no floating point instructions being executed. As another example, there may be a collection of logic gates and/or state machines which operate only at a given point, with the result then being either held or stored until needed at some other point. In another technique, separate clocks are used to control different phase circuits so each circuit may be placed concurrently in an extended precharge phase of operation. In yet another technique, feedback circuitry is used during regular operation to shorten the duration of the evaluate phase with respect to the duration of the precharge phase. In all events, therefore, these techniques and considerations may be addressed given the embodiments set forth below.

When placing more than one phase of a multi-phase circuit in precharge at the same time, various considerations arise. For example, if more than one phase of a multiphase circuit is in precharge, then the data produced by those stages in their immediately preceding evaluate operations must be preserved. One technique for storing data during normal operation is shown below in the prior art approach of FIGS. 19a–c, that is, by including extensive latching circuitry between phases. However, this technique by itself may not always be appropriate or desirable for additional reasons, a discussion of which follows the following details of the prior art approach.

Figure 19A:
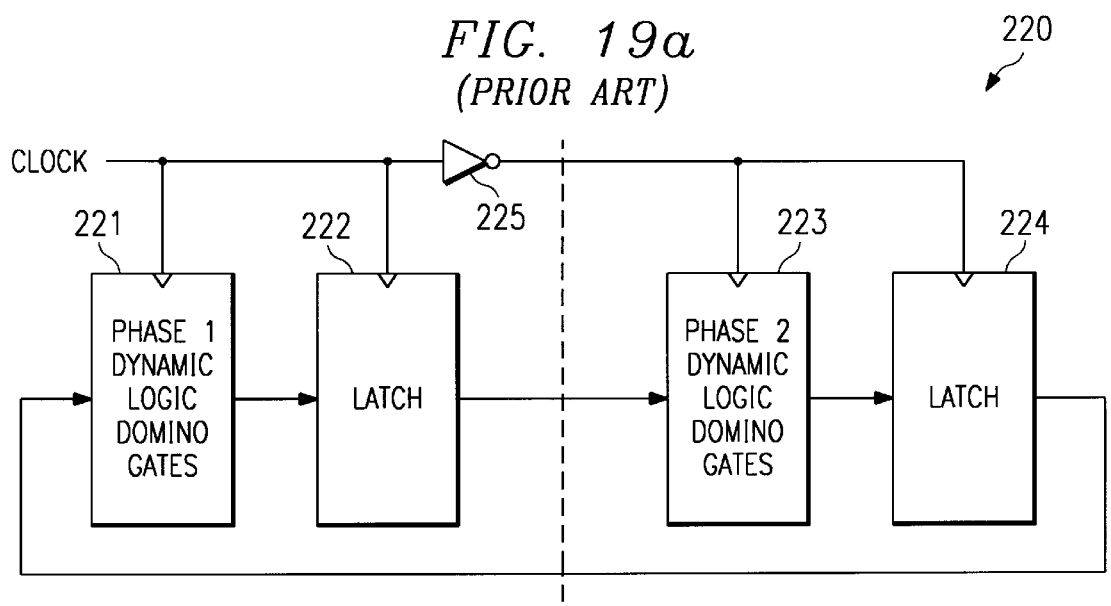
FIG. 19a illustrates a block diagram of a prior art multiphase circuit where a common clock is used to concurrently clock a first dynamic logic circuit in a precharge phase and a second dynamic logic circuit in an evaluate phase and then switch the circuits to operate in a complementary fashion such that the first dynamic logic circuit is in the evaluate phase while the second dynamic logic circuit is in the precharge phase.

FIG. 19a illustrates a block diagram of a prior art logic system designated generally at 220. System 220 is shown and described to better appreciate still additional embodiments detailed in FIGS. 20a through 22d, below. Turning then to FIG. 19a, note that system 220 includes circuitry for operating in two phases; thus, a vertical dashed line is shown at approximately the middle of the Figure so that generally circuitry on one side of the dashed line pertains to one phase while circuitry on the opposite side of the dashed line pertains to another phase. Specifically, system 220 includes on the left side of the dashed line a set of phase 1 dynamic logic domino gates 221 which output data to a latch 222. Latch 222 is a typical transparent latch structure which, while not illustrated, includes a first inverter having an output connected through a passgate to the input of a second inverter. With respect to the right side of the vertical dashed line in FIG. 19a, system 220 similarly includes a set of phase 2 dynamic logic domino gates 223 which output data to a latch 224 constructed in the same manner as latch 222. Lastly, note that a CLOCK signal is used on both sides of the vertical dashed line of FIG. 19b. Particularly, phase 1 gates 221 and latch 222 are clocked by the CLOCK signal, while the CLOCK signal is inverted by an inverter 225 and thus, phase 2 gates 223 and latch 224 are clocked by the complement of the CLOCK signal for reasons set forth in connection with FIG. 19c below.

Figure 19C:
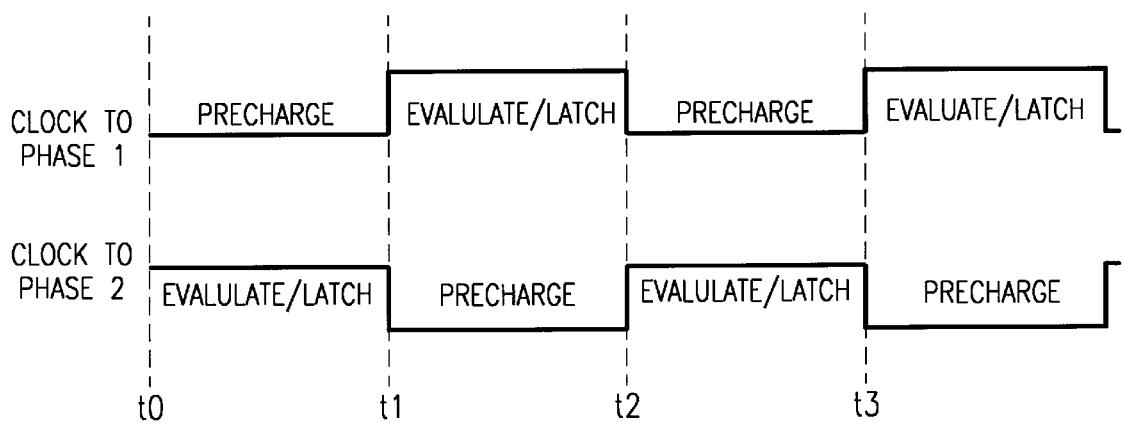
FIG. 19c illustrates a timing diagram of the operation of the prior art circuits of FIGS. 19a and 19b.
Figure 19B:
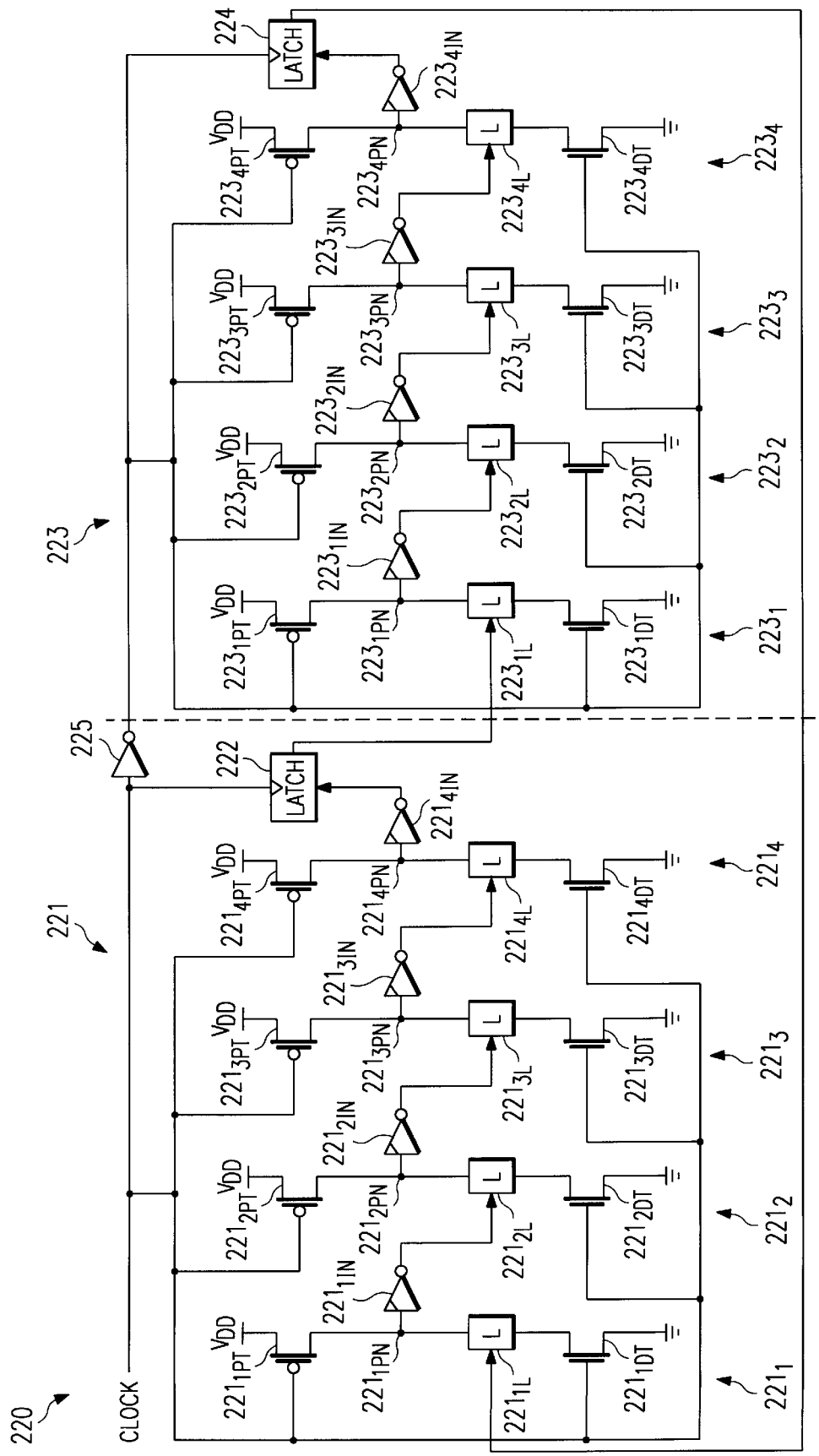
FIG. 19b illustrates a schematic of the prior art block diagram of FIG. 19a with particular emphasis on the transistor stages included within the phase circuits.

FIG. 19b illustrates system 220 of FIG. 19a, with greater emphasis on certain details of the phase 1 and 2 gates 221 and 223. Turning then to those details, for purposes of example each of gates 221 and 223 includes four stages with a continuous signal path between each set of four stages. In gate 221 the stages are consecutively numbered $221_1$ through $221_4$, so there is a first stage, a last stage, and various stages between the first and last stages. Similarly, in gate 223 the stages are consecutively numbered $223_1$ through $223_4$ with a first stage, a last stage, and various stages between the first and last stages. Note that gates 221 and 223 could include any number of stages, and one set of gates may have a differing number of stages than the other. However, four stages are shown for each phase in the present example simply by way of illustration.

Each stage of gates 221 and 223 includes certain components, including a precharge node, an output inverter, a precharge transistor, a logic circuit, and a discharge transistor. To simplify reference numerals, each of these items is labeled with a subscript which identifies the corresponding stage along with one or two letters which abbreviate the corresponding item. For example, with respect to stage $221_1$, its precharge node is $221_{1PN}$, its output inverter is $221_{1IN}$, its precharge transistor is $221_{1PT}$, its logic circuit is $221_{1L}$, and its discharge transistor is $221_{1DT}$. Considering now the connection and relationship of these items, note generally that each stage is a separate dynamic logic circuit which receives at least one input and, in response to the input signal(s), outputs a signal to one or more circuits. For each stage other than the last stage of each circuit, the output of the stage is connected to the input of a different dynamic logic circuit. For each stage which is a last stage of a circuit, the output of the stage is connected to the input of a latch. Thus, looking more closely to stage $221_1$ as an example, it receives the CLOCK signal, which connects as the GATED CLOCK signal does in certain earlier Figures, at the gate of a p-channel transistor which is the precharge transistor $221_{1PT}$. Precharge transistor $221_{1PT}$ has a source connected to a source of the system voltage level (e.g., $V_{DD}$) and a drain connected to a precharge node $221_{1PN}$. The CLOCK signal is also connected to the gate of an n-channel transistor which is the discharge transistor $221_{1DT}$, which has its source connected to a low reference voltage (e.g., ground) and its drain connected to a logic circuit $221_{1L}$. As in earlier Figures, logic circuit $221_{1L}$ and discharge transistor $221_{1DT}$ form a discharge path from precharge node $221_{1PN}$ to ground (or to some other potential differing from the potential stored at the precharge node during the precharge phase of operation). As demonstrated in earlier Sections, a logic circuit may include one or more serial paths through which a precharge node may be discharged, provided the corresponding discharge transistor (if one is included in the discharge path) is also conducting. Note further that an input to logic circuit $221_{1L}$ is received from latch 224 which, as readily appreciated from FIG. 19b, stores data output by stage $223_4$ of phase 2 gates 223. Still further, note that the output of stage $221_1$, as presented by inverter $221_{IN}$, is connected to the input of the logic circuit of the next successive stage (i.e., to logic circuit $221_{2L}$). Additionally, note that each inverter in FIG. 19b is shown as having a short diagonal line in the upper half of the inverter symbol. For purposes of this document, this symbol is included as a convention to demonstrate that a p-channel transistor (not expressly illustrated) is connected in a feedback manner from the output of the inverter to its input. More particularly, the gate of the feedback p-channel transistor is connected to the output of the corresponding inverter, the source of the feedback p-channel transistor is connected to $V_{DD}$, and the drain of the feedback p-channel transistor is connected to the input of the corresponding inverter. One skilled in the art will therefore appreciate that once the precharge voltage is no longer connected to a given precharge node in FIG. 19b (e.g., during the evaluate phase), the feedback p-channel transistor will maintain a high signal at the input of the inverter so long as the precharge node is not discharged by its corresponding logic circuit.

The operation of system 220 of FIGS. 19a and 19b is understood by the timing diagram of FIG. 19c which shows the CLOCK signal as applied to phase 1 and phase 2 gates 221 and 223, respectively, as well as the phase operation of those circuits in response to that CLOCK signal. Assume by a time t0 that system 220 is running at a steady-state. Between t0 and t1 the CLOCK signal is low. From FIG. 19b, therefore, one skilled in the art will appreciate that between t0 and t1 each stage of gates 221 is in the precharge phase. Consequently, each precharge node $221_{1PN}$ through $221_{4PN}$ is precharged, by the conduction of a corresponding precharge transistor $221_{1PT}$ through $221_{4PT}$, to $V_{DD}$. Moreover, recall that the complement of the CLOCK signal is connected to phase 2 gates 223. Thus, between t0 and t1, each stage of gates 223 is in the evaluate phase (i.e., the precharge transistor of each stage is off and the discharge transistor of each stage is enabled). Once in the evaluate phase, if each transistor (not shown) along a serial path within a given logic circuit $223_{1L}$ through $223_{4L}$ conducts, then the precharge node of that given stage is discharged and the logic state output by that stage changes state to an opposite logic level. At t1, the CLOCK signal transitions from low to high. As a result, phase 1 gates 221 begin their evaluate stage. At the same time, note also that a falling transition is applied to the clock input of latch 224; in response, latch 224 latches the value which was realized by gates 223 during the evaluate phase between t0 and t1. Thus, in FIG. 19c, phase 2 gates 223 are shown to both evaluate and latch at t1. From t1 to t2, the operation as stated above reverses. Thus, phase 1 gates 221 experience an evaluate and latch phase such that the data output by stage 221 is stored in latch 222 at t2. In the meantime, phase 2 gates 223 are precharged, so that each precharge node $223_{1PN}$ through $223_{4PN}$ are precharged to $V_{DD}$. From the remainder of the Figure after t2, one skilled in the art will appreciate the continuing complementary operation of each of the sets of gates. In addition, because of the data path, note also that data passes in a successive fashion between each set of gates, and then circulates from the end of the path back to the beginning after it is stored in latch 224. Lastly, because each set of gates operates during a phase as described above, from this point forward a set of gates such as this will be referred to as a phase circuit, so that FIG. 19b would include a first phase circuit including gates 221 and a second phase circuit including gates 223.

Before proceeding, note that the circuits within FIG. 19b illustrate only two circuits along a given path. In actuality, however, it is quite possible for a path to include more than two circuits. Additionally, it is also common that each circuit may be part of an overall network of circuits having multiple inputs and multiple outputs. In such a network, a first path may be formed through that network during a given time period where that first path includes various circuits, while a different path may be formed through that network during a different time period where that different path includes different circuits, which may or may not include the same circuits as the first path through the network. Lastly, note also that networking of circuits in this manner is well known in the art.

While the approach of FIGS. 19a through 19c is satisfactory in certain respects, the present inventor now appreciates various of its drawbacks. As one example, by using a single clock which directly clocks one phase and is complemented to drive another phase, it is necessarily required that each phase is in the evaluate operation during half of the period of the clock cycle. However, as stated above, it is desirable in certain instances to place more than one phase of a multiphase circuit in an idle state such that stages of at least two different phase circuits which are enabled during different clock phases are concurrently in the precharge phase of operation over at least one clock period, and this cannot occur using the single clock approach shown in FIGS. 19a and 19b. In addition, it is shown below that the added complexity required to produce latches between phase circuits may be avoided. Still further, it is shown that any stage within a phase circuit may be placed in a state where it is neither precharging or evaluating (i.e., neither its precharge transistor or its discharge path is conducting) and that state permits the stage to store data until normal operations are resumed. Thus, the following embodiments demonstrate these principles, overcome these limitations, and provide additional benefits as detailed and more easily appreciated from the following discussion.

Figure 20A:
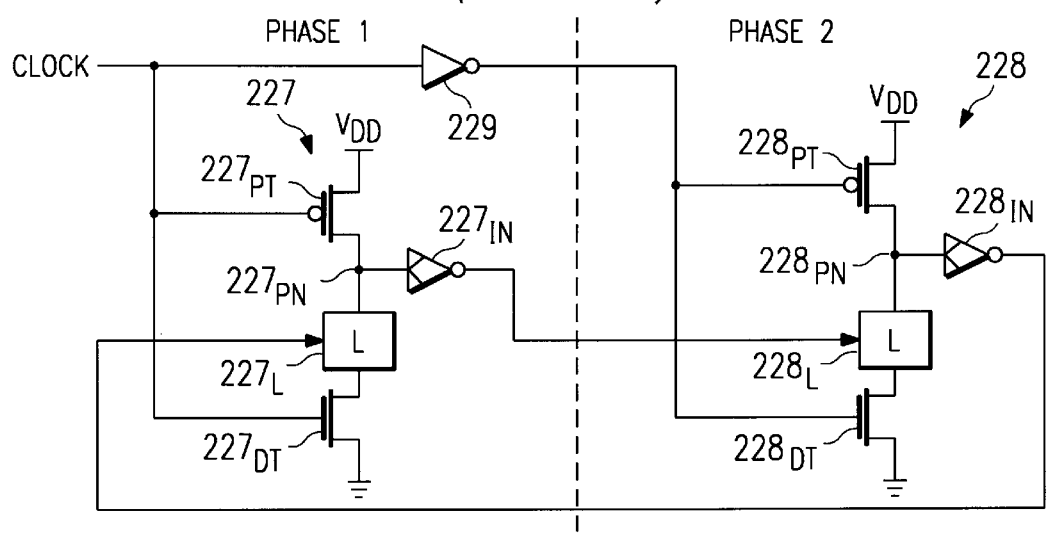
FIG. 20a illustrates a schematic of a prior art hold time latch circuit providing output data for a hold time beyond the evaluate phase and without complicated latching structures between phase circuits.

FIG. 20a illustrates a schematic of a prior art logic circuit embodiment system designated generally at 226, and which in the art is sometimes referred to as a hold time latch. Like system 220 of FIGS. 19a–b, system 226 includes phase circuitry operating in different phases and, therefore, a vertical dashed line generally separates those phase circuits. Turning then to the left of the dashed line, a first phase circuit 227 includes a dynamic logic circuit stage, which includes a precharge transistor $227_{PT}$, a precharge node $227_{PN}$, an output inverter $227_{IN}$, and a discharge path including a logic circuit $227_L$ and a discharge transistor $227_{DT}$. To the right side of the dashed line of FIG. 20a is a second phase circuit 228 which includes a dynamic logic stage, and which is similarly connected to include a precharge transistor $228_{PT}$, a precharge node $228_{PN}$, an output inverter $228_{IN}$, and a discharge path including a logic circuit $228_L$ and an discharge transistor $228_{DT}$. Still further, system 226 includes a CLOCK signal which is connected directly to the gates of precharge transistor $227_{PT}$ and discharge transistor $227_{DT}$, and which is inverted by an inverter 229 so that its complement is connected to precharge transistor $228_{PT}$ and discharge transistor $228_{DT}$. Lastly, and like system 220 of FIGS. 19a–b, system 226 is also connected in a circulating fashion to demonstrate an example of a small portion of a larger circulating logic network.

Figure 20B:
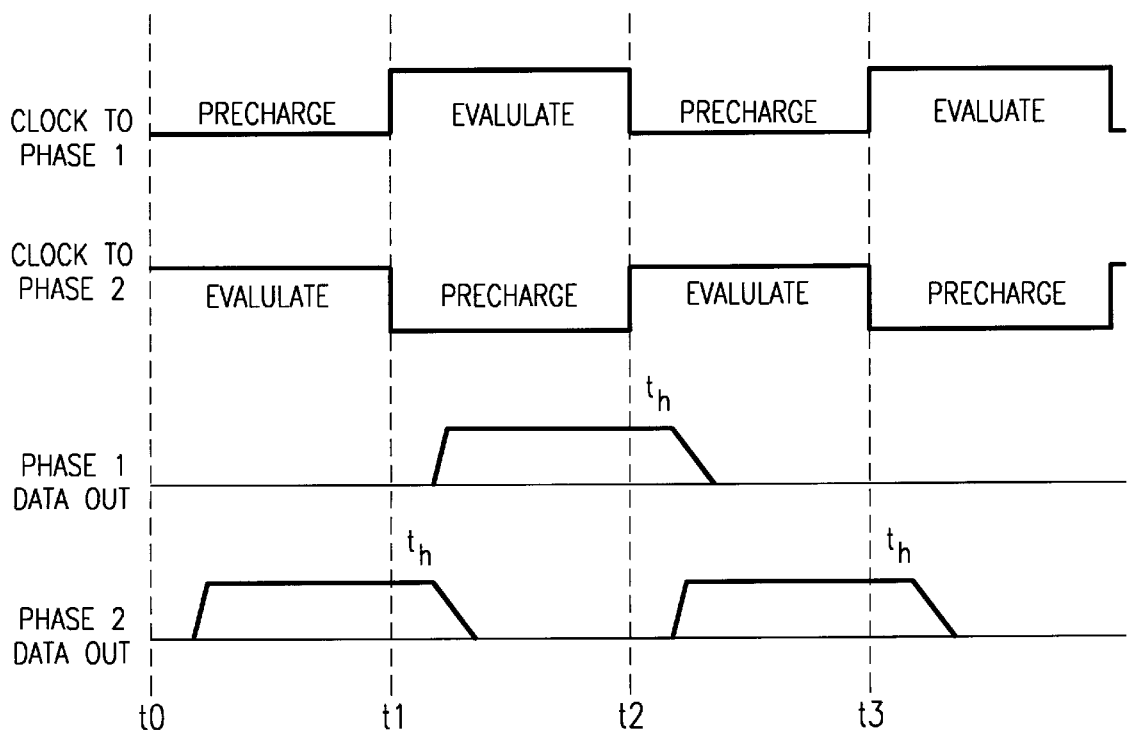

The operation of system 226 is understood with reference to the timing diagram of FIG. 20b. Before studying that Figure, however, note that system 226, and in contrast to system 220 of FIGS. 19a–b, does not include separate complex latch structures at the output of each stage; the ability for system 226 to operate despite this lack of additional structure is now explained in connection with FIG. 20b. Turning then to FIG. 20b, its first two rows show the state of the CLOCK signal as applied to phase 1 circuit 227 and phase 2 circuit 228 of system 226, respectively. The second two rows of FIG. 20b depict the data values output by phase 1 circuit 227 and phase 2 circuit 228, respectively. Assume by a time t0 that system 226 is running at a steady-state. Between t0 and t1, the CLOCK signal is low.

As a result, phase 1 circuit 227 is in a precharge phase of operation while phase 2 circuit 228 is in an evaluate phase of operation. At t1, the clock signal to both phase circuits 227 and 228 transitions to an opposite level. Thus, at t1, phase 2 circuit 228 has finished its evaluation phase of operation and, therefore, valid data exists at the output of inverter $228_{IN}$. Immediately after t1, however, the signal at the gate of p-channel precharge transistor $228_{PT}$ transitions from high to low. Note, therefore, that p-channel precharge transistor $228_{PT}$ begins to conduct and the voltage at precharge node $228_{PN}$ begins to rise (assuming it was discharged in the immediately preceding evaluate phase). However, due to the delay in response time of the p-channel precharge transistor $228_{PT}$, some amount of time passes before precharge node $228_{PN}$ precharges from low to its full high level. As a result, a corresponding amount of time after t1, and indicated as $t_h$ on FIG. 20b, passes before the output of phase 2 circuit 228 (i.e., the output of inverter $228_{IN}$) transitions from high to low due to the precharge effect. In other words, the data output by phase 2 circuit 228 is held (i.e. remains valid) for some short period or "hold time," denoted as $t_h$, even though the clock signal connected to that circuit has now switched to cause its stage(s) to change from the evaluate phase of operation to the precharge phase of operation.

In addition to the holding of data by circuit 228 as described above, note further that during $t_h$ the phase 1 circuit 227 is in its evaluate phase of operation. Thus, it makes its evaluation based on the data which is still output from phase 2 circuit 228 during $t_h$. Consequently, the successive circuit 227 makes an evaluation based on data from the preceding circuit 228, but without the requirement of additional latches as needed in the prior art system discussed in connection with FIGS. 19a–c. Still further, one skilled in the art will appreciate from the remainder of FIG. 20b that this concept continues to apply as data continues in a circular fashion between the two phase circuits of FIG. 20a. Moreover, this same aspect would further apply if system 226 included additional successive circuits clocked to precharge at different times, or if each phase circuit included more than one dynamic logic stage connected to the clock of that phase circuit. Additionally, note also that FIG. 20a is simplified to show only two successive circuits in circulating fashion; in actuality, for the circuit to start up properly, at least one input to the circuit must come from a source which is not precharged to a disabling level (e.g., logic 0). Otherwise, the data within the circuit would always remain at a disabling level because, given the simplified structure as shown, there could not be a discharge of any precharge node and, thus, a logic 0 would circulate around the circuit. Thus, when not simplified, one or more of the circuits within FIG. 20a are actually a portion of a larger circuit which may be mixed with latched inputs to one or more of the phase circuits.

In addition to the above, note that each inverter in FIG. 20a is shown as having a short diagonal line in both the upper and lower halves of the inverter symbol. The upper diagonal line is used in the same manner as above, that is, to demonstrate the existence of a feedback p-channel transistor connected from the corresponding inverter output back to the input of that same inverter. Also and for purposes of this document, the lower diagonal line is used in a similar fashion, but to indicate a feedback n-channel transistor connected from the output back to the input of the corresponding inverter. The feedback n-channel transistor has its gate connected to the output of the inverter, its source connected to ground, and its drain connected to the input of the inverter. Thus, for each inverter in FIG. 20a, the inverter has both a p-channel and n-channel feedback transistor connected to each of inverters $227_{IN}$ and $228_{IN}$. Given that each of these inverters may be used to temporarily output data after the corresponding stage has commenced its next precharge phase, the use of these two feedback transistors further ensures this data will remain at the output of the inverter after the $t_h$ time period.

Figure 23:
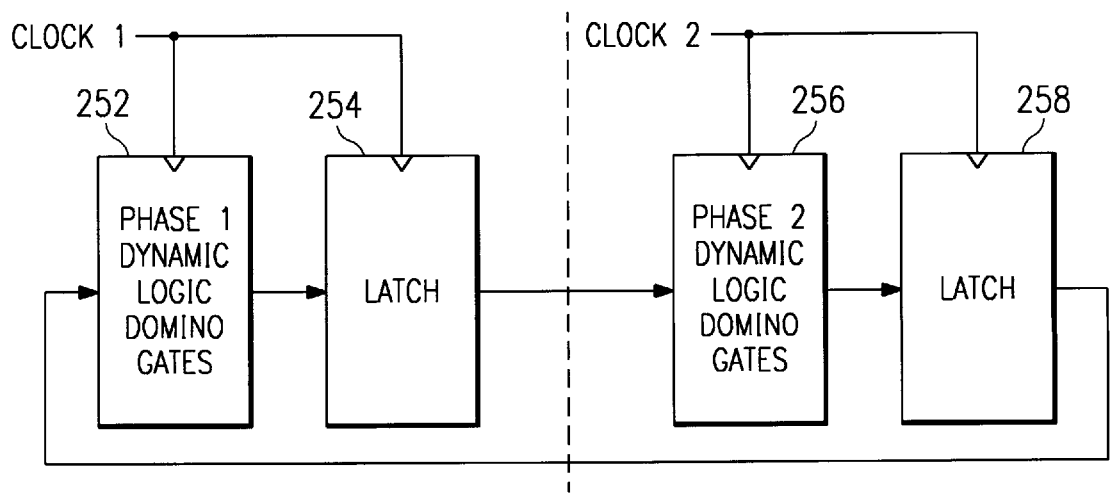
FIG. 23 illustrates a circuit with separate clock for independently clocking separate phase circuits.

The embodiments of FIG. 20a and described in connection with the timing diagram of FIG. 20b demonstrate that complicated latches are not necessarily required when connecting successive phases of dynamic logic circuitry. However, recall from above that the present inventor has recognized various instances (e.g., when using LVT transistors in the discharge paths of dynamic logic gates) where it is desirable to place stages in successive dynamic logic circuits into the precharge phase at the same time so as to minimize leakage which would otherwise occur during the evaluate phase of operation. While the embodiments of FIG. 20a eliminate complicated latching structure, they cannot both be placed in the precharge phase because they share a common clock signal. However, even if separate clocks are used (such as shown in the embodiment of FIG. 23, below), if both stages in FIG. 20a were placed in precharge at the same time and for a time longer than $t_h$, the data stored by that circuit would be lost. The present inventor, therefore, provides below yet additional embodiments which satisfy the goals set forth above without requiring absolute use of the prior art configurations shown in FIGS. 19a–b and 20a.

Figure 21A:
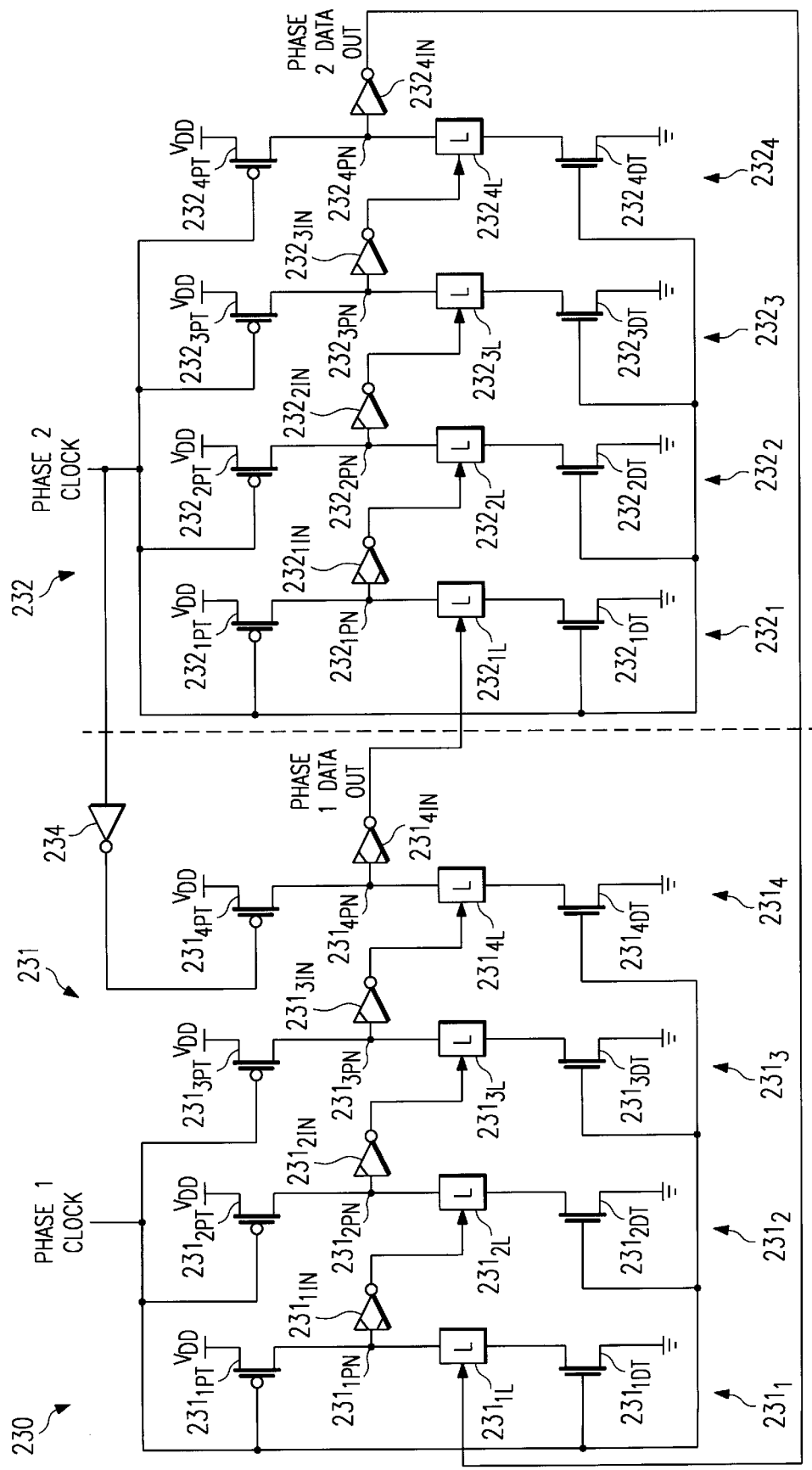
FIG. 21a illustrates a schematic of a multiphase embodiment wherein the last stage of one phase circuit stores data during an extended precharge period and without complicated latching structures between phase circuits.

FIG. 21a illustrates a schematic of a logic circuit system designated generally at 230. As in the manner introduced above, system 230 includes circuitry for operating in two phases of operation, with a phase 1 circuit indicated generally at 231 and a phase 2 circuit indicated generally at 232. Again, each phase circuit includes one or more stages. In the current example, each circuit includes a first and last stage, and additional stages along the signal path between the first and last stage so that each circuit includes four total stages. Further, the stage and subscript numbering format introduced by FIG. 19b is carried forward to FIG. 21a, so that each stage within a given phase circuit is consecutively numbered, and so that each item within a given stage is designated with a number and subscript according to the stage as well as the item. For example, the first stage in phase 1 circuit 231 is labeled $231_1$, with a precharge node $231_{1PN}$, a precharge transistor $231_{1PT}$, an output inverter $231_{1IN}$, and a discharge path having a logic circuit $231_{1L}$ and a discharge transistor $231_{1DT}$. As another example, the first stage in phase 2 circuit 232 is labeled $232_1$, with a precharge node $232_{1PN}$, a precharge transistor $232_{1PT}$, an output inverter $232_{1IN}$, and a discharge path having a logic circuit $232_{1L}$ and a discharge transistor $232_{1DT}$. Note that system 230 includes separate clock signals. In general, phase 1 circuit 231 is clocked by a PHASE 1 CLOCK while phase 2 circuit 232 is clocked by a PHASE 2 CLOCK. Importantly, and for reasons set forth below when discussing FIG. 21b, the PHASE 2 CLOCK is also connected to the input of an inverter 234, with the output of inverter 234 connected to the gate of p-channel precharge transistor $231_{4PT}$ of the last stage in phase 1 circuit 231.

Figure 21B:
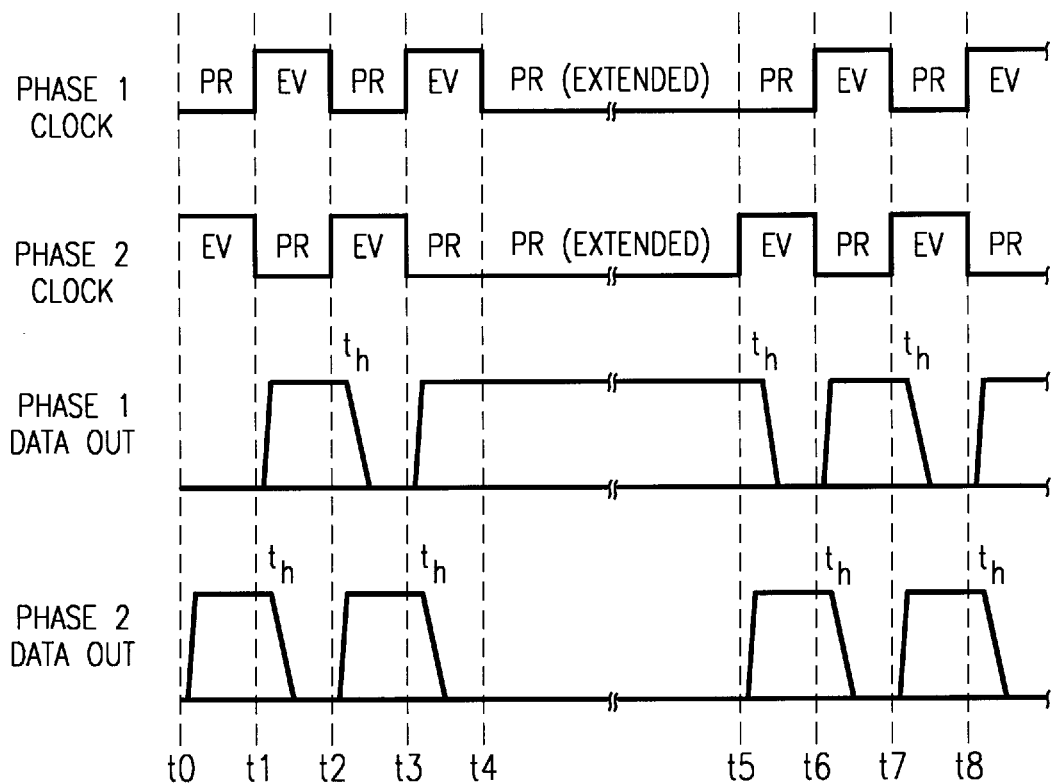

FIG. 21b illustrates a timing diagram to explain the operation of system 230 of FIG. 21a. The first two rows of FIG. 21b depict the levels of the PHASE 1 and PHASE 2 CLOCK signals, respectively. The last two rows of FIG. 21b depict the periods of valid data output by phase 1 circuit 231 and phase 2 circuit 232, respectively (i.e., as output by the last stage in each phase circuit). Looking now at those waveforms, assume that immediately following time t0 that system 230 is running at a steady-state. Between t0 and t1, the PHASE 1 CLOCK signal is low while the PHASE 2 CLOCK signal is high. From FIG. 21a, therefore, between t0 and t1 each stage of circuit 231 is in the precharge phase (abbreviated "PR" in FIG. 21b). In contrast to the prior art described above, however, note the following aspects between to and t1. First, two separate clock signals are preferably used to control the multiple phases of operation. Second, although those clocks may be considered complementary in general, this is not always the case as discussed below. Given the separate clocks, note the effect of each. The first three stages of circuit 231 are in the precharge phase in response to the PHASE 1 CLOCK signal being low. However, the last stage of circuit 231 (i.e., the fourth stage $231_4$) is in the precharge phase in response to the PHASE 2 CLOCK signal being high, with that high signal being inverted and then connected to the gate of p-channel precharge transistor $231_{4PT}$. The significance of this latter operation and connection is more readily apparent at t4 discussed below when system 230 is switched such that both CLOCK signals are low. Continuing with the time between to and t1, phase 2 circuit 232 is in the evaluate phase of operation (abbreviated "EV" in FIG. 21b). Thus, at some point slightly after t0, data propagates through each stage of phase 2 circuit 232 and valid data is output by the last stage of phase 2 circuit 232 as shown in the fourth row of FIG. 21b. Lastly, and as in the case introduced in FIGS. 20a and 20b above, note that phase 2 circuit 232 continues to hold valid data at its output for a short hold time, denoted $t_h$, even after it completes its evaluation phase at t1.

At t1, the PHASE 1 CLOCK signal transitions from low-to-high while the PHASE 2 CLOCK signal transitions from high-to-low. Consequently, phase 1 circuit 231 begins its evaluation phase of operation and some time shortly after t1 outputs valid data as shown in the third row of FIG. 21b. Note here that the first three stages of phase 1 circuit 231 are in the evaluate phase in response to the PHASE 1 CLOCK signal being high and connected to both the precharge transistor and discharge transistor for each of those stages. In contrast, stage $231_4$ of phase 1 circuit 231 is in the evaluate phase in response to the PHASE 2 CLOCK signal being low, with that low signal being inverted and then connected to the gate of p-channel precharge transistor $231_{4PT}$ as well as in response to the PHASE 1 CLOCK signal being high, with that high signal connected to the gate of n-channel discharge transistor $231_{4DT}$. Note also that this evaluation phase of phase 1 circuit 231 is triggered by the data held at the output of phase 2 circuit 232 during the hold time, $t_h$, immediately following t1. Also at t1, phase 2 circuit 232 is switched to its precharge phase of operation. Thus, after the hold time $t_h$, the output data of phase 2 circuit 232 may change once precharge node $231_{4PN}$ of stage $232_4$ is precharged high enough to cause a transition in the output of inverter $232_{4IN}$.

The above complementary operation of phase circuits 231 and 232 continues until t4. At t4, however, it is desirable to place system 228 in what has been earlier referred to as an idle state such that as many stages as possible of both phase circuits 231 and 232 are in the precharge phase of operation for at least one clock period (i.e., the combined duration of a precharge phase and an evaluate phase) and also so that no precharge node may be discharged during that state. By doing so, current leakage which might occur during the evaluate phase of operation is avoided. Thus, note that at t4 the PHASE 2 CLOCK signal remains low, and the PHASE 1 CLOCK signal transitions from high to low. Consequently, from t4 to t5, all but one stage in phase 1 circuit 231 and all stages in phase 2 circuit 232 are in the precharge phase of operation as demonstrated below, and this state is shown and labeled as an extended precharge phase between t4 and t5 on the first two rows of FIG. 21b. With respect to the one stage in phase 1 circuit 231 which is not in the precharge phase during this time, recall from above that it was stated that it is desirable, if not mandatory, to retain the data state of the circuit once stages of more than one of its multiple phases are held in the precharge phase. At this point, therefore, one skilled in the art will appreciate that the inverted clock coupling of the PHASE 2 CLOCK signal to stage $231_4$ accomplishes this goal. Specifically, at t4, recall that the PHASE 1 CLOCK signal transitions from high-to-low. If this signal were connected to the gate of p-channel precharge transistor $231_{4PT}$ (as it is to the gates of p-channel precharge transistors $231_{1PT}$, $231_{2PT}$, and $231_{3PT}$), then at t4 or some time shortly thereafter the data output from inverter $231_{4IN}$ would be overwritten as precharge node $231_{4PN}$ rose toward $V_{DD}$. However, instead of this connection, recall that the gate of p-channel precharge transistor $231_{4PT}$ is connected to the complement of the PHASE 2 CLOCK signal. At t4, therefore, the PHASE 2 CLOCK signal is low as it has been since t3. Consequently, its complement is high and so p-channel precharge transistor $231_{4PT}$ was turned off at t3 and remains off after t4. Therefore, by t4, both the precharge transistor and discharge transistor of stage $231_4$ are not conducting. Since precharge transistor $231_{4PT}$ is not conducting, the data output by inverter $231_{4IN}$ cannot be changed by a precharge operation. Additionally, since discharge transistor $231_{4DT}$ is concurrently not conducting, the data output by inverter $231_{4IN}$ cannot be changed (i.e., discharged) by an evaluate operation. Consequently, the data output from inverter $231_{4IN}$ is maintained after t4, as shown in the third row of FIG. 21b. Lastly, because stage $231_4$ stores data in this fashion, it is hereafter referred to as a data storing stage (as are other stages which store data in a similar manner). Note, therefore, that the data storing stage retains the data for at least the time between t4 and t5, and that this extended time is necessarily equal to or greater than the combined duration of a precharge phase and an evaluate phase for any of the circuit stages.

Having shown operation of system 230 in the instance (i.e., the idle state) of bringing all but one stage of the entire circuit to a precharge phase of operation and having that one stage store data over at least one clock period, the remainder of FIG. 21b demonstrates the re-starting of the circuit to its typical complementary precharge/evaluate operation in a manner to maintain valid data output. At t5, the PHASE 2 CLOCK signal transitions from low-to-high. As a result, while stages $231_1$, $231_2$, and $231_3$ of phase 1 circuit 231 remain in the precharge phase of operation and data storing stage $231_4$ stage stores data, phase 2 circuit 232 begins its evaluation phase. As a result, stage $232_1$ may evaluate based on the data held during precharge by stage $231_4$. Indeed, note that this operation is ensured because the stage (i.e. stage $232_1$) immediately following the data storing stage (i.e., stage $231_4$) is switched to its evaluate stage before the data from the data storing stage is overwritten. Continuing with FIG. 21b, at some time shortly after t5 the remaining stages within phase 2 circuit 232 evaluate and valid output data is presented by inverter $232_{4IN}$ as data from phase 2 circuit 232. At t6, the PHASE 1 CLOCK and PHASE 2 CLOCK signals switch, with operation from this point forward continuing as in the manner described above before system 228 was placed in the extended precharge phase of operation.

In addition to the above, note that each inverter in FIG. 21a is connected to a p-channel feedback transistor, and some of those inverters (i.e., inverters $231_{1IN}$, $231_{4IN}$, and $232_{1IN}$) are further connected to an n-channel feedback transistor as well. For each transistor, the p-channel transistor maintains a low output from the corresponding inverter after the precharge voltage, $V_{DD}$, is no longer connected to the corresponding precharge node but before the precharge node is discharged (if it is discharged at all during a given evaluate period). With respect to inverters $231_{1IN}$ and $232_{1IN}$, each is also connected to an n-channel feedback transistor because the stages corresponding to those inverters receives an input from a hold time latch which, therefore, may present valid input data for only a short period of time; in such an event, if this short-period data discharges the precharge node for that stage, the n-channel feedback transistor will maintain the high output of the inverter until the next precharge phase. With respect to inverter $231_{4IN}$, recall that it corresponds to a stage which is a data storing stage. Further, during the idle state, the data storing stage is neither precharging nor discharging and, therefore, without further intervention the voltage at the precharge node $231_{4PN}$ could float. To avoid any erroneous data, however, the inclusion of both p-channel and n-channel feedback transistors maintains the voltage at the precharge node during this idle state.

Given the above, one skilled in the art will appreciate various benefits of system 230 and further will appreciate that it may be modified without departing from the inventive scope. For example, the entire system other than a data storing stage may be brought to a precharge phase of operation. Thus, if the system is one in which the evaluation period should be reduced or temporarily limited, such as in the case of certain LVT embodiments described above, then system 230 accomplishes this feat while storing the data state of the circuit. In other words, no stage within system 230 may discharge during this period and, therefore, the risk of current leakage along each discharge path is reduced if not eliminated assuming the principles of Sections 1 and/or 2 are used within the discharge paths of those stages. As another example, the resources otherwise necessary for additional complex latch structures are not necessary. As another example, while the system is shown as circulating and with a given number of stages in each phase circuit, it may be used in other successive dynamic logic circuits without data circulation from the last circuit back to the first circuit, and without a common number of stages within each circuit. As another example, the various stages may be constructed using differing types of dynamic logic circuits, such as those demonstrated by the numerous examples in Sections 1 and 2, above. As yet another example, as mentioned above each circuit need only have at least one stage, and each circuit may be part of a larger network of circuits having different paths through the network at any one time. As still another example, note that system 230 operates such that stage $231_4$ is the data storing stage. However, as an alternative, the PHASE 1 CLOCK signal could be coupled through an inverter to the gate of precharge transistor $232_{4PT}$ of stage $232_4$ (rather than connecting that gate to the PHASE 2 CLOCK). In that instance, stage $232_4$ also could operate as a storage stage by beginning the extended precharge phase immediately after the PHASE 2 CLOCK signal fell to the precharge level. Indeed, note that this alternative connection to stage $232_4$ could be made while the connection to stage $231_4$ remained as shown in FIG. 21a, thereby allowing the option for either stage $232_4$ or $231_4$ to store data during the extended precharge phase, with the choice dictated by way of whichever clock signal last passed through the evaluate phase immediately before the extended precharge phase. As yet another example, recall in Sections 1 and 2 that is discussed where a discharge transistor may be eliminated from a dynamic logic circuit where it is known that such a circuit will not otherwise discharge during the precharge phase of operation; therefore, this principle also may be applied to the embodiments of this Section 3 as well by eliminating transistors $231_{2DT}$ through $231_{4DT}$ and transistors $232_{2DT}$ through $232_{4\ DT}$. As a final example, and as demonstrated by way of example in other following embodiments, the present embodiments also permit any stage within a given phase circuit to be the data storing stage while placing the remainder of the system into an extended precharge phase of operation. This aspect may prove quite useful in circuit design where often after numerous design iterations it is preferable to store data in a stage located before a latch which is connected to the last stage of a phase circuit, but where it has until now been impossible to do so without considerable additional effort and/or hardware. Lastly, while only two phases are shown, the embodiments herein may be modified to accommodate three or more phases as well.

Figure 22A:
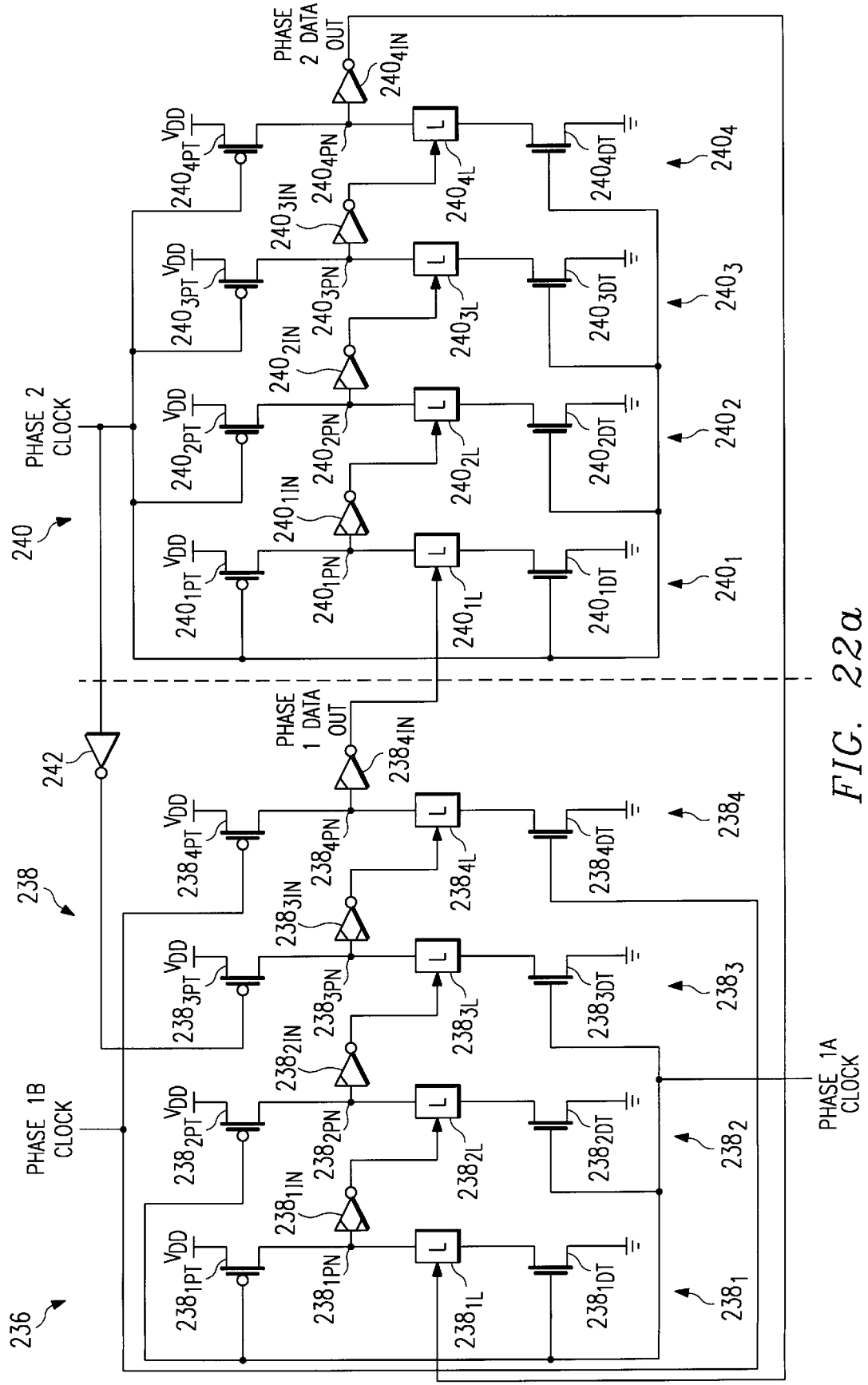
FIG. 22a illustrates a schematic of a multiphase embodiment wherein a stage other than the last stage of a phase circuit stores data during an extended precharge period and without complicated latching structures between phase circuits.

FIG. 22a illustrates a schematic of a logic circuit system designated generally at 236. System 236 in many respects resembles system 230 of FIG. 21a but, as detailed below, system 236 demonstrates a multiphase circuit where the data state is stored in a stage other than the last stage of a phase circuit when the remainder of the multiphase circuit is placed in the precharge phase for an extended time. Specifically, in the example of FIG. 22a, the third stage of circuit 238 (i.e., stage $238_3$) acts as the data storing stage when the remainder of the multiphase circuit is placed in the precharge phase for an extended time. Turning then to the details of system 236, it includes a phase 1 circuit 238 and a phase 2 circuit 240. Again, the prior numbering format is used to identify each stage within a given phase circuit using consecutive numbering, and so that each item within a given stage is numbered according to the stage as well as the item. For example, the first stage in phase 1 circuit 238 is labeled $238_1$, with a precharge node $238_{1PN}$, a precharge transistor $238_{1PT}$, an output inverter $238_{1IN}$, and a discharge path having a logic circuit $238_{1L}$ and a discharge transistor $238_{1DT}$. System 238 includes three separate clock signals: (1) a PHASE 1A CLOCK signal; (2) a PHASE 1B CLOCK signal; and (3) a PHASE 2 CLOCK signal. With one exception discussed below, phase 1 circuit 238 is clocked by the PHASE 1A and PHASE 1B CLOCK while phase 2 circuit 240 is clocked by the PHASE 2 CLOCK. A more detailed analysis of the clocking by these signals follows immediately below.

The use of three different clock signals in system 236 permits placing all but one stage of the system in the precharge phase of operation for an extended time, storing the data at that time in a data storing stage which is not the last stage in a phase circuit, and re-starting the circuit to its evaluate and precharge operational steps by using the data as stored during the extended precharge phase of operation. Toward this end, note the following connections of the clock signals in FIG. 22a. Recall that in system 230 of FIG. 21a, the clock signal used to clock the gate of each precharge transistor is also connected to the gate of the corresponding discharge transistor for each non-storing stage.

In contrast, however, in system 236 the precharge and discharge transistors of each non-storing stage are connected to a different clock depending on whether they are before or after the data storing stage along the signal path through a phase circuit. For example, the PHASE 1A CLOCK is connected to the gate of each precharge and discharge transistor in phase 1 circuit 238 before the data storing stage. Specifically, the PHASE 1A CLOCK is connected to the gate of precharge transistors $238_{1PT}$ and $238_{2PT}$, as well as to the gate of discharge transistors $238_{1DT}$ and $238_{2DT}$. As another example, the PHASE 1B CLOCK signal is connected to the gate of each precharge and discharge transistor in phase 1 circuit 238 following the data storing stage. Specifically, the PHASE 1B CLOCK signal is connected to the gate of p-channel precharge transistor $238_{4PT}$ and to the gate of n-channel discharge transistor $238_{4DT}$. Additionally, note the connection of clock signals with respect to the data storing stage. First, the discharge transistor of the data storing stage is connected to the same clock as the stages within the same phase circuit and preceding the data storing stage; thus, the gate of discharge transistor $238_{3DT}$ is connected to the PHASE 1A CLOCK. Second, and like the FIG. 21a embodiment, the precharge transistor of the data storing stage is connected to an inversion of the clock which clocks a complementary phase circuit; thus, the gate of precharge transistor $238_{3PT}$ is connected to the complement of the PHASE 2 CLOCK where that signal comes from an inverter 242 having its input connected to receive the PHASE 2 CLOCK. Lastly, with respect to phase 2 circuit 240, the gates of each of its precharge and discharge transistors are connected to the PHASE 2 CLOCK.

Figure 22B:
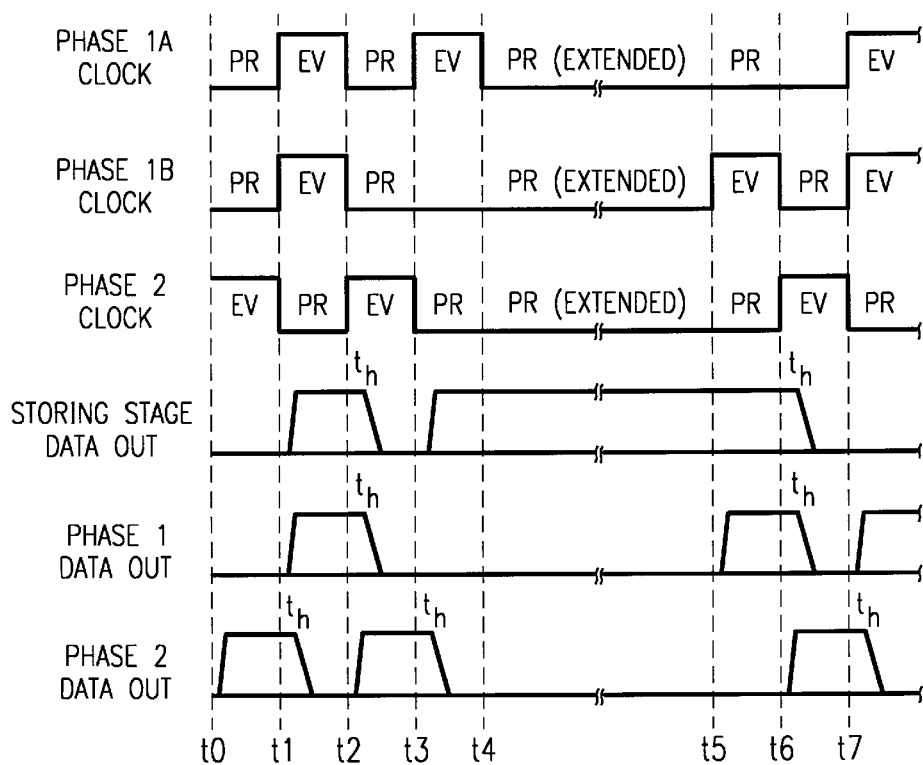

FIG. 22b illustrates a timing diagram to explain the operation of system 236 of FIG. 22a. The first three rows of FIG. 21b depict the levels of the PHASE1A CLOCK, the PHASE 1B CLOCK, and the PHASE 2 CLOCK signals, respectively. The last three rows of FIG. 22b depict, respectively, the periods of valid data output by the data storing stage of phase 1 circuit 238, the final stage of phase circuit 238 which represents the ultimate data output by phase 1 circuit 238, and final stage of phase circuit 240 which represents the ultimate data output phase 2 circuit 240. Looking now at these waveforms, assume that immediately following time to that system 236 is running at a steady-state. Moreover, after t0 note that at times other than just before or just after the extended precharge period that the PHASE 1A and PHASE 1B CLOCK signals are identical. Thus, between t0 and t1 the PHASE 1A and PHASE 1B CLOCK signals are low while the PHASE 2 CLOCK signal is high. Therefore, between t0 and t1 each stage of phase 1 circuit 238 is in the precharge phase while each stage of phase 2 circuit 240 is in the evaluate phase.

With respect to the precharge operation of phase 1 circuit 238, note that the phase control to each stage depends on whether the stage is located along the signal path before the data storing stage, is the data storing stage, or is located along the signal path after the data storing stage. For each non-storing stage before the data storing stage, it is in the precharge phase in response to the PHASE 1A CLOCK at both its precharge and discharge transistors. For the data storing stage, it is in the precharge phase in response to the complement of the PHASE 2 CLOCK at its precharge transistor and the PHASE 1A CLOCK at its discharge transistor. For each non-storing stage after the data storing stage, it is in the precharge phase in response to the PHASE 1B CLOCK at both its precharge transistor and at its discharge transistor. In all events, therefore, between t0 and t1 the data storing stage of phase 1 circuit 238 and the other stages of phase 1 circuit are precharged. Thus, no data is output during that period as shown in the fourth and fifth rows of FIG. 22b.

With respect to the evaluate operation of phase 2 circuit 240 between t0 and t1, it operates in the same manner as phase 2 circuit 232 of FIG. 21a. Particularly, the precharge and discharge transistor of each stage is connected to the same clock signal (i.e., PHASE 2 CLOCK) which is high. Thus, based on the inputs to the respective logic circuit of each stage, the voltage at each corresponding precharge node either remains the same or discharges to a different level, thereby representing a transition in the data output by phase 2 circuit 240. Consequently, the last row in FIG. 22b indicates a possible data change just after to. In addition, note that this data continues to t1 and extends a short hold time, $t_h$, after t1 as in the manner described above.

The operation described immediately above continues in complementary fashion from t1 through t3, that is, one phase circuit evaluates while another precharges, and vice versa. At t3, however, the clock signals of FIG. 22b discontinue the otherwise described pattern to commence the process of shutting down the circuit to an extended period of precharge time (between t4 and t5). Specifically, at t3, note that the PHASE 1A CLOCK does not match the PHASE 1B CLOCK, but instead the former once again rises while the latter remains low. As a result, each stage of phase 1 circuit 238 up to and including the data storing stage evaluates, while each stage after the storage stage does not evaluate. In the example of FIG. 22a, therefore, stages 238$_1$, 238$_2$, and 238$_3$ evaluate while stage 238$_4$ does not. This result is reflected in FIG. 22b as the fourth row shows valid data shortly after t3 while the fifth row does not. Lastly, note also that at t3 the PHASE 2 CLOCK transitions to a precharge level and, therefore, after a hold time, $t_h$, the data in phase 2 circuit 240 is overwritten as each stage within that circuit is precharged to output a low level.

At t4, only the PHASE 1A CLOCK transitions, and that transition is to a precharge level. Thus, between t4 and t5, there is an extended precharge period where all stages other than the data storing stage of system 236 operate in the precharge phase. From FIG. 22b, note during this extended time that the data storing stage 238$_3$ continues to output (i.e., store) valid data from its previous evaluate phase. Again, this occurs because the p-channel precharge transistor, 238$_{3PT}$, of that stage is disabled since it is connected to the complement of the PHASE 2 CLOCK signal and the n-channel discharge transistor, 238$_{3DT}$, of that stage is disabled since it is connected to the PHASE 1A CLOCK signal. One skilled in the art will therefore appreciate that no stage within system 236 may discharge during this idle period and, therefore, the risk of current leakage along each discharge path is reduced if not eliminated assuming the principles of Sections 1 and/or 2 are used within the discharge paths of those stages.

At t5, FIG. 22b demonstrates the start-up of system 236 to return it to its normal complementary operation when an extended precharge period is no longer desired. To accomplish the start-up operation, note the stage(s) within phase 1 circuit 238 which follow the data storing stage evaluate so that the data stored by the data storing stage is effectively passed onward along the data path to continue proper operation. In the present example, therefore, stage 238$_4$ evaluates according to the stored data from data storing stage 238$_3$. Note that this step is accomplished because, at t5, the PHASE 1B CLOCK signal rises to evaluate and, therefore, causes the discharge transistor 238$_{4DT}$ of stage 238$_4$ to conduct. Consequently, the fifth row of FIG. 22b depicts valid data from phase 1 circuit 238 shortly after t5. Note further that between t4 and t5 the data stored by data storing stage 238$_3$ is not overwritten because the precharge transistor 238$_{3PT}$ of that stage remained disabled in response to the complement of the PHASE 2 CLOCK. Thus, the sixth row of FIG. 22b demonstrates that the data previously stored by data storing stage 238$_3$ during the extended precharge period remains valid at least through t6.

From t6 forward, the three clock signals of FIG. 22b resume operation in the same manner as from to through t2. Thus, without restating the various detail(s), the reader is referred to the above discussion where it is demonstrated that the phase 1 and 2 circuits 238 and 240 thereafter operate in complementary fashion such that one phase circuit evaluates while the other precharges, and continue to do so as the clocks operate with PHASE 1A and 1B in one state while PHASE 2 is in an opposite state.

Lastly, like FIG. 21a, each inverter in FIG. 22a is connected to a p-channel feedback transistor, and some of those inverters are further connected to an n-channel feedback transistor as well. Again, the inverters connected to both p-channel and n-channel feedback transistors are those which either receive an input signal(s) from a hold time latch, or which are a data storing stage. The operation and benefits of these feedback transistors is appreciated from the above discussion of FIG. 21a and, thus, are not repeated here.

Although FIGS. 22a and 22b demonstrate a preferred embodiment for the particular examples set forth above, it is noteworthy to consider other alternatives given the three clock signal system where it is desirable to have a data storing stage which is not the last stage in a phase circuit. Some of these alternatives are ascertainable given the many modifications which are discussed above as applicable to FIG. 21a, while additional alternatives are set forth below.

Figure 22C:
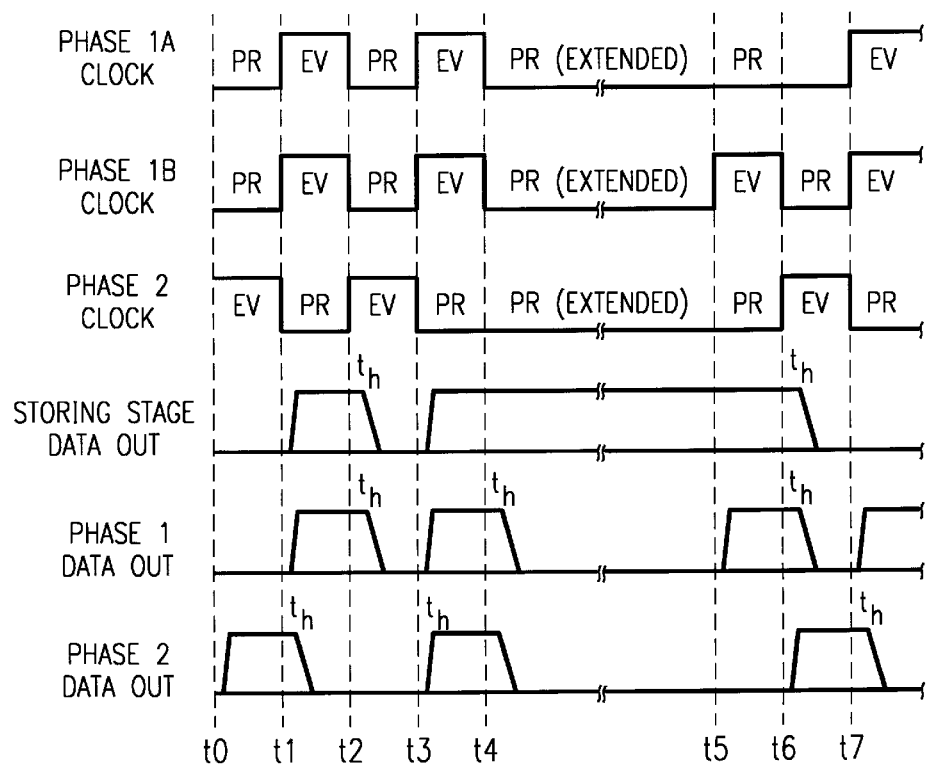

FIG. 22c illustrates a timing diagram of one example of a modification to system 236. Recall in FIG. 22b that the PHASE 1B CLOCK signal is shown to remain low at t3. In FIG. 22c, however, the PHASE 1B CLOCK transitions high at t3, thereby tracking the level of the PHASE 1A CLOCK signal at that time. Given this alternative, each stage in phase 1 circuit 238 following the data storing stage (i.e., only stage 238$_4$ follows the data storing stage in the example of FIG. 22a) also evaluates and outputs valid data at a time period shortly after t3. Thus, the fifth row of FIG. 22c depicts valid data output by phase 1 circuit 238 shortly after t3. However, at t4, when the PHASE 1B CLOCK signal transitions low, it causes that data to become invalid because each stage following the storing stage in response precharges, thereby overwriting that valid data. Thus, the fifth row of FIG. 22c illustrates that the data from shortly after t3 is overwritten by the precharge where it is shown that the output goes low after the hold time, $t_h$, expires. Moreover, given this alternative embodiment, it is still necessary that the stage(s) following the storing stage are first caused to evaluate on start-up. Thus, even though the PHASE 1B CLOCK rose at t3, it again rises at t5 to ensure that the valid data from the storing stage passes on to the next successive stage(s) in phase 1 circuit 238.

Figure 22D:
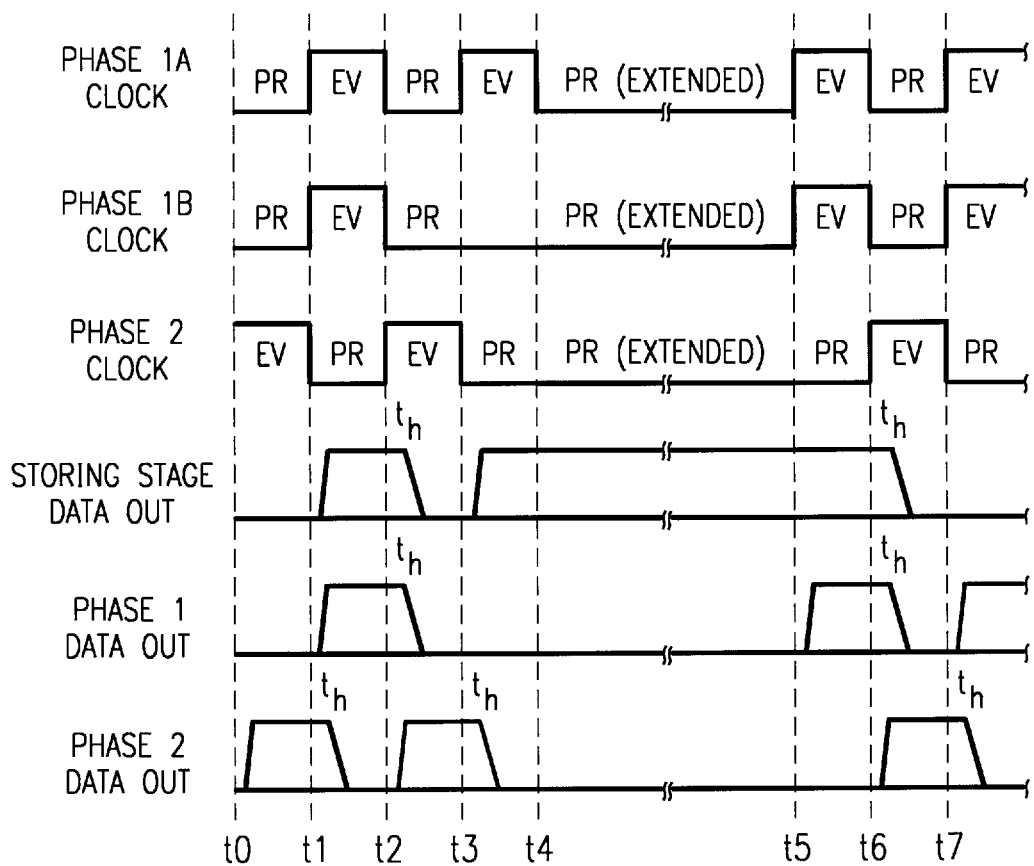

FIG. 22d illustrates a timing diagram of another example of modification to system 236. Note from the first row of FIG. 22b that immediately following t5 the PHASE 1A CLOCK remains low and, therefore, the data storing stage does not reevaluate. In FIG. 22d, however, the first row depicts that immediately following t5 the PHASE 1A CLOCK transitions high and, thus, at that point and forward matches the PHASE 1B CLOCK. This alternative embodiment is permissible when it is known that all inputs to logic circuit 283$_{3L}$ are known to be non-enabling during precharge (e.g., those inputs are supplied by other gated signals or circuits) as described below. From t5 through t6, the PHASE 1 A CLOCK is high while the complement of the PHASE 2 CLOCK is high. As a result, data storing stage 238$_8$ re-evaluates (as does the stages preceding it, namely, stages 238$_1$ and 238$_2$) from t5 to t6 (having already evaluated from t3 to t4). However, because the inputs to logic circuit $238_{3L}$ are non-enabling in this example, the data which existed before t5 cannot be discharged. Note in the current example this these inputs are non-enabling in this manner because the inputs to circuit 231 come from stage $240_4$ which is in the precharge phase and, therefore, outputs a non-enabling signal. However, note that non-enabling signals also could come from other sources, such as static signals so long as those signals remain unchanged from t3 (plus $t_h$) to t5 (plus $t_h$). Moreover, these signals could switch from enabling to non-enabling, but not from non-enabling to enabling. In all events, note therefore that the fourth row of FIG. 22d is the same as that in the FIG. 22b, such that data stored by the data storing stage is maintained between t5 and t6. Moreover, after t6 the data remains valid for the hold time, $t_h$, and therefore that data passes on to the stage(s) following the data storing stage. Moreover, given the modification demonstrated by FIG. 22d, and by combining its first two rows with the corresponding rows shown in the modification of FIG. 22c, still another permissible embodiment, and again given the assumptions in those modifications, is to make the PHASE 1A and PHASE 1B CLOCK signals the same signal, thereby requiring only two clock signals rather than three. In this combined modification, therefore, the circuit would approximate that of FIG. 21a, but the complemented clock signal (e.g., PHASE 2 CLOCK) would be connected to the gate of the precharge transistor of a data storing stage which is not the final stage of a given phase circuit.

FIG. 23 illustrates a system 250 which provides yet another configuration which operates generally in multiple phases and which also may place differing phases of logic gate circuits into an extended precharge phase of operation. System 250 includes circuitry for operating in two phases; thus, a vertical dashed line is shown at approximately the middle of the Figure so that generally circuitry on one side of the dashed line pertains to one phase while circuitry on the opposite side of the dashed line pertains to another phase. System 250 includes on the left side of the dashed line a set of phase 1 dynamic logic domino gates 252 which output data to a latch 254. Latch 254 is a typical transparent latch structure which, while not illustrated, includes a first inverter having an output connected through a passgate to the input of a second inverter. With respect to the right side of the vertical dashed line in FIG. 23, system 250 similarly includes a set of phase 2 dynamic logic domino gates 256 which output data to a latch 258 constructed in the same manner as latch 254. Lastly, the output of latch 258 is connected by way of example to the input of gates 252.

The clocking of system 250 differs from the manners set forth above. Specifically, system 250 includes two separate clock signals, indicated as CLOCK 1 and CLOCK 2, where these signals control circuits in the respective halves of FIG. 23. Thus, CLOCK 1 clocks domino gates 252 and latch 254, while CLOCK 2 clocks domino gates 256 and latch 258. Given the separate control permitted by separate clock signals CLOCK 1 and CLOCK 2, one skilled in the art will appreciate that during normal operation these clock signals may be complementary (or overlap), such that when gates 252 are in the precharge phase of operation then gates 256 are concurrently in the evaluate phase of operation, and vice versa. In addition, however, if either or both of gates 252 and 256 include LVT transistors, or for other reasons as may be apparent to a person skilled in the art, then it may be desired to place both gates 252 and 256 in an extended precharge phase of operation. In this event, CLOCK 1 and CLOCK 2 may provide independent control to gates 252 and 256, respectively, such that the precharge transistors of those circuits are enabled during this extended period. Moreover, also during this extended period, latches 254 and 258 store the data provided by the evaluate phase immediately preceding the extended precharge phase of operation.

Given the above, note that system 250 provides yet another alternative which may benefit using logic gates including HVT and LVT transistors as in the manners described above, which achieve the benefits of low current leakage during the precharge phase of operation, faster discharge during the evaluate phase of operation, and an extended precharge period when desired. Note also that the circuits within FIG. 23 illustrate only two circuits along a given path. In other embodiments it is quite possible for a path to include more than two circuits, and for each circuit to be part of an overall network of circuits having multiple inputs and multiple outputs.

Figure 24:
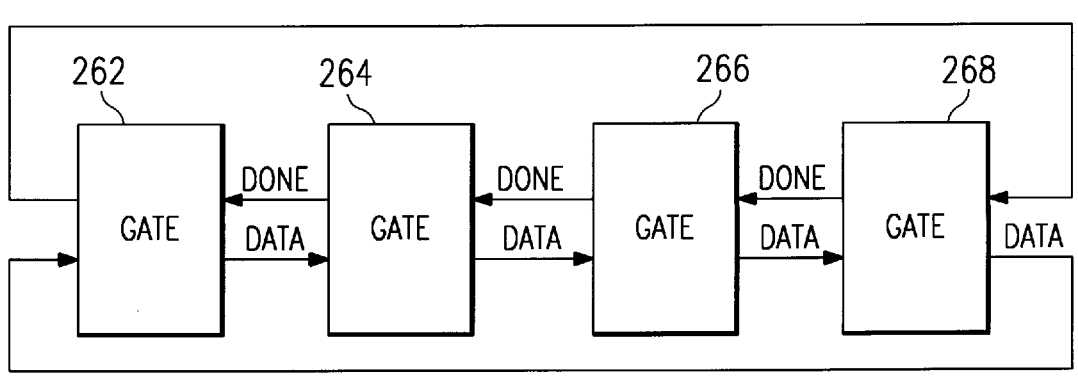
FIG. 24 illustrates a circuit for shortening the duration of the evaluate period with respect to the duration of the precharge period.

FIG. 24 illustrates a system designated at 260 which by itself generally depicts a prior art circuit, but which may be used in a new manner when combined with various of the above-described circuits. System 260 is shown by way of example as having four dynamic logic gates, evenly numbered 262 through 268. Each of gates 262 through 268 may operate in the same general manner as described above, where during a precharge phase of operation the output(s) of the gate is non-enabling and where that output may or may not change due to a discharge during the evaluate phase of operation. In this regard, note that each gate provides data to a next or successor gate. For example, gate 262 provides data to its successor gate 264, gate 264 provides data to its successor gate 266, and so forth. The output DATA is of the same type described above, such as a logic zero or one. Additionally, in the preferred embodiment, this data is provided in dual-rail fashion. Therefore, during the precharge phase of operation, both outputs of the dual rail DATA signal are non-enabling, while during evaluate one of the two outputs transitions from non-enabling to enabling.

In a fashion opposite to the data flow, note further that each gate in FIG. 24 provides a DONE signal to its predecessor gate. For example, gate 264 provides a DONE signal to its predecessor gate 262, gate 266 provides a DONE signal to its predecessor gate 264, and so forth. The DONE signal indicates that a given gate has completed its evaluation, that is, if it is to be discharged, the discharge has occurred and valid data has been output to its successor stage. Note that the DONE signal may be derived by various techniques. For example, for a given dynamic logic gate with dual rail outputs, one of the two outputs transitions to enabling as the gate evaluates. Thus, a logical OR function of these two outputs also may be used (possibly with some intended delay) to indicate as the DONE signal that the gate has generated its valid output data and made that available to its successor stage.

The operation of system 260 is as follows. In general, each gate 262 through 268 operates in either a precharge and evaluate state of operation, with no actual discharge clock. In other words, each gate may perform its evaluate state when it is receiving valid data and, after evaluating, may then return to its precharge state. Moreover, given the additional existence of the DONE signal, the duration of the evaluate state of operation may be considerably reduced in comparison to a circuit with a fifty percent precharge/evaluate duty cycle. Specifically, as any of gates 262 through 268 evaluate, they concurrently provide the DONE signal to a predecessor stage. In response, the predecessor stage switches from its evaluate state to its precharge state of operation. For example, assume at some period after start-up that gate 262 has just switched from its precharge state to its evaluate state. Thus, gate 262 outputs DATA to gate 264, which allows it to evaluate. Gate 264, upon providing valid DATA to its successor gate 266, also asserts its DONE signal to its predecessor gate 262. In response to the asserted DONE signal, gate 262 switches from its evaluate state to its precharge state of operation. This process continues as DATA flows between successive gates around system 260. Thus, one skilled in the art will appreciate that the duration of an evaluate state for a given stage is limited by ending that state in response to the evaluation by a successor stage.

Given the above operation of system 260, note that it also gives rise to a system in which dynamic logic gates are used, and where the circuit as a whole favors a precharge state of operation over an evaluate state of operation. Indeed, other families of domino logic such as post charge logic are known to use this principle. In connection with the present embodiments, where gates use combinations of HVT and LVT transistors as described above, the combination of these principles with the above further reduces any potential leakage which may otherwise occur during a lengthy evaluate state of operation by reducing the duration of the evaluate state of operation. Thus, this additional system may be combined with various of the above-described principles to further improve performance over the prior art.

4. Conclusion

From the above, it may be appreciated that the above embodiments provide numerous advantages over the prior art. For example, current leakage is reduced while logic transition speed is increased. Further, there is not as significant a concern with the drawback of the prior art where reducing current leakage necessarily penalized speed. Indeed, current testing has realized speed increases on the order of thirty percent over the prior art and with lower power supply voltages, much larger increases are possible. Still further, there are shown embodiments for reducing current leakage by placing multiphase circuits into an extended precharge phase so as to avoid leakage which may otherwise occur during evaluate phase. Moreover, the present embodiments span a wide range of examples, as shown by the various Figures as well as the additional statements setting forth other examples as well. Indeed, a person skilled in the art may readily apply the above to still further embodiments not specifically shown above. Consequently, while the present embodiments have been described in detail, various substitutions, modifications or alterations could be made to the descriptions set forth above without departing from the inventive scope which is defined by the claims set forth below.

What is claimed is:

1. A logic circuit, comprising:
   a source of a precharge voltage;
   a clock signal generator producing a clock signal having a precharge phase and an evaluate phase;
   a precharge node
   a precharge device coupled to the source of the precharge voltage, the clock generator and the precharge node operable to precharge the precharge node to the precharge voltage during the precharge phase of the clock signal; and
   a conditional series discharge path connected to said precharge node, receiving first and second input signals and operable to conditionally couple said precharge node to a voltage different than the precharge voltage dependent upon a logic state of the respective first and second input signals, wherein said conditional series discharge path comprises:
   a low threshold voltage transistor having a first threshold voltage, a gate receiving the first input signal and conditionally providing a conductive path along said conditional series discharge path dependent upon the logic state of the first input signal; and
   a high threshold voltage transistor having a second threshold voltage higher in magnitude than the first threshold voltage, a gate receiving the second input signal and conditionally providing a conductive discharge path along said conditional series discharge path dependent upon the logic state of the second input signal, wherein the logic state of the second input signal is disabling during the precharge phase such that said conductive path of said high threshold voltage transistor is not conducting during the precharge phase.

2. The logic circuit of claim 1 wherein said low threshold voltage transistor comprises a first low threshold voltage transistor, and wherein said conditional series discharge path further comprises a second low threshold voltage transistor having the first threshold voltage, a gate receiving a third input signal and conditionally providing a conduction path along said series discharge path dependent upon a logic state of the third input signal.

3. The logic circuit of claim 2 wherein said conditional paths of said first and second low threshold voltage transistors are connected to form a series connection, and further comprising a third low threshold voltage transistor having a gate receiving a fourth input signal and conditionally providing a conductive path connected in parallel to said series connection dependent upon a logic state of the fourth input signal, and wherein said third low threshold voltage transistor has the first threshold voltage.

4. The logic circuit of claim 3 wherein each of said first, second, and third low threshold voltage transistors comprises an n-channel transistor.

5. The logic circuit of claim 1 and wherein:
   the precharge device comprises of a p-channel transistor having a source connected to the source of the precharge voltage, a drain connected to said precharge node, and a gate connected to receive the clock signal such that a conduction path of said p-channel transistor is conducting during the precharge phase; and
   said high threshold voltage transistor comprises an n-channel transistor having a source connected to a source of the voltage lower than the precharge voltage and a gate coupled to receive the second input signal such that said conductive path of said n-channel transistor is not conducting during the precharge phase.

6. The logic circuit of claim 5:
   wherein the gate of said p-channel transistor is coupled to receive a disabling signal during the evaluate phase such that said conduction path of said p-channel transistor is not conducting during the evaluate phase; and
   wherein the gate of said n-channel transistor is coupled to receive an enabling signal during the evaluate phase such that said conductive path of said n-channel transistor is conducting during the evaluate phase.

7. The logic circuit of claim 5 wherein the second input signal is the clock signal such that when the clock signal is low, the clock signal is enabling to said p-channel transistor and disabling to said n-channel transistor.

8. The logic circuit of claim 1:
   wherein the second input signal connected to the gate of the high threshold voltage transistor is provided by a gated clock signal having a logic state during the precharge phase such that said high threshold voltage transistor is disabled during the precharge phase such that said conductive path of said high threshold voltage transistor is not conducting during the precharge phase and having an optional logic state during said evaluate phase such that said high threshold voltage transistor is optionally enabled during the evaluate phase such that said conductive path of said high threshold voltage transistor is conditionally conducting during the evaluate phase depending upon the logic state of the second input signal; and wherein the first input signal connected to the gate of said low threshold voltage transistor is output by a static circuit.

9. The logic circuit of claim 1 wherein the second input signal connected to the gate of said high threshold voltage transistor is provided by an output of a dynamic logic circuit such that said high threshold voltage transistor is disabled during the precharge phase such that said conductive path of said high threshold voltage transistor is not conducting during the precharge phase, said output of the dynamic logic circuit having an optional logic state during said evaluate phase such that said high threshold voltage transistor is optionally enabled during the evaluate phase such that said conductive path of said high threshold voltage transistor is conditionally conducting during the evaluate phase depending upon the logic state of the second input signal.

10. The logic circuit of claim 9:

wherein said high threshold voltage transistor comprises a first high threshold voltage transistor;

wherein said conductive paths of said low threshold voltage transistor and said first high threshold voltage transistor are connected to form a series connection; and wherein said dynamic logic circuit further comprises a second high threshold voltage transistor providing a conductive path along said conditional series discharge path connected in parallel to said series connection, wherein said second high threshold voltage transistor has the second threshold voltage and a third input signal connected to a gate of said second high threshold voltage transistor is provided by an output of the dynamic logic circuit such that said second high threshold voltage transistor is disabled during the precharge phase such that said conductive path of said second high threshold voltage transistor is not conducting during the precharge phase.

11. The logic circuit of claim 1 wherein said conditional series discharge path further comprises an additional transistor connected as an inverter, wherein said additional transistor has a gate connected for receiving an inverter input signal, a source connected to ground and a drain for presenting a signal complementary to said inverter input signal, wherein said additional transistor has the second threshold voltage.

12. The logic circuit of claim 11 and wherein said precharge node comprises a first precharge node and wherein the precharge voltage comprises a first precharge voltage, and further comprising:

a source of a second precharge voltage;

a second precharge node a second precharge device coupled to the source of the second precharge voltage, the clock generator and the second precharge node operable to precharge the second precharge node to the second precharge voltage during the precharge phase of the clock signal;

a second conditional discharge path connected to said second precharge node and operable to conditionally couple said second precharge node to a voltage different than the second precharge voltage during the evaluate phase; and wherein an input of said inverter is connected to said second precharge node.

13. The logic circuit of claim 1 wherein said conditional discharge path comprises a first conditional series discharge path, wherein said low threshold voltage transistor comprises a first low threshold voltage transistor, and wherein said high threshold voltage transistor comprises a first high threshold voltage transistor, and further comprising:

a second conditional series discharge path connected to said precharge node, receiving third and fourth input signals and operable to conditionally couple said precharge node to a voltage different than the precharge voltage dependent upon a logic state of the respective third and fourth input signals, wherein said second conditional series discharge path comprises:

a second low threshold voltage transistor having the first threshold voltage, a gate receiving the third input signal and conditionally providing a conductive path along said second conditional series discharge path dependent upon the logic state of the third input signal; and a second high threshold voltage transistor having the second threshold voltage, a gate receiving the fourth input signal and conditionally providing a conductive discharge path along said second conditional series discharge path dependent upon the logic state of the fourth input signal, wherein the logic state of the fourth input signal is disabling during the precharge phase such that said conductive path of said second high threshold voltage transistor is not conducting during the precharge phase.

14. The logic circuit of claim 1 wherein said high threshold voltage transistor comprises a transistor connected as an inverter, wherein said high threshold voltage transistor has a gate connected for receiving an inverter input signal, a source connected to ground and a drain for presenting a signal complementary to said invert input signal, wherein the inverter input signal is provided by an output of a dynamic logic circuit such that said high threshold voltage transistor is disabled during the precharge phase such that said conductive path of said high threshold voltage transistor is not conducting during the precharge phase.

15. The logic circuit of claim 1 wherein said high threshold voltage transistor comprises a transistor connected as an inverter, wherein said high threshold voltage transistor has a gate connected for receiving an inverter input signal, a source connected to ground and a drain for presenting a signal complementary to said invert input signal, wherein the inverter input signal is provided by an output of a static logic circuit which is gated such that said high threshold voltage transistor is disabled during the precharge phase such that said conductive path of said high threshold voltage transistor is not conducting during the precharge phase.

16. The logic circuit of claim 1 wherein said conditional discharge path comprises a first conditional series discharge path, wherein said low threshold voltage transistor comprises a first low threshold voltage transistor, and wherein said high threshold voltage transistor comprises a first high threshold voltage transistor, and further comprising:

a second conditional series discharge path connected to said precharge node, receiving third and fourth input signals and operable to conditionally couple said precharge node to a voltage different than the precharge voltage dependent upon a logic state of the respective third and fourth input signals, wherein said second conditional series discharge path comprises:

- a second low threshold voltage transistor having the first threshold voltage, a gate receiving the third input signal and conditionally providing a conductive path along said second conditional series discharge path dependent upon the logic state of the third input signal; and
- a second high threshold voltage transistor having the second threshold voltage, a gate receiving the fourth input signal and conditionally providing a conductive path along said second conditional series discharge path dependent upon the logic state of the fourth input signal, wherein the logic state of the fourth input signal is disabling during the precharge phase such that said conductive path of said second high threshold voltage transistor is not conducting during the precharge phase.

17. The logic circuit of claim 16:

wherein each of said second and fourth input signals is provided by outputs of respective dynamic logic circuits such that said first and second high threshold voltage transistors are disabled during the precharge phase such that the conductive paths of said first and second high threshold voltage transistors are not conducting during the precharge phase;

wherein a first node exists between said first low threshold voltage transistor and said first high threshold voltage transistor;

wherein a second node exists between said second low threshold voltage transistor and said second high threshold voltage transistor; and wherein said first node is connected to said second node.

18. The logic circuit of claim 1 wherein said precharge node comprises a first precharge node, wherein the precharge voltage comprises a first precharge voltage, and wherein each of said low threshold and high threshold voltage transistors comprises a first conductivity type, and further comprising:

- a source of a second precharge voltage;
- a second precharge node;
- a second precharge device coupled to the clock generator and the second precharge node operable to precharge the second precharge node to the second precharge voltage during the precharge phase of the clock signal; and
- a second conditional series discharge path connected to said second precharge node, receiving third and fourth input signals and operable to conditionally couple said second precharge node to a voltage different than the second precharge voltage dependent upon a logic state of the respective third and fourth input signals, wherein said second conditional series discharge path comprises:
  - a second low threshold voltage transistor of a second conductivity type, having the first threshold voltage corresponding to the second conductivity type, a gate receiving the third input signal and conditionally providing a conductive path along said second conditional series discharge path dependent upon the logic state of the third input signal; and
  - a second high threshold voltage transistor of the second conductivity type having the second threshold voltage corresponding to the second conductivity type higher in magnitude than the first threshold voltage corresponding to the second conductivity type, a gate receiving the fourth input signal and conditionally providing a conductive discharge path along said second conditional series discharge path dependent upon the logic state of the fourth input signal, wherein the logic state of the fourth input signal is disabling during the precharge phase such that said conductive path of said second high threshold voltage transistor of the second conductivity type is not conducting during the precharge phase;

wherein the voltage at the first precharge node provides a data input to one of said second low threshold voltage transistor of the second conductivity type and said second high threshold voltage transistor of the second conductivity type.

19. The logic circuit of claim 1 and wherein the precharge device comprises of a p-channel transistor having a source connected to the source of the precharge voltage, a drain connected to said precharge node, and a gate connected to receive the clock signal such that a conduction path of said p-channel transistor is conducting during the precharge phase.

20. The logic circuit of claim 1 and further comprising an inverter having an input coupled to said precharge node.

21. The logic circuit of claim 20 and further comprising a p-channel transistor having a source connected to the source of the precharge voltage, a drain connected to said precharge node, and a gate connected to an output of said inverter.

22. The logic circuit of claim 1 wherein each of said low threshold voltage transistor and said high threshold voltage transistor comprises an n-channel transistor.

23. The logic circuit of claim 1:

wherein said conditional series discharge path comprises a first conditional series discharge path;

wherein said low threshold voltage transistor comprises a first low threshold voltage transistor;

the logic circuit further comprising a second conditional series discharge path connected to said precharge node, receiving third and fourth input signals and operable to conditionally couple said precharge node to a voltage different than the precharge voltage dependent upon a logic state of the respective third and fourth input signal;

wherein said second conditional series discharge path comprises:

- a second low threshold voltage transistor having the first threshold voltage, a gate receiving the third input signal and conditionally providing a conductive path along said second conditional series discharge path dependent upon the logic state of the third input signal, wherein said third input signal is disabling during the precharge phase such that said conductive path of said second low threshold voltage transistor is not conducting during the precharge phase; and
- a third low threshold voltage transistor having the first threshold voltage, a gate receiving the fourth input signal and conditionally providing a conductive path along said second conditional series discharge path dependent upon the logic state of the fourth input signal, wherein the logic state of the fourth input signal is disabling during the precharge phase such that said conductive path of said third low threshold voltage transistor is not conducting during the precharge phase.

24. The logic circuit of claim 1 wherein said precharge node comprises a first precharge node, and further comprising a second precharge node coupled to be precharged to the precharge voltage during the precharge phase and operable to be discharged during the evaluate phase, wherein only one of said first and second precharge nodes is discharged during the evaluate phase.

25. The logic circuit of claim 24 and further comprising a conditional series discharge path coupled to said second precharge node, wherein said conditional series discharge path coupled to said second precharge node further comprises said high threshold voltage transistor.

26. The logic circuit of claim 24 and further comprising:
   a second conditional series discharge path connected to said second precharge node, receiving third and fourth input signals and operable to conditionally couple said second precharge node to a voltage different than the precharge voltage dependent upon a logic state of the respective third and fourth input signals, wherein said second conditional series discharge path comprises:
      a second low threshold voltage transistor having the first threshold voltage, a gate receiving the third input signal and conditionally providing a conductive path along said second conditional series discharge path connected to said second precharge node dependent upon the logic state of the third input signal; and
      a second high threshold voltage transistor having the second threshold voltage higher in magnitude than the first threshold voltage, a gate receiving the fourth input signal and conditionally providing a conductive discharge path along said second conditional series discharge path dependent upon the logic state of the fourth input signal, wherein the logic state of the fourth input signal is disabling during the precharge phase such that said conductive path of said second high threshold voltage transistor is not conducting during the precharge phase.

27. The logic circuit of claim 1:
   wherein said precharge node and said conditional series discharge path and said precharge device are included in a first phase dynamic logic circuit comprising one or more stages;
   wherein each of said one or more dynamic logic circuit stages of said first phase dynamic logic circuit comprises said precharge node and said conditional discharge path;
   wherein each precharge node of each of said one or more dynamic logic stages is further coupled to a precharge device which when conducting couples said each precharge node of said each stage to the precharge voltage during said precharge phase;
   and further comprising a second phase dynamic logic circuit comprising one or more dynamic logic stages, wherein each of said one or more dynamic logic stages of said second phase dynamic logic circuit comprises:
      a precharge node;
      a conditional series discharge path connected to said precharge node of said second phase dynamic logic circuit and operable to conditionally couple said precharge node of said second phase dynamic logic circuit to a voltage different than the precharge voltage; and
      a precharge device coupled to the source of the precharge voltage and said precharge node of said second phase dynamic logic circuit which when conducting couples said precharge node of said second phase dynamic logic circuit to the precharge voltage during said precharge phase;
   wherein each of said dynamic logic stages of said first and second phase dynamic logic circuits further comprises an output for presenting a logic value responsive to the voltage at said precharge node of each of said first and second phase dynamic logic circuits;
   and further comprising control circuitry for controlling at least one of said dynamic logic stages of said first and second phase dynamic logic circuits as a storing stage such that said conditional series discharge path and said precharge device of each of said first and second phase dynamic logic circuits are not concurrently conducting during a predetermined time and such that the logic value is maintained at said output, wherein the predetermined time is equal to or greater than a time period equal to said evaluate phase plus said precharge phase.

28. The logic circuit of claim 1 wherein said low threshold voltage transistor is formed using a first implantation step and wherein said high threshold voltage transistor is formed using a second implantation step at a time different than said first implantation step.

29. The logic circuit of claim 1 wherein each of said low threshold voltage transistor and said high threshold voltage transistor comprises a silicon-on-insulator transistor.

30. The logic circuit of claim 29 wherein said low threshold voltage transistor comprises a body connection, and wherein said body connection floats.

31. The logic circuit of claim 29 wherein said high threshold voltage transistor comprises a body connection and a gate, and wherein said body connection is connected to said gate.

32. The logic circuit of claim 29 wherein said high threshold voltage transistor is an n-channel transistor comprising a body connection and a source, and wherein said body connection is connected to said source.

33. The logic circuit of claim 29 wherein said high threshold voltage transistor is an n-channel transistor comprising a body connection, and wherein said body connection is connected to ground.

34. The logic circuit of claim 29 wherein said high threshold voltage transistor is an n-channel transistor comprising a body connection, and wherein said body connection is connected to said precharge voltage.

* * * * *